United States Patent
Nitta

(10) Patent No.: US 7,751,222 B2
(45) Date of Patent: Jul. 6, 2010

(54) SEMICONDUCTOR MEMORY DEVICE

(75) Inventor: Tadashi Nitta, Kyoto (JP)

(73) Assignee: Panasonic Corporation, Osaka (JP)

( * ) Notice: Subject to any disclaimer, the term of this patent is extended or adjusted under 35 U.S.C. 154(b) by 11 days.

(21) Appl. No.: 12/267,878

(22) Filed: Nov. 10, 2008

(65) Prior Publication Data

US 2009/0080231 A1    Mar. 26, 2009

Related U.S. Application Data

(62) Division of application No. 11/636,968, filed on Dec. 12, 2006, now Pat. No. 7,457,142.

(30) Foreign Application Priority Data

Dec. 16, 2005    (JP) .............................. 2005-363052

(51) Int. Cl.
*G11C 5/06* (2006.01)
*G11C 7/02* (2006.01)
*G11C 11/34* (2006.01)

(52) U.S. Cl. .......................... 365/72; 365/63; 365/214; 365/185.05

(58) Field of Classification Search .................. 365/63, 365/72, 214

See application file for complete search history.

(56) References Cited

U.S. PATENT DOCUMENTS

| | | | |
|---|---|---|---|
| 6,331,961 B1 * | 12/2001 | Kengeri et al. | 365/222 |
| 6,388,934 B1 * | 5/2002 | Tobita | 365/222 |
| 6,711,048 B2 * | 3/2004 | Chien | 365/145 |
| 6,847,540 B2 | 1/2005 | Kato et al. | |
| 6,862,205 B2 | 3/2005 | Agata et al. | |
| 6,885,608 B2 | 4/2005 | Nagano | |
| 7,110,318 B2 | 9/2006 | Nii | |
| 2003/0072193 A1 | 4/2003 | Kamei et al. | |
| 2004/0037143 A1 | 2/2004 | Lovett | |
| 2005/0237848 A1 | 10/2005 | Takahashi et al. | |
| 2005/0254279 A1 | 11/2005 | Schwerin | |

FOREIGN PATENT DOCUMENTS

JP    2003529880 T    10/2003

\* cited by examiner

*Primary Examiner*—Ly D Pham
(74) *Attorney, Agent, or Firm*—McDermott Will & Emery LLP

(57) ABSTRACT

A basic cell comprises a memory cell capable of retaining data having at least a binary value, a first selecting transistor connected between a first terminal of the memory cell and the Mth bit line, and a second selecting transistor connected between the first terminal of the memory cell and the M+1th bit line. A gate of the first selecting transistor is connected to the 2·N−1th selecting line, and a gate of the second selecting transistor is connected to the 2·Nth selecting line.

5 Claims, 28 Drawing Sheets

F I G. 3
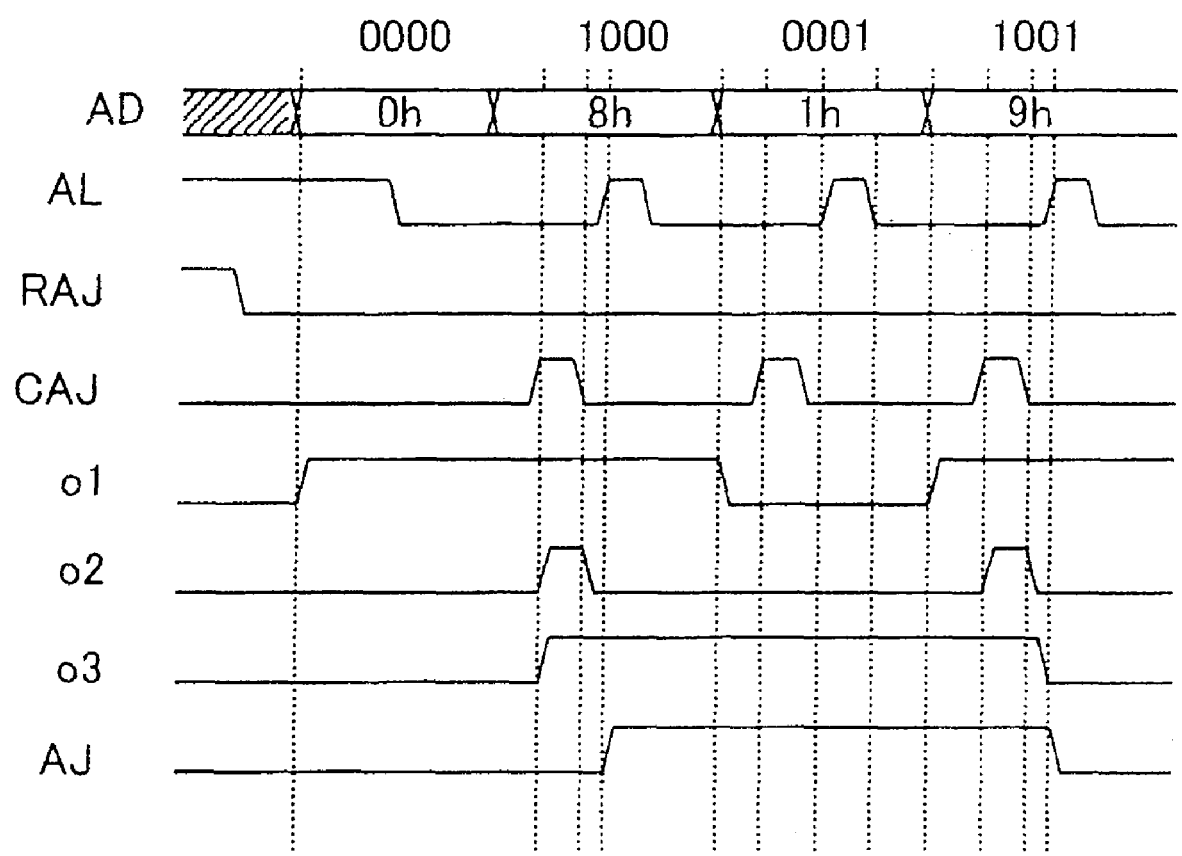

F I G. 5
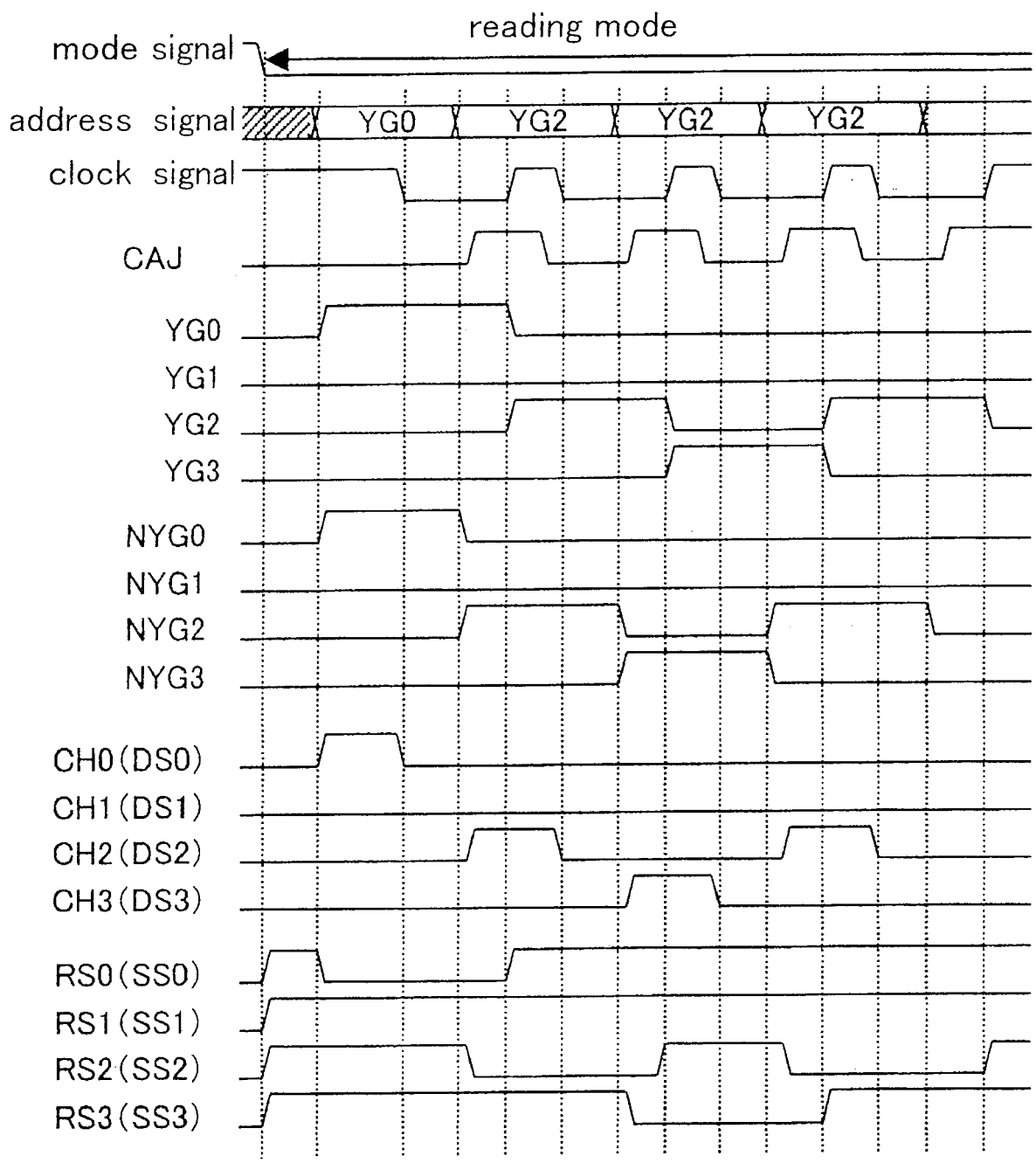

F I G. 1 3
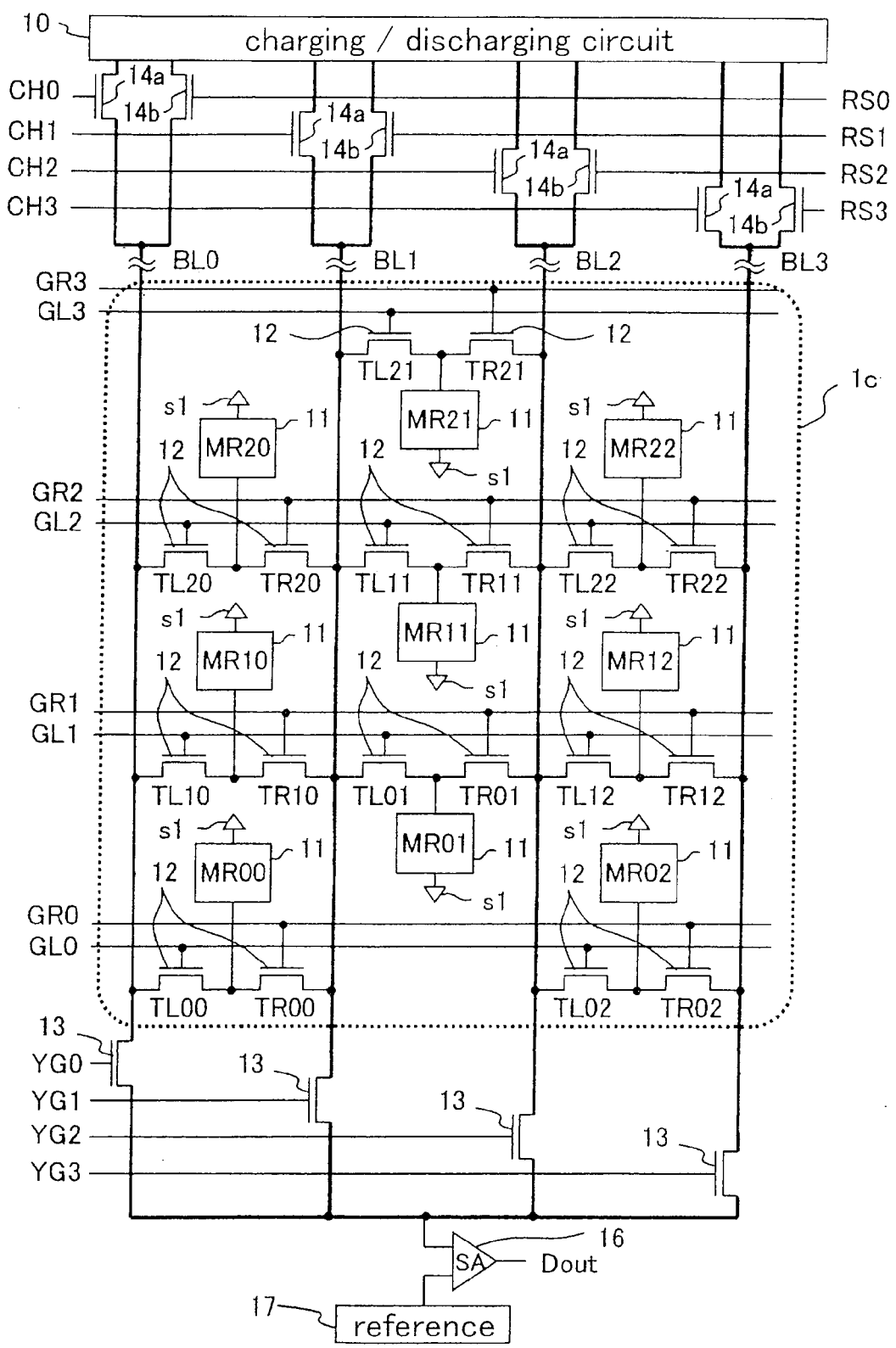

F I G. 1 7
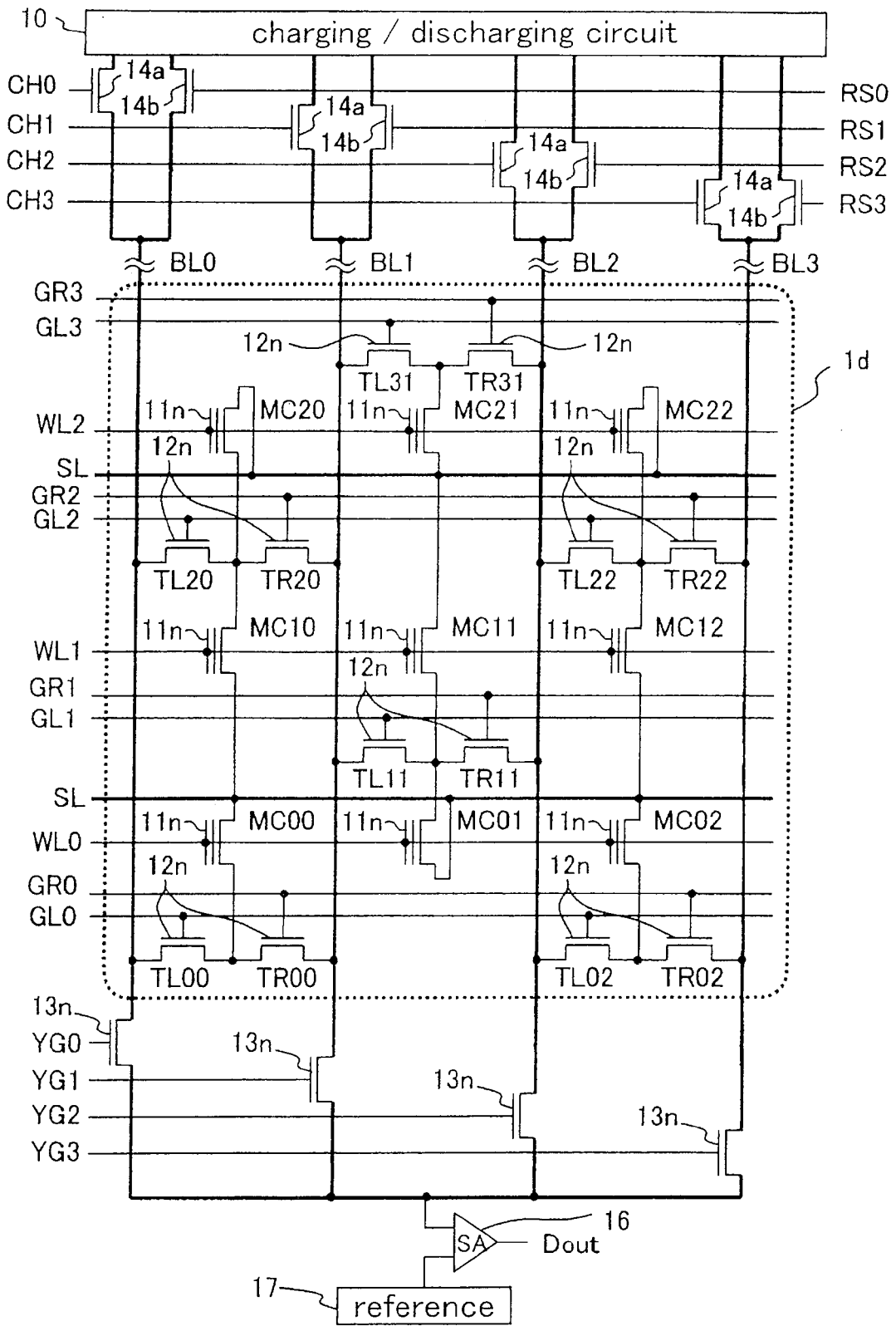

US 7,751,222 B2

SEMICONDUCTOR MEMORY DEVICE

RELATED APPLICATIONS

This application is a Divisional of U.S. application Ser. No. 11/636,968, filed Dec. 12, 2006, now U.S. Pat. No. 7,457,142, claiming priority of Japanese Application No. 2005-363052, filed Dec. 16, 2005, the entire contents of each of which are hereby incorporated by reference.

BACKGROUND OF THE INVENTION

1. Field of the Invention

The present invention relates to a semiconductor memory device more specifically to a semiconductor memory device for reading memorized data by setting a voltage of a bit line to a predetermined voltage.

2. Description of the Related Art

In a memory cell array constituted in a conventional manner, it is necessary to pre-charge a voltage of a bit line selected in accordance with an inputted address to a predetermined voltage when data in the memory cell is read. In addition, it is necessary to reset the voltage of the bit line to an initial voltage after the data in the memory cell is judged with a sense amplifier. In order to do treatment described above, it is further necessary to wait for a predetermined length of time (in other words, pre-charge the voltage of the bit line) until the data in the memory cell is decided with the sense amplifier after the address is inputted, and also to wait for a predetermined length of time until the data in the next memory cell is read after the data in the current memory cell is decided with the sense amplifier (in other words, reset the voltage of the bit line after reading the data to the initial voltage). Further, it is necessary to wait for a predetermined length of time (in other words, pre-charge the voltage of the bit line) even if it is not after the address is inputted but, for example, it is a reading sequence like pre-charging the voltage of the bit line due to a falling edge of a clock signal. Because of the reason described above, it is not possible to randomly read the data at a high speed.

The problem is generated regardless of the constitution and format of the memory cell. A similar problem is also generated in memory cells in which it is necessary to set the voltage of the bit line before and after the reading operation (including NAND type, AND type, Pch type, Depression type, resistance-variable nonvolatile memory (RRAM) and capacitor) other than an NOR memory cell and a VGA memory cell.

The constitution recited in No. 2003-529880 of the Japanese Patent Applications Laid-Open was proposed in order to solve the problem. According to the cited document, the memory array comprises at least two banks provided with a sense amplifier independently operating, wherein data is alternately read from the respective banks. Accordingly, the bit-line voltage of the memory cell in one of the banks can be reset and pre-charged while the data is being read from the memory cell in the other bank. As a result, it becomes unnecessary to wait until the voltage of the bit line is set before the data can be read from the next memory cell, which enables to read at high speed.

The foregoing constitution is effective when the data is serially read, however, after the data in the memory cell in one of the banks is read, it is necessary to read the data from the memory cell in the other bank. Due to the disadvantage, it is still not possible to start to read the data in the next memory cell until the pre-charge and reset of the bit-line voltage are completed in the case where the data in the memory cells in the same bank is randomly read in succession, in particular, in the case where the data in the memory cells present on the same bit line in the same bank. As described, even in the conventional constitution which was improved, it still requires the time for setting the bit-line voltage when the data is read from the memory cell, thereby it is difficult to randomly read the data at a high speed.

SUMMARY OF THE INVENTION

Therefore, a main object of the present invention is to provide a semiconductor memory device capable of randomly reading data at a high speed without waiting until a voltage of a bit line is set.

In order to achieve the foregoing object, a semiconductor memory device according to the present invention comprises a memory cell array comprising a single or a plurality of basic cells, and selecting lines, bit lines and word lines provided respectively for designating the basic cells, wherein the basic cell includes:

a memory cell capable of retaining data having at least a binary value provided that N and M are respectively integers of at least one;

a first selecting transistor connected to between a first terminal of the memory cell and the Mth bit line; and a second selecting transistor connected to between the first terminal of the memory cell and the M+1th bit line, wherein a gate of the first selecting transistor is connected to the 2·N−1th selecting line, and a gate of the second selecting transistor is connected to the 2·Nth selecting line.

FIGS. 7 and 8 in preferred embodiments described later can be referenced with respect to the foregoing constitution.

According to the foregoing constitution, first and second memory cells are provided as the memory cell. In the case where the first selecting transistor of the first memory cell is turned on, data of the first memory cell is read from the first bit line connected to the first selecting transistor, and when the second memory cell whose data is subsequently read is connected to the first bit line which is the same as the before-mentioned bit line, the first selecting transistor of the first memory cell can be turned off immediately after the data in the first memory cell is read, the second selecting transistor of the second memory cell can be turned on while a voltage of the first bit line is being set, and data of the second memory cell can be read from the second bit line connected to second selecting transistor.

As a result of the foregoing constitution, when the data in the memory cells connected to the same bit line is continuously read in at least one Pch non-volatile memory, depression non-volatile memory and a memory cell in which it is unnecessary to pre-charge the bit-line voltage to a predetermined voltage before the reading operation, the data in the next memory cell can be read while the bit-line voltage is being reset after the reading operation. As a result, the data can be randomly read at a high speed.

It is preferable that the memory cell array is configured in such a manner that a common line is used as the 2·Nth selecting line and the 2·N+1th selecting line, and controllable by only the selected word line. It shows that the common selecting line can be used in the constitution according to the present invention within such a range that the foregoing operation effect is inhibited. FIGS. 10 and 11 in the preferred embodiments described later can be referenced with respect to the foregoing constitution.

According to the foregoing constitution, for example, in the case where the first selecting transistor of the first memory cell is turned on, the data of the first memory cell is read from the first bit line connected to the first selecting transistor, and the second memory cell whose data is subsequently read is connected to the first bit line which is the same as the before-mentioned bit line, the data of the second memory cell can be read from the second bit line immediately after the data of the first memory cell is read by means of a fewer number of selecting transistor control lines.

As a result of the foregoing constitution, when the data in the memory cells connected to the same bit line is continuously read in the memory cells in which it is unnecessary to pre-charge the bit-line voltage to a predetermined voltage before the reading operation, the effect of the present invention can be exerted by means of a fewer number of selecting transistor control lines.

A semiconductor memory device according to the present invention comprises a memory cell array comprising a single or a plurality of basic cells, and selecting lines, bit lines and word lines provided respectively for designating the basic cells, wherein the basic cell includes:

first and second memory cells capable of retaining data having at least a binary value, provided that N and M are respectively integers of at least one;

a first selecting transistor connected to between a first terminal of the first memory cell and the Mth bit line;

a second selecting transistor connected to between the first terminal of the first memory cell and the M+1th bit line, a third selecting transistor connected between a first terminal of the second memory cell and the M+1th bit line; and a fourth selecting transistor connected to between the first terminal of the second memory cell and the M+2th bit line, and, wherein a gate of the first selecting transistor is connected to the 2·N−1th selecting line, a gate of the second selecting transistor is connected to the 2·Nth selecting line, a gate of the third selecting transistor is connected to the 2·N+1th selecting line, a gate of the fourth selecting transistor is connected to the 2·N+2th selecting line, and only the selected word line is controllable.

FIGS. 13 and 14 in the preferred embodiments described later can be referenced with respect to the foregoing constitution.

According to the foregoing constitution, for example, in the case where the first selecting transistor of the first memory cell is turned on, the data of the first memory cell is read from the first bit line connected to the first selecting transistor, and the second memory cell whose data is subsequently read shares the same bit line with the first memory cell, the data of the second memory cell can be read from the second bit line connected to the second selecting transistor through the steps described below, during a period when the data of the first memory cell is read:

the bit line connected to the second selecting transistor of the second memory cell is pre-charged to a predetermined voltage.

the first selecting transistor of the first memory cell is turned off immediately after data of the first memory cell is read.

the second selecting transistor of the second memory cell is turned on while the voltage of the first bit line is being reset.

As a result of the foregoing constitution, even in the case where the data of the memory cells connected on the same bit line is continuously read in the memory cells capable of controlling only the selected word line (including at least one Nch non-volatile memory and Pch non-volatile memory capable of controlling only the selected word line), the voltage of the bit line in the next memory cell can be pre-charged while the data of the current memory cell is being read, or the data of the next memory cell can be read while the voltage of the bit line is being reset after the data of the current memory cell is read when the data of the memory cells connected on the same bit line is continuously read. As a result, the data can be randomly read at a high speed.

A semiconductor memory device according to the present invention comprises a memory cell array comprising a single or a plurality of basic cells, and selecting lines, bit lines and word lines provided respectively for designating the basic cells, wherein the basic cell includes:

a first through fourth memory cells capable of retaining data having at least a binary value, provided that N and M are respectively integers of at least one;

a first selecting transistor connected to between a first terminal of the first memory cell and the 2·M−1th bit line;

a second selecting transistor connected between the first terminal of the first memory cell and the 2·Mth bit line, a third selecting transistor connected between a first terminal of the second memory cell and a first terminal of the fourth memory cell, and the 2·Mth bit line;

a fourth selecting transistor connected between the first terminal of the second memory cell and the first terminal of the fourth memory cell, and the 2·M+1th bit line;

a fifth selecting transistor connected between a first terminal of the third memory cell and the 2·M−1th bit line; and a sixth selecting transistor connected to the first terminal of the third memory cell and the 2·Mth bit line, and wherein a gate of the first selecting transistor is connected to the 4·N−3th selecting line, a gate of the second selecting transistor is connected to the 4·N−2th selecting line, a gate of the third selecting transistor is connected to the 4·N−1th selecting line, a gate of the fourth selecting transistor is connected to the 4·Nth selecting line, a gate of the fifth selecting transistor is connected to the 4·N+1th selecting line, and a gate of the sixth selecting transistor is connected to the 4·N+2th selecting line.

FIGS. 16 and 17 in the preferred embodiments described later can be referenced with respect to the foregoing constitution.

As a result of the foregoing constitution, in the case where the data of the memory cells connected to the same bit line is continuously read in the memory cells capable of controlling only the selected word line (including at least one Nch non-volatile memory and Pch non-volatile memory controllable by only the selected word line), the voltage of the bit line in the next memory cell can be pre-charged while the data of the current memory cell is being read by means of less load of control line. In addition, the data of the next memory cell can be read while the voltage of the bit line is being reset after the data of the memory cell is read. As a result, the data can be randomly read at a high speed.

It is preferable that the memory cell array is configured in such a manner that a common line is used as the 4·N−2th selecting line and the 4·N+1th selecting line, a common line is used as the 4·Nth selecting line and the 4·N+3th selecting line, and only the selected word line is controllable.

This shows that the common selecting line can be used in the constitution according to the present invention in such a range that the foregoing effect is not disturbed to be exerted.

FIGS. 19 and 20 in the preferred embodiments described later can be referenced with respect to the foregoing constitution.

According to this, even in the case where the data of the memory cells connected to the same bit line is continuously read in the memory cells capable of controlling only the selected word line, the bit line in the next memory cell can be pre-charged while the data of the current memory cell is being read by means of a fewer number of control lines. In addition, the data of the next memory cell can be read while the voltage of the bit line is being reset after the data of the memory cell is read. As a result, the data can be randomly read at a high speed.

A semiconductor memory device according to the present invention comprises a memory cell array comprising a single or a plurality of basic cells, and selecting lines, bit lines and word lines provided respectively for designating the basic cells, wherein the basic cell includes:

first and second VGA memory cells capable of retaining data having at least a binary value, provided that N and M are respectively integers of at least one;

a first selecting transistor connected between a first terminal of the first VGA memory cell and the 2·M−1th bit line;

a second selecting transistor connected to between the first terminal of the first VGA memory cell and the 2·Mth bit line, a third selecting transistor connected between a second terminal of the first VGA memory cell and the 2·M+1th bit line;

a fourth selecting transistor connected between the second terminal of the first VGA memory cell and the 2·M+2th bit line;

a fifth selecting transistor connected between a first terminal of the second VGA memory cell and the 2·Mth bit line;

a sixth selecting transistor connected the first terminal of the second VGA memory cell and the 2·M+1th bit line, a seventh selecting transistor connected a second terminal of the second VGA memory cell and the 2·M+2 bit line; and an eighth selecting transistor connected to the second terminal of the second VGA memory cell and the 2·M+3th bit line; and, wherein a gate of the first selecting transistor is connected to the 2·N−1th selecting line, a gate of the second selecting transistor is connected to the 2·Nth selecting line, a gate of the third selecting transistor is connected to the 2·N−1th selecting line, a gate of the fourth selecting transistor is connected to the 2·Nth selecting line, a gate of the fifth selecting transistor is connected to the 2·N+1th selecting line, a gate of the sixth selecting transistor is connected to the 2·N+2th selecting line, a gate of the seventh selecting transistor is connected to the 2·N+1th selecting line, and a gate of the eighth selecting transistor is connected to the 2·N+2th selecting line.

FIGS. 22 and 23 in the preferred embodiments described later can be referenced with respect to the foregoing constitution.

According to the foregoing constitution, even in the case where the data of the memory cells connected to the same bit line is continuously read in the memory cells capable of controlling only the selected word line, the voltage of the bit line in the next memory cell can be pre-charged while the data of the current memory cell is being read. In addition, the data of the next memory cell can be read while the voltage of the bit line is being reset after the data of the memory cell is read. As a result, the data can be randomly read at a high speed.

According to the present invention, even in the case where the data in the memory cells connected to the same bit line is read, the data in the next memory cell can be read while the bit-line voltage is being reset after the reading operation. As a result, the data can be randomly read at a high speed.

The semiconductor memory device according to the present invention can randomly read data at a high speed in various semiconductor memory cells irrespective of types and structures thereof. The semiconductor memory device is, therefore, effective in any field in which the data is necessary to read randomly and speedily.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 3 is a time chart of the address determination circuit shown in FIG. 2.

FIG. 5 is a time chart in a reading operation in the circuit shown in FIG. 4.

FIG. 13 shows a schematic circuit configuration of a memory cell array according to a preferred embodiment 3 of the present invention.

FIG. 17 shows a frame format of the circuit configuration according to the preferred embodiment 4.

DETAILED DESCRIPTION OF THE INVENTION

Figure 25:
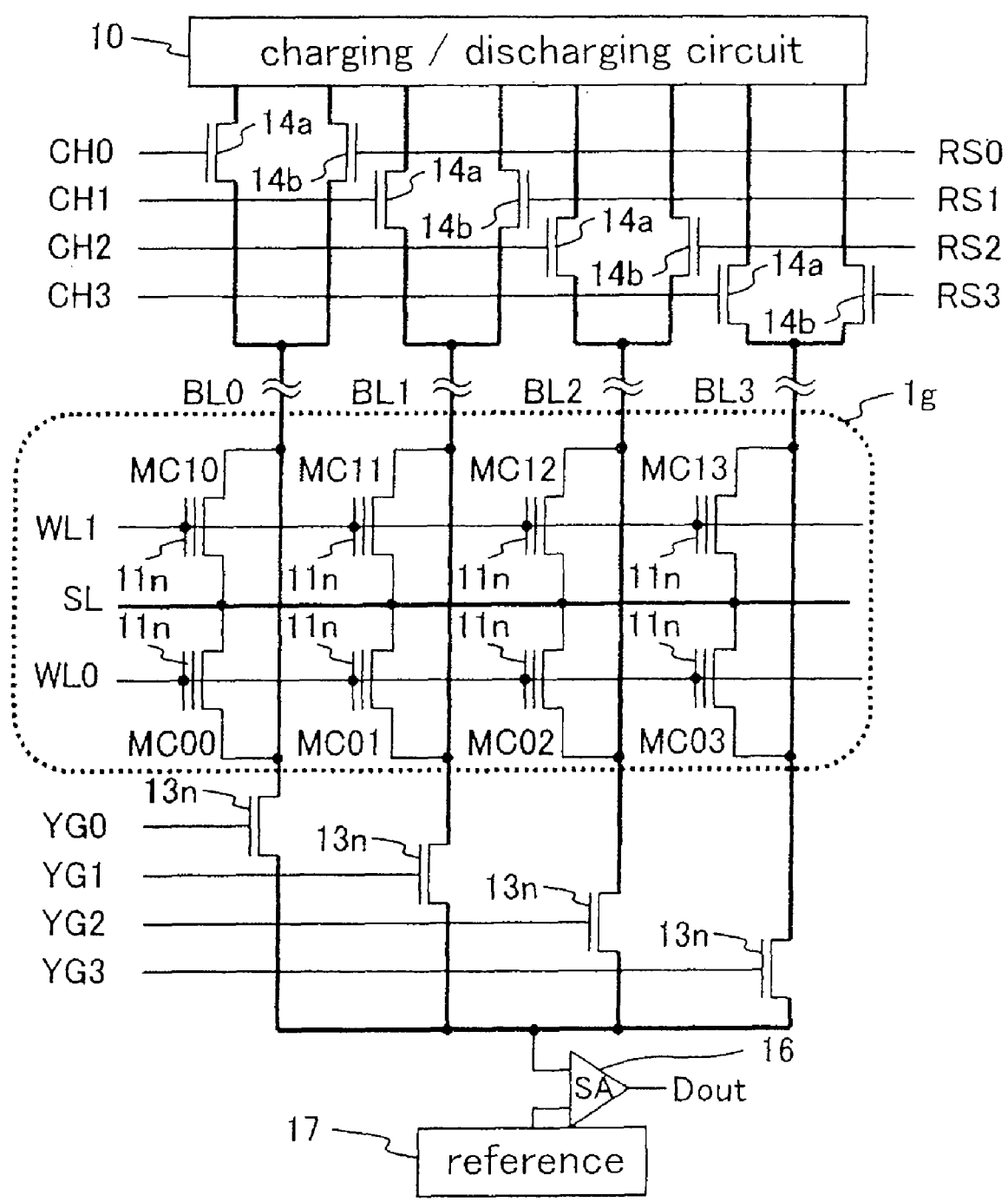
FIG. 25 is a first basic circuit configuration of a semiconductor memory device.

First, a basic constitution of a semiconductor memory device is described. FIG. 25 shows a basic constitution diagram of a semiconductor memory device comprising NOR memory cells. A memory cell array 1g comprises at least one of an Nch memory cell 11n. Memory cells MC00-MC03 are controlled with a word line WL0 shared in a horizontal direction. Memory cells MC10-MC13 are controlled with a word line WL1 shared in the horizontal direction. One ends of the memory cells 11n are respectively connected to bit lines BL0-BL3, while another ends thereof are connected to a common source line SL. The bit lines BL0-BL3 are connected to one end of a sense amplifier 16 thereby shared via bit line selecting transistors 13n. The bit line selecting transistors 13n are respectively controlled by bit line selecting transistor control lines (hereinafter, referred to as bit line selecting lines) YG0-YG3. Another end of the sense amplifier 16 is connected to a reference 17. The sense amplifier 16 outputs a compared result between contents of the memory cells 11n and the reference 17 from a data output terminal Dout.

The bit lines BL0-BL3 are connected respectively to a charging/discharging circuit 10 via charging bit line selecting transistors 14a and reset bit line selecting transistors 14b. The charging bit line selecting transistors 14a are controlled respectively by charging bit line selecting transistor control lines (hereinafter, referred to as charging bit line selecting lines) CH0-CH3. The reset bit line selecting transistors 14b are controlled respectively by reset bit line selecting transistor control lines (hereinafter, referred to as reset bit line selecting lines) RS0-RS3. When voltages of the bit lines BL0-BL3 are set to a predetermined voltage, the charging bit line selecting transistors 14a are selected. When the bit lines BL0-BL3 are reset, the reset bit line selecting transistors 14b are selected. The charging/discharging circuit 10 has a function of pre-charging and resetting the voltages of the bit lines to a predetermined voltage.

A reading operation like this with respect to the memory cells is executed as follows. First, when an operation shifts to a reading mode, a voltage of the source line SL is set to a ground voltage. When an address is inputted and a selected memory cell is determined, the voltage of the bit line executing the reading operation is set to a predetermined voltage (for example, 3V) by the charging bit line selecting transistor 14a selected at the inputted address.

Next, a predetermined voltage (for example, 3V) is applied to the word line connected to the selected memory cell, and the bite line selecting transistor 13n in accordance with the inputted address is selected. At the time, the selected bit line is connected to the source line SL via the selected memory cell 11n. Therefore, a cell current in accordance with data stored in the selected memory cell flows in the selected bit line, and the voltage of the selected bit line thereby changes. The cell current or the voltage of the selected bit line is compared to the reference 17 in the sense amplifier 16 so that the data is judged to be "0" or "1".

Figure 26:
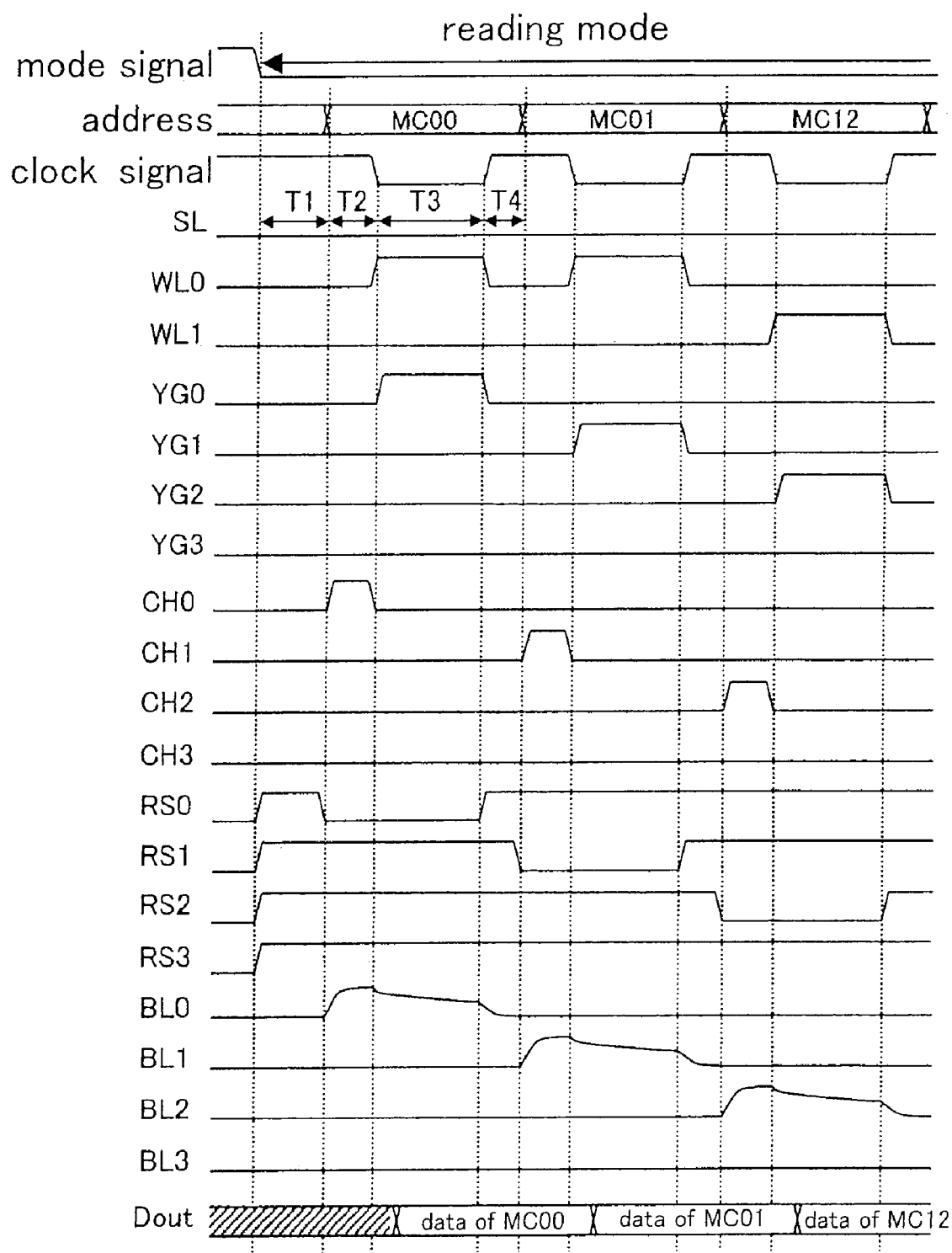
FIG. 26 is a time chart in a reading operation in the device shown in FIG. 25.

FIG. 26 shows timings of voltage variations in the respective wirings in the case where the data is serially read from the memory cells MC00, MC01 and MC12 as an example of a random reading operation, in the semiconductor memory device shown in FIG. 25.

First, the operation is shifted to the reading mode by a mode signal, and the voltage of the source line SL is set to the ground potential (0V) before the address which selects the memory cell MC00 is inputted. The reset bit line selecting lines RS0-RS3 are selected, and the voltages of all of the bit lines BL0-BL3 are set to the ground potential (period T1).

When the address which selects the memory cell MC00 is inputted, the reset bit line selecting line RS0 becomes nonselective, and the charging bit line selecting line CH0 is selected. As a result, the voltage of the bit line BL0 is precharged to a predetermined voltage (for example, 1V) (period T2). When the pre-charge of the voltage of the bit line BL0 is completed, the charging bit line selecting line CH0 becomes nonselective. When a clock signal falls, the word line WL0 and the bit line selecting line YG0 are selected so that the bit line BL0 is connected to the source line SL via the memory cell MC00. As a result, the cell current in accordance with the data stored in the memory cell MC00 flows in the bit line BL0, and the voltage of the bit line BL0 thereby changes. Then, the cell current or the voltage of the bit line is compared to the reference 17 in the sense amplifier 16 so that the data is judged to be "0" or "1". The read data that is a result of the judgment is outputted from the data output terminal Dout (period T3).

When the clock signal rises, the word line WL0 and the bit line selecting line YG0 shift to the nonselective state, and the reset bit line selecting line RS0 is selected. As a result, the voltage of the bit line BL0 is reset to 0V (period T4).

After the reset of the voltage of the bit line BL0 is completed, the address which selects the memory cell MC01 is inputted and the charging bit line selecting line CH1 is selected. As a result, the voltage of the bit line BL1 is pre-charged from 0V to a predetermined voltage.

And below in the same way, the word line WL0 and the bit line selecting line YG1 are selected at a falling edge of the clock signal, and the data of the selected memory cell MC01 is read. After that, the word line WL0 and the bit line selecting line YG1 shift to the nonselective state at a rising edge of the clock signal, and the reset bit line selecting line RS1 is selected. As a result, the voltage of the bit line BL1 is reset to 0V.

In the same way when the data in the memory cell MC12 is read, after the voltage of the bit line BL2 is pre-charged to a predetermined voltage by selecting the charging bit line selecting line CH2 when the select address of the memory cell MC12 is inputted, the data in the memory cell MC12 is read by selecting the word line BL1 and the bit line selecting line YG2 at the falling edge of the clock signal. After the data in the memory cell MC12 is read, the word line WL1 and the bit line selecting line YG2 become nonselective, and the reset bit line selecting line RS2 is selected concurrently at the rising edge of the clock signal. As a result, the voltage of the bit line BL2 is reset.

As described above, when the data is read from the NOR memory cell, the pre-charging of the bit line voltage, the determination of data in the memory cell through the sense amplifier, and the resetting of the bit line voltage, are carried out.

Figure 27:
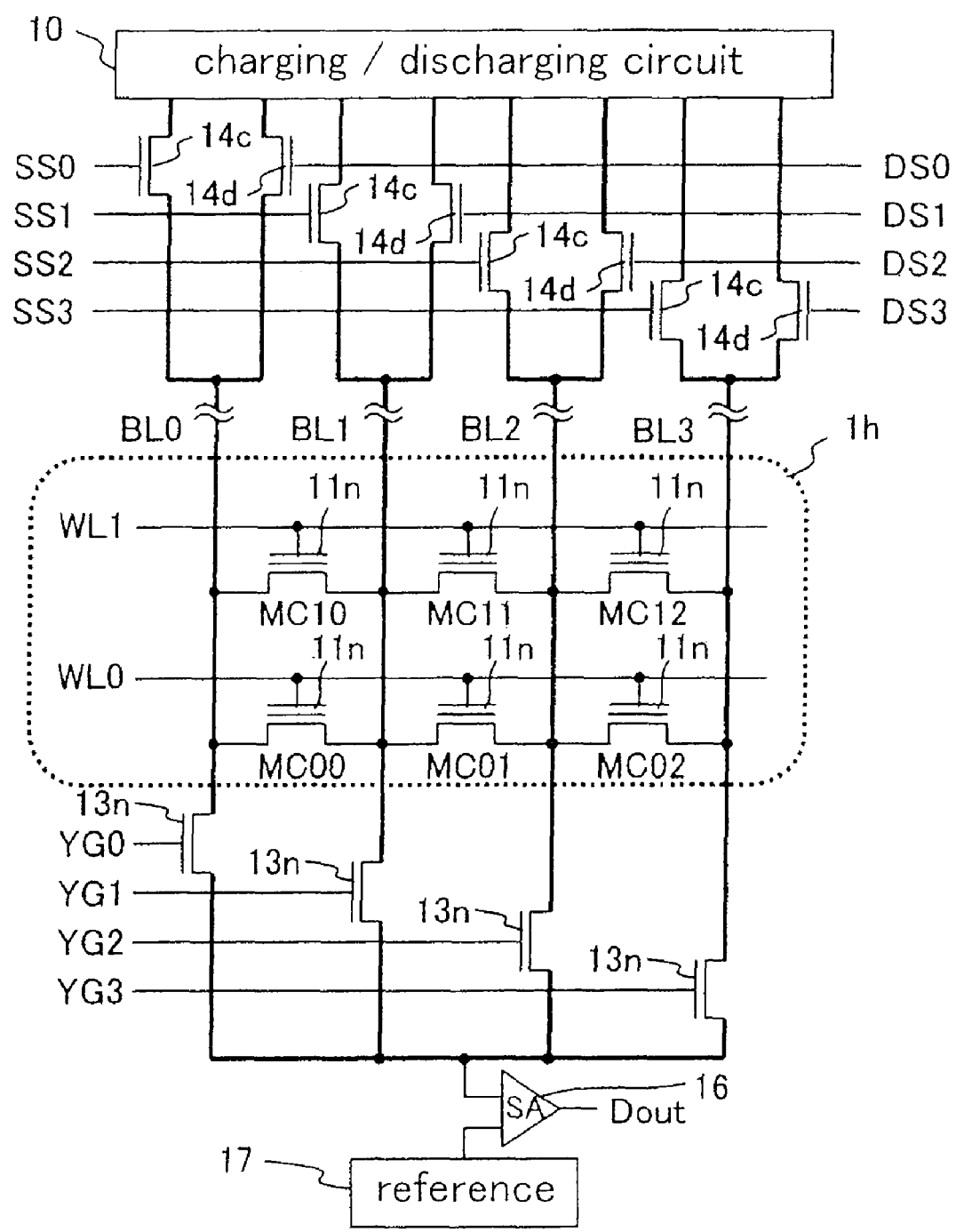
FIG. 27 is a second basic circuit configuration of the semiconductor memory device.

FIG. 27 shows a basic structure diagram of a semiconductor memory device having virtual ground array (VGA) memory cells. A memory cell array 1h comprises a plurality of memory cells 11n. Memory cells MC00-MC02 are controlled through a single word line WL0 in a horizontal direction. Memory cells MC10-MC12 are controlled through a single word line WL1 in the horizontal direction. One ends of the memory cells 11n are respectively connected to bit lines BL0-BL2, while another ends thereof are respectively connected to adjacent bit lines BL1-BL3. The bit lines BL0-BL3 are connected to one end of a common sense amplifier 16 respectively via bit line selecting transistors 13n. The bit line selecting transistors 13n are controlled respectively by bit line selecting lines YG0-YG3. Another end of the sense amplifier 16 is connected to a reference 17. The sense amplifier 16 outputs a result of comparison of contents of the memory cells 11n to the reference 17 from a data output terminal Dout.

The bit lines BL0-BL3 are connected to a charging/discharging circuit 10 respectively via source line selecting transistors 14c and drain line selecting transistors 14d. The source line selecting transistors 14c are respectively controlled by source line selecting transistor control lines (hereinafter, referred to as source line selecting lines) SS0-SS3. The drain line selecting transistors 14d are respectively controlled by drain line selecting transistor control lines (hereinafter, referred to as drain line selecting lines) DS0-DS3. The bit lines selected by the source line selecting lines SS0-SS3 serve as the source lines of the memory cells 11n. The bit lines selected by the drain line selecting lines DS0-DS3 serve as the drain lines of the memory cells 11n. The charging/discharging circuit 10 has a function of applying a source voltage and a drain voltage to the bit lines BL0-BL3.

A reading operation with respect to the VGA memory cell thus configured, for example, in the case of source sensing, is executed as follows. The drain line and the source line of the memory cell are determined in accordance with the inputted address. The voltage of the bit line serving as the drain line is pre-charged to a predetermined voltage through selecting the drain line selecting transistor 14d by the drain line selecting line (any of DS0-DS3). The bit line serving as the source line is set to the ground voltage (0V) through selecting the source line selecting transistor 14c by the source line selecting line (any of SS0-SS3), and serves as the bit line for the data reading operation with respect to the memory cell.

Next, the bit line selecting line 13n is selected in accordance with the inputted address so that the source line and the sense amplifier 16 are connected to each other. A predetermined voltage is applied to the selected word line so that the drain line is connected to the source line via the selected memory cell 11n, and the cell current in accordance with the data stored in the selected memory cell flows in the source line, which changes the voltage of the source line. The cell current or the voltage of the source line is compared to the reference 17 in the sense amplifier 16 so that the data is decided to be "0" or "1".

Figure 28:
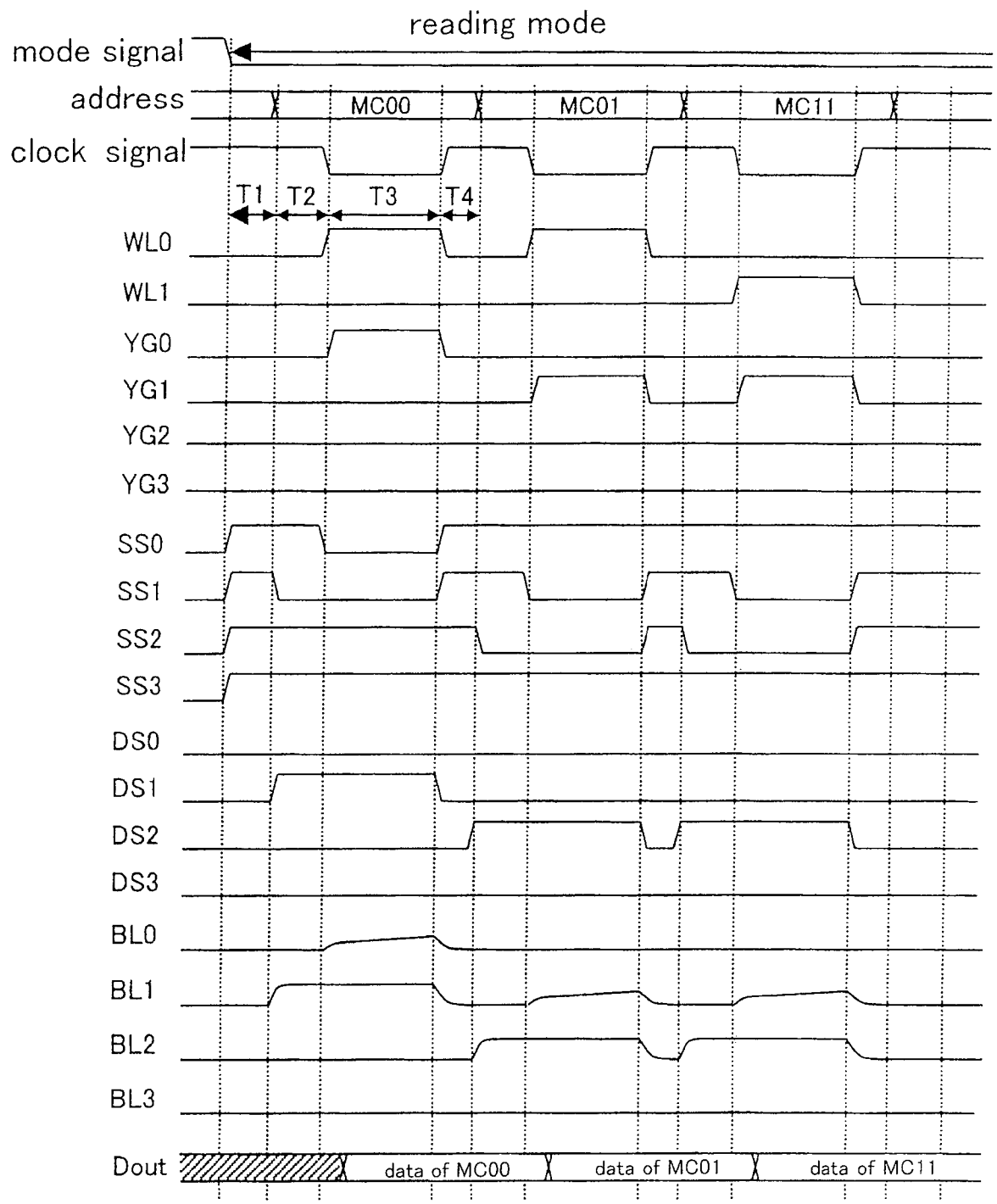
FIG. 28 is a time chart in a reading operation in the device shown in FIG. 27.

FIG. 28 shows timings of voltage variations in the respective wirings in the case where the data is serially read from the memory cells MC00, MC01 and MC11, which is an example of the random reading operation in the semiconductor memory device shown in FIG. 27. First, the operation is shifted to the reading mode by the mode signal, and the voltages of all of the bit lines BL0-BL3 are set to the ground potential (period T1) through selection of the source line selecting lines SS0-SS3 before the address which selects the memory cell MC00 is inputted.

Next, when the address which selects the memory cell MC00 is inputted, for example, in the case where the bit line BL0 serves as the source line and the bit line BL1 serves as the drain line, the source line selecting line SS1 becomes nonselective and the drain line selecting line DS1 is selected so that a predetermined drain voltage (for example, 1.1V) is pre-charged to the bit line BL1 (period T2). When the clock signal falls after the pre-charge of the voltage of the bit line BL1 is completed, the source line selecting line SS0 becomes nonselective, and the word line WL0 and the bit line selecting line YG0 are selected. As a result, the drain line is connected to the source line via the memory cell MC00. According to this, the cell current in accordance with the data stored in the memory cell MC00 flows in the bit line BL0, which changes the voltage of the bit line BL0. The cell current or the voltage of the bit line is compared to the reference 17 in the sense amplifier 16 so that the data is decided to be "0" or "1", and the read data showing the determination result is outputted from the data output terminal Dout (period T3).

Next, when the clock signal rises, the word line WL0, the bit line selecting line YG0 and the drain line selecting line DS1 shift to the nonselective state, and the source line selecting lines SS0 and SS1 are selected. The voltages of the bit lines BL0 and BL1 are thereby reset to the ground voltage (period T4). In the case where the address which selects the memory cell MC01 is inputted after the reset of the voltages of the bit lines BL0 and BL1 is completed, and the bit line BL1 serves as the source line and the bit line BL2 serves as the drain line, the source line selecting line SS2 becomes nonselective and the drain line selecting line DS2 is selected. As a result, the bit line BL2 is pre-charged from the ground potential to a predetermined voltage.

Hereinafter in the same way, the source line selecting line SS1 becomes nonselective, and the word line WL0 and the bit line selecting line YG1 are selected at the falling edge of the clock signal, and the data in the selected memory cell MC01 is read. When the clock signal rises, the word line WL0, bit line selecting line YG1 and drain line selecting line DS2 shift to the non-selective state, and the source line selecting lines SS1 and SS2 are selected. As a result, the voltages of the bit lines BL1 and BL2 are reset to the ground potential.

In the same way when the data in the next memory cell MC11 is read, in the case where the bit line BL1 serves as the source line and the bit line BL2 serves as the drain line, the source line selecting line SS2 becomes nonselective and the drain line selecting line DS2 is selected when the select address of the memory cell MC11 is inputted so that the voltage of the bit line BL2 is pre-charged to a predetermined voltage. Thereafter, the source line selecting line SS1 becomes nonselective, and the word line WL1 and the bit line selecting line YG1 are selected at the falling edge of the clock signal so that the data in the selected memory cell MC11 is read. Further, the word line WL1, bit line selecting line YG1 and drain line selecting line DS2 shift to the nonselective state and the source line selecting lines SS1 and SS2 are selected at the rising edge of the clock signal, and the voltages of the bit lines BL1 and BL2 are thereby reset to the ground potential.

As described above, when the data is read from the VGA memory cell, the voltage pre-charging of the bit line, the determination of the data in the memory cell in the sense amplifier, and the voltage reset of the bit line, are carried out.

Irrespective of the NOR or VGA type of the mentioned-above memory cell, in the case where the data is read from the memory cell by stockpiling the data in the memory cell and comparing the current or the voltage changed depending on the stored data to the reference, the voltage pre-charging of the bit line, the determination of the data in the memory cell in the sense amplifier, and the voltage reset of the bit line, are carried out.

Hereinafter, preferred embodiments of a semiconductor memory device according to the present invention are described in detail referring to the drawings. First, a description of a basic constitution according to the present invention based on the constitution of the aforementioned semiconductor memory device is given below.

Explanation on Basic Constitution According to the Present Invention

Figure 1:
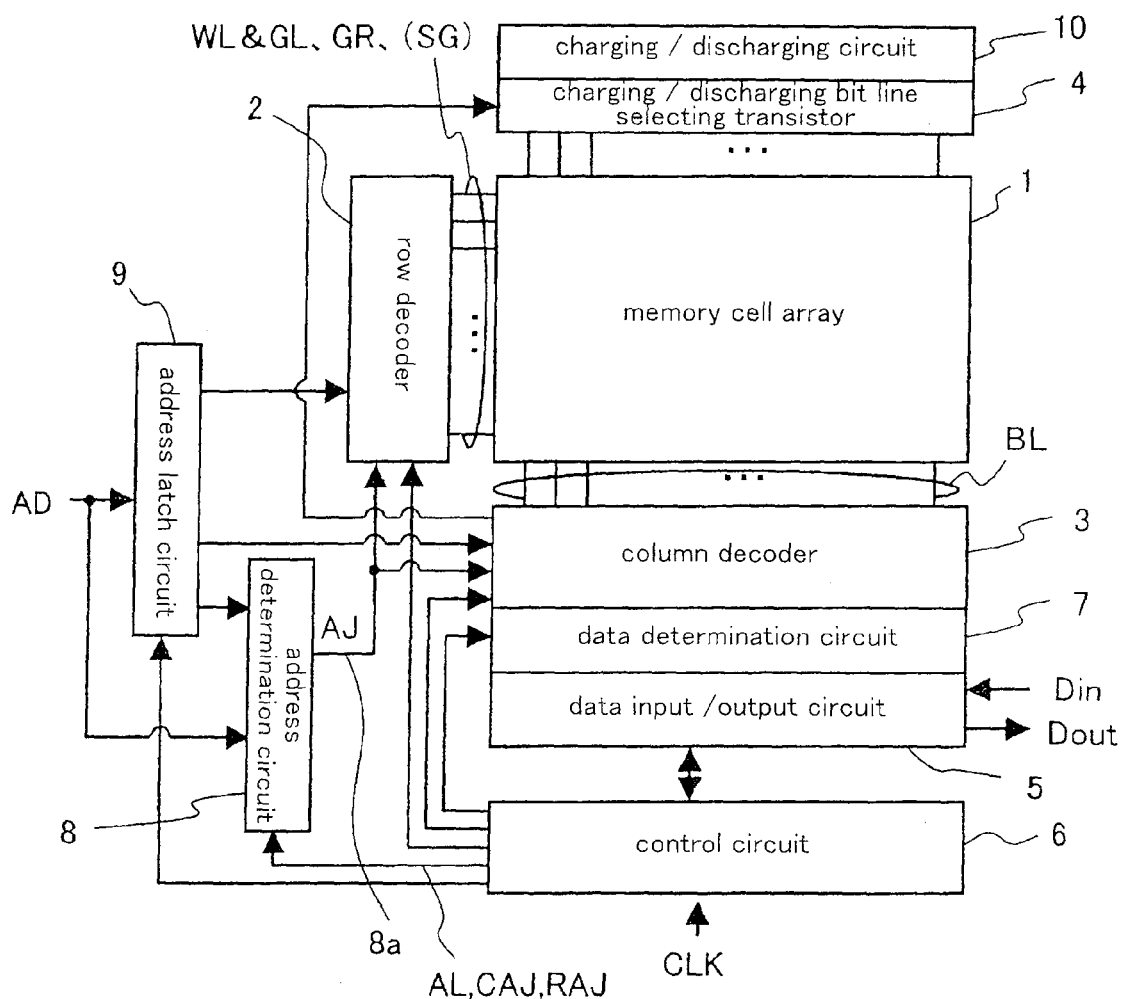
FIG. 1 is a block diagram showing a constitution of a main part of a semiconductor memory device according to preferred embodiments of the present invention.

FIG. 1 is a block diagram illustrating a constitution of a main part of a semiconductor memory device according to the preferred embodiments of the present invention. The semiconductor memory device comprises a memory cell array 1, a row decoder 2, word lines WL and selecting transistor control lines GL, GR and SG drawn from the row decoder 2, a column decoder 3, bit lines BL drawn from the column decoder 3, a charging/discharging bit line selecting transistor 4, a data input/output circuit 5, a control circuit 6, a data determination circuit 7, an address determination circuit 8, an address determination signal line 8a drawn from the address determination circuit 8, an address latch circuit 9, and a charging/discharging circuit 10. In the drawing, a power-supply circuit, an address buffer and the like are omitted. The column decoder 3 includes a bit line selecting transistor control line (hereinafter, referred to as bit line selecting line) YG.

An address signal AD is inputted to the address latch circuit 9 and the address determination circuit 8. The address latch circuit 9 retains the address signal AD inputted at a timing of an address latch signal from the control circuit 6 and transmits the retained address signal AD to the row decoder 2, column decoder 3 and address determination circuit 8. When the address signal is invalid, the address signal AD is not retained in the address latch circuit 9 and transmitted to the row decoder 2, column decoder 3 and address determination circuit 8. In the case where, for example, an address signal AD2 is inputted after an inputted address signal AD1 is latched in the address latch circuit 9, the address determination circuit 8 is the one for outputting an address determination signal AJ when the address signal AD1 retained in the address latch circuit 9 and the address signal AD2 inputted after the address signal AD1 is latched is compared to each other and the two address signals are coincident with each other. For example, when the addresses of the address signals AD1 and AD2 that select the bit line are coincident with each other, the address determination signal AJ outputs a determination showing the coincidence. The output of the address determination signal AJ counter changes every time the addresses are coincident with each other. For example, if the address signals are coincident in a state where the first address determination signal Aj is in the "L" state, the address determination signal AJ shifts to the "H" state at the time.

The address determination signal AJ maintains the "H" state until the address signals are coincident with each other next time, and shifts to the "L" state when the address signals are coincident with each other again. The address determination signal AJ is inputted to the row decoder 2 and the column decoder 3. It is desirable that the addresses are compared in the address determination circuit 8 when the address latch control signal becomes valid and the next address is inputted.

The row decoder 2 receives the address signal AD via the address latch circuit 9 and the address determination signal AJ outputted from the address determination circuit 8, and selects switching control of the selecting transistor control lines GL and GR (or SG), and any or all of a plurality of word lines WL arranged in the memory cell array 1. The selected word lines WL and the selected transistor control lines GL and GR (or SG), whose voltages are changed to such voltages that are suitable for the reading, writing and erasing operations, are activated.

The column decoder 3 receives the address signal AD via the address latch circuit 9 and the address determination signal AJ outputted from the address determination circuit 8, and controls the bit line selecting lines YG present in the column decoder 3 and the charging/discharging bit line selecting transistor 4, and selects any of the plurality of bit lines BL arranged in the memory cell array 1 or one of them at every predetermined number.

When the data is read, the bit line BL selected by the column decoder 3 is connected to the sense amplifier in the data determination circuit 7, and the data in the memory cell is read. The memory cell data read by the data determination circuit 7 is outputted from the data output terminal Dout of the data input/output circuit 5. When the data is written, the data to be written is inputted to the data input/output circuit 5. The charging/discharging circuit 10 pre-charges the bit line BL selected by the column decoder 3 to a predetermined voltage or resets it.

Figure 2:
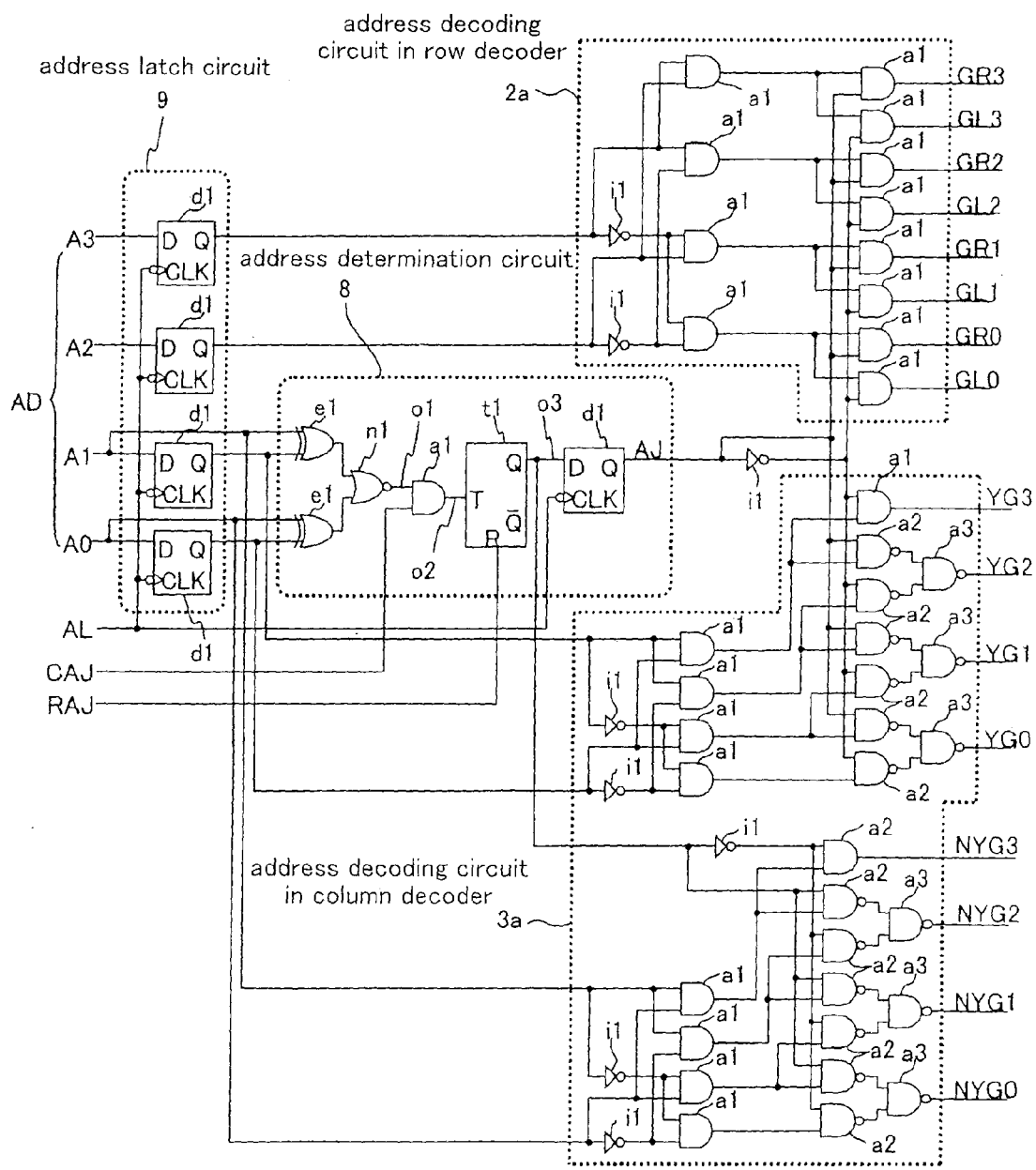
FIG. 2 shows a first constitutional example of an address determination circuit and peripheral circuits thereof used in the preferred embodiments.

FIG. 2 shows a frame format of a constitutional example of the address determination circuit 8, address latch circuit 9, address decoding circuit 2a included in the row decoder 2 and address decoding circuit 3a included in the column decoder 3. The address determination circuit 8 comprises EX-OR circuits e1, an NOR circuit n1, an AND circuit a1, a T-flipflop t1 and a D-flipflop d1. The address latch circuit 9 comprises D-flipflops d1, wherein one of the D-flipflops d1 is connected to one address. A0-A3 composes the address signal AD. In the present example, A0-A1 are allocated to the addresses that select the bit lines, and A2-A3 are allocated to the addresses that select the word lines. AL denotes an address latch control signal that activates the address latch of the address latch circuit 9. CAJ denotes an address determination signal control signal for controlling the output of the result on address comparison obtained in the address determination circuit 8 in the AND circuit a1. RAJ denotes an address determination signal reset signal for initializing the address determination signal AJ of the address determination circuit 8 in the T-flipflop t1. In the address decoding circuit 2a included in the row decoder 2, any of the selecting transistor control lines GL0-GL3 and GR0-GR3 is selected by the address determination signal AJ and the addresses A2 and A3 through the address latch circuit 9.

In the address decoding circuit 3a included in the column decoder 3, any of the bit line selecting lines YG0-YG3 is selected by the address determination signal AJ and the addresses A0 and A1 through the address latch circuit 9. Further, any of next bit line selecting transistor control lines (hereinafter, referred to as next bit line selecting lines) NYG0-NYG3 is selected by a non-latched output o3 of the address determination signal and non-latched addresses A0 and A1. The next bit line selecting lines NYG are in charge of controlling selection or non-selection of any or all of the charging bit line selecting lines CH, reset bit line selecting lines RS, drain line selecting lines DS and source line selecting lines Ss.

FIG. 3 shows timings of variations of the respective wiring signals when 0h, 8h, 1h and 9h are inputted as the address signal in the address determination circuit 8 shown in FIG. 2. First, the address determination signal control signal CAJ is in the "L" state, and the address latch control signal AL and the address determination signal reset signal RAJ are in the "H" state. When the address determination signal reset signal RAJ in the "H" state, the address determination signal AJ is in the "L" state. When the address determination signal RAJ is reset and released after the address determination signal reset signal RAJ shifts to the "L" state. And then, when 0$h$ is inputted to the address signal AD, the address is not latched to the address latch circuit 9 because the address latch control signal AL is in the "H" state, and an output o1 is thereby in the "H" state.

Meanwhile, because the address determination signal control signal CAJ is in the "L" state, an output o2 maintains the "L" state, and the output o3 is in the "L" state, and the address determination signal AJ is in the "L" state. At the time, the selecting transistor control line GL0 is selected in the address decoding circuit 2$a$ and the bit line selecting line YG0 and the next bit line selecting line NYG0 are selected in the address decoding circuit 3$a$ because the address determination signal AJ is in the "L" state.

Next, when the address latch control signal AL shifts to the "L" state, the address (0$h$) is latched in the address latch circuit 9. When 8$h$ is inputted to the address signal AD during a period when the address latch control signal AL is in the "L" state, the address (8$h$) and the address (0$h$) latched in the address latch circuit 9 are compared to each other in the address determination circuit 8. In relation to both of the address (0$h$=0000) and the address (8$h$=1000), the signal (00) of the bit line selecting addresses A0-A1 is not changed and remains the same. Therefore, the output o1 maintains the "H" state.

When the address determination signal control signal CAJ shifts to the "H" state and the output o2 shifts to the "H" state, the T-flipflop t1 detects a rising edge of the output o2, and the output o3 shifts to the "H" state (inverted state). At the time, the next bit line selecting line NYG1 is selected by the non-latched inputted address (8$h$) and the output o3. The next bit line selecting line NYG1 is selected until the next address is inputted. When the address determination signal control signal CAJ shifts to the "L" state, the output o2 shifts to the "L" state. The output o3 maintains the "H" state until the rising edge of the output o2 is detected again. When the address latch control signal AL shifts to the "H" state, the address latch becomes invalid, and the selecting transistor control line GR2 and the bit line selecting line YG1 are selected in accordance with the inputted address (8$h$) and the address determination signal AJ ("H" state). In a similar manner, when the address (1$h$=1000) is inputted after the address latch control signal AL shifts to the "L" state and the address (8$h$=1000) is latched, the output o1 is in the "L" state because the bit line selecting addresses A0-A1 (00 and 01) are not coincident with each other. When the address determination signal control signal CAJ is in the "H" state, the output o2 maintains the "L" state, and the output o3 is not inverted. At the time, the next bit line selecting line NYG2 is selected by the non-latched inputted address (1$h$) and the output 03, and the next bit line selecting line NYG2 is selected until the next address is inputted. Because the address determination signal AJ maintains the "H" state, the selecting transistor control line GR0 and the bit line selecting line YG2 are selected in accordance with the inputted address (1$h$) and the address signal AJ ("H" state) when the address latch control signal AL shifts to the "H" state.

Next, when the address (9$h$=1001) is inputted after the address latch control signal AL shifts to the "L" state and the address (1$h$=0001) is latched, the bit line selecting addresses A0-A1 (01) are coincident with each other, and then, the output o1 shifts to the "H" state. The address determination signal control signal CAJ is in the "H" state, the output o2 is in the "H" state, and the output o3 is inverted ("L" state). At the time, the next bit line selecting line NYG1 is selected by the non-latched inputted address (9$h$) and the output o3, and the next bit line selecting line NYG1 is selected until the next address is inputted. Because the address determination signal AJ is in the "L" state, the selecting transistor control line GL2 and the bit line selecting line YG1 are selected in accordance with the inputted address (9$h$) and the address determination signal AJ ("L" state) when the address latch control signal AL is in the "H" state.

Summarizing the foregoing description, the address determination signal AJ is inverted every time when the latched address signal is coincident with the address signal that is subsequently inputted, which is shown in FIG. 3.

Figure 4:
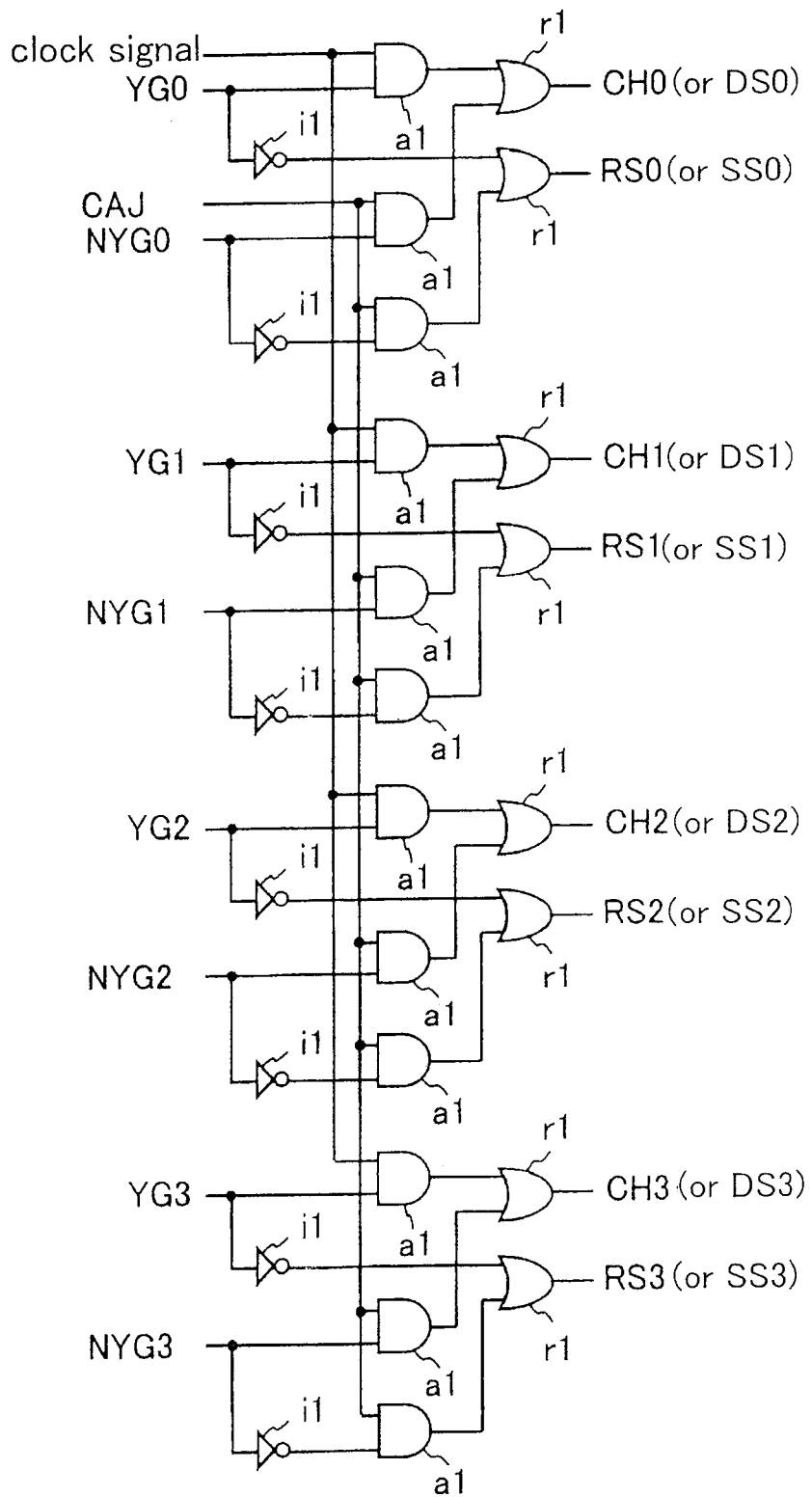
FIG. 4 shows a constitutional example of a charging/discharging bit line selecting circuit in a column decoder according to the preferred embodiments.

FIG. 4 shows a schematic constitutional example of a circuit included in the column decoder 3, wherein the charging bit line selecting lines CH0-CH3 and the reset bit line selecting lines RS0-RS3 are selected based on the bit line selecting lines YG0-YG3, next bit line selecting lines NYG0-NYG3, address determination signal control signal CAJ and clock signal, or the drain line selecting lines DS0-DS3 and the source line selecting lines SS0-SS3 are selected based on the aforementioned group of signals.

FIG. 5 shows timings of variations of the respective wiring signals when YG0, YG2, YG2 and YG2 are sequentially inputted to the inputted address in the circuit shown in FIG. 4. In the drawing, the address latch control signal SL is regarded as the clock signal. Though the charging bit line selecting lines CH and the reset bit line selecting lines RS are described below, it is possible that the charging bit line selecting lines are replaced with the drain line selecting lines DS, and the reset bit line selecting lines RS are replaced with the source line selecting lines SS.

When the operation shifts to the reading mode by the mode signal at first, the reset bit line selecting lines RS0-RS3 are all selected.

Next, when the address that selects the bit line selecting line YG0 is inputted, the next bit line selecting line NYG0 is selected. However, the selection/non-selection of the charging bit line selecting line CH0 and the reset bit line selecting line RS0 is not thereby affected because the address determination signal control signal CAJ is in the "L" state. Further, the address is not latched because the clock signal is in the "H" state, and the bit line selecting line YG0 is selected. Based on that, the charging bit line selecting line CH0 is selected, while the reset bit line selecting line RS0 becomes nonselective. When the clock signal falls, the charging bit line selecting line CH0 becomes nonselective, and the address that selects the bit line selecting line YG0 is latched. As a result, the bit line selecting line YG0 is continuously selected until the clock signal rises. As the bit line selecting line YG0 is in a selective state at the time, the reset bit line selecting line RS0 retains its nonselective state. When the address that selects the bit line selecting line YG2 is inputted during a period when the clock signal is in the "L" state, the next bit line selecting line NYG2 is selected. When the address determination signal control signal CAJ shifts to the "H" state, the charging bit line selecting line CH2 is selected, while the reset bit line selecting line RS2 becomes nonselective because the next bit line selecting line NYG2 is selected. The reset bit line selecting lines RS0 and RS2 are both in the nonselective state because the bit line selecting line YG0 is continuously selected with the address latch.

Next, as the address latch is released when the clock signal rises, the reset bit line selecting line RS0 is selected, and the bit line selecting line YG2 is selected. After that, when the address determination signal control signal CAJ shifts to the "L" state, though the next bit line selecting line NYG2 is irrelevant to the selection/non-selection of the charging bit line selecting line CH2 and the reset bit line selecting line RS2, the bit line selecting line YG2 is selected at the time. Therefore, the selection of the charging bit line selecting line CH2 and the non-selection of the reset bit line selecting line RS2 are maintained. When the clock signal (address latch control signal AL) falls, the charging bit line selecting line CH2 becomes nonselective. When the address that selects the bit line selecting line YG2 is inputted during a period of the "L" state where the clock signal falls, the determination on the consistency of the addresses is outputted from the address determination circuit 8. Accordingly, the next bit line selecting line NYG3 is selected, the charging bit line selecting line CH3 is selected, and the reset bit line selecting line RS3 is in a non-selective state. After that, when the clock signal rises, the reset bit line selecting line RS2 is selected. However, the selection of the charging bit line selecting line CH3 and the non-selection of the reset bit line selecting line RS3 are maintained. After that, when the clock signal falls, the charging bit line selecting line CH3 becomes nonselective. When the address that selects the bit line selecting line YG2 is inputted during the period of "L" state where the clock signal falls, the determination on the consistency of the addresses is outputted from the address determination circuit 8. Therefore, the next bit line selecting line NYG2 is selected, the charging bit line selecting line CH2 is in a selective state, and the reset bit line selecting line RS2 is in non-selective state. Though the reset bit line selecting line RS3 is selected when the clock signal rises, the selective state of the charging bit line selecting line CH2 and the non-selective state of the reset bit line selecting line RS2 are maintained. When the clock signal falls, the charging bit line selecting line CH2 becomes nonselective. The reset bit line selecting line RS2 is selected when the clock signal rises.

When the circuit shown in FIG. 4 is used, the bit line, which is different to the bit line for reading the data from the memory cell, can be charged/discharged while the data is being read from the memory cell.

The address determination circuit 8 shown in FIG. 2 is configured in such a manner that the address determination signal AJ is inverted only when the bit line selecting addresses A0-A1 are all consistent. However, the function expected in the present invention can be exerted even in an address determination circuit 8' wherein the address determination signal AJ is inverted only when lowest-order addresses of the bit line selecting addresses A0-A1 are consistent as shown in the circuit configuration of FIG. 6.

Preferred Embodiment 1

Figure 7:
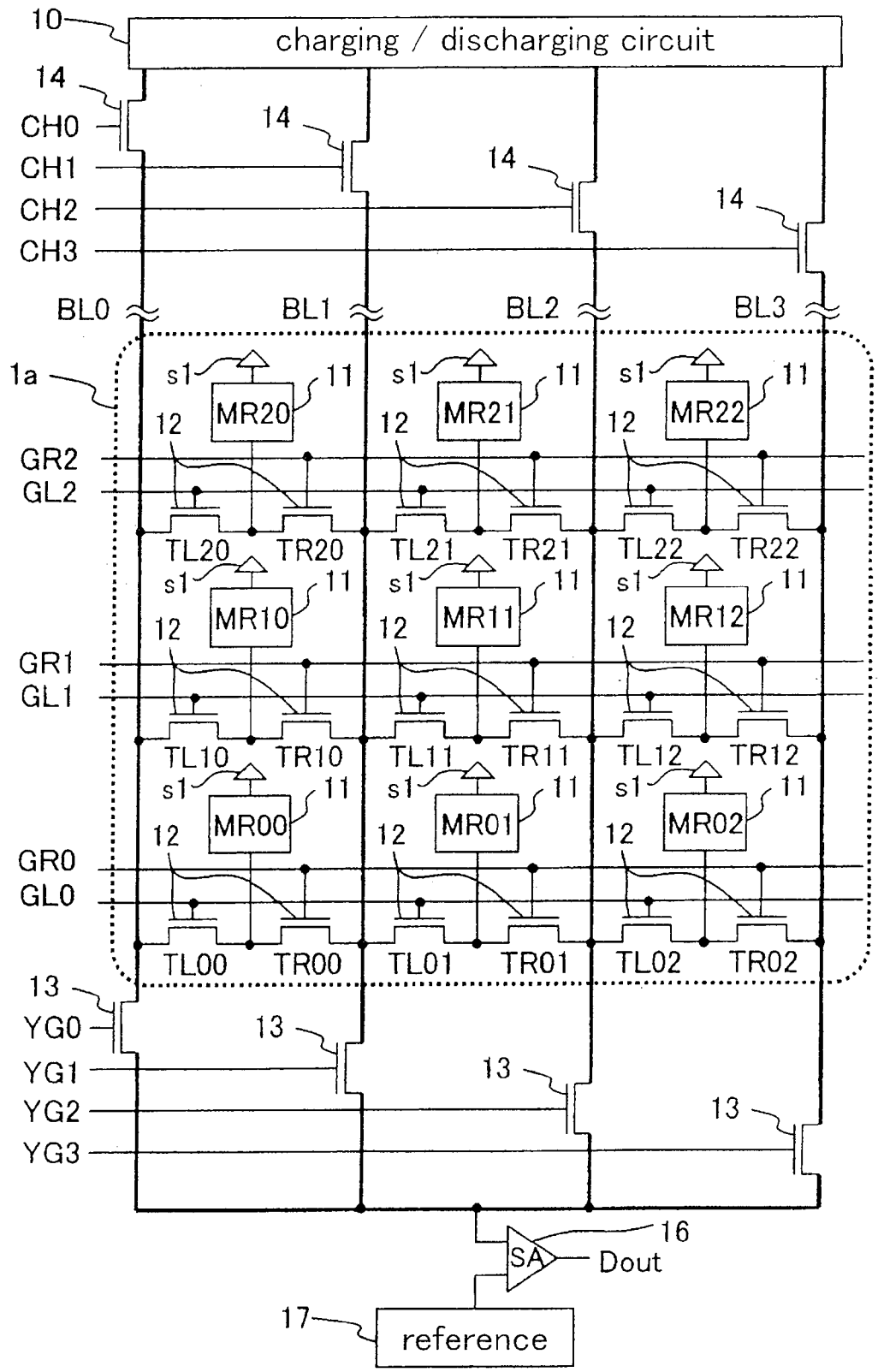
FIG. 7 shows a schematic circuit configuration of a memory cell array according to a preferred embodiment 1 of the present invention.

FIG. 7 shows a schematic plan structure of a memory cell array according to a preferred embodiment 1 of the present invention. As shown in FIG. 7, a semiconductor memory device according to the present preferred embodiment comprises a memory cell array 1a comprising memory cells 11 with source terminals s1. Two selecting transistors TL [n, m] and TR [n, m] (n≧0, m≧0) are connected to a first terminal of a memory cell MR [n, m]. The selecting transistors TL [n, m] are connected to first bit lines BL [m], and the selecting transistors TR [n, m] are connected to second bit lines BL [m+1]. An end of a sense amplifier 16 is connected to the respective bit lines BL [m] via bit line selecting transistors 13 controlled by bit line selecting lines YG [m]. The respective bit lines BL [m] are connected to a charging/discharging circuit 10 via charging bit line selecting transistors 14 controlled by charging bit line selecting transistor control lines (hereinafter, referred to as charging bit line selecting lines) CH [m]. The selecting transistors TL [n, m] and TR [n, m] are controlled through selecting transistor control lines GL [n] and GR [n]. A reference 17 is connected to another end of the sense amplifier 16. The charging/discharging circuit 10 pre-charges voltages of the bit lines BL0-BL3.

Though there is no particular limitation to the present preferred embodiment, at least one of Pch non-volatile memory or depression non-volatile memory can be applied to the memory cell array 1a shown in FIG. 7. More specifically, a memory cell in which it is unnecessary to pre-charge the voltage of the bit line to a predetermined voltage before the reading operation can be adopted as the memory cell 11. Further, as there is no particular limitation to a structure of the memory cell 11, any of NOR, NAND and AND memory cells is applicable. It is good enough that the memory cell array 1a has a structure that the memory cells are connected to the source lines and bit lines.

Figure 8:
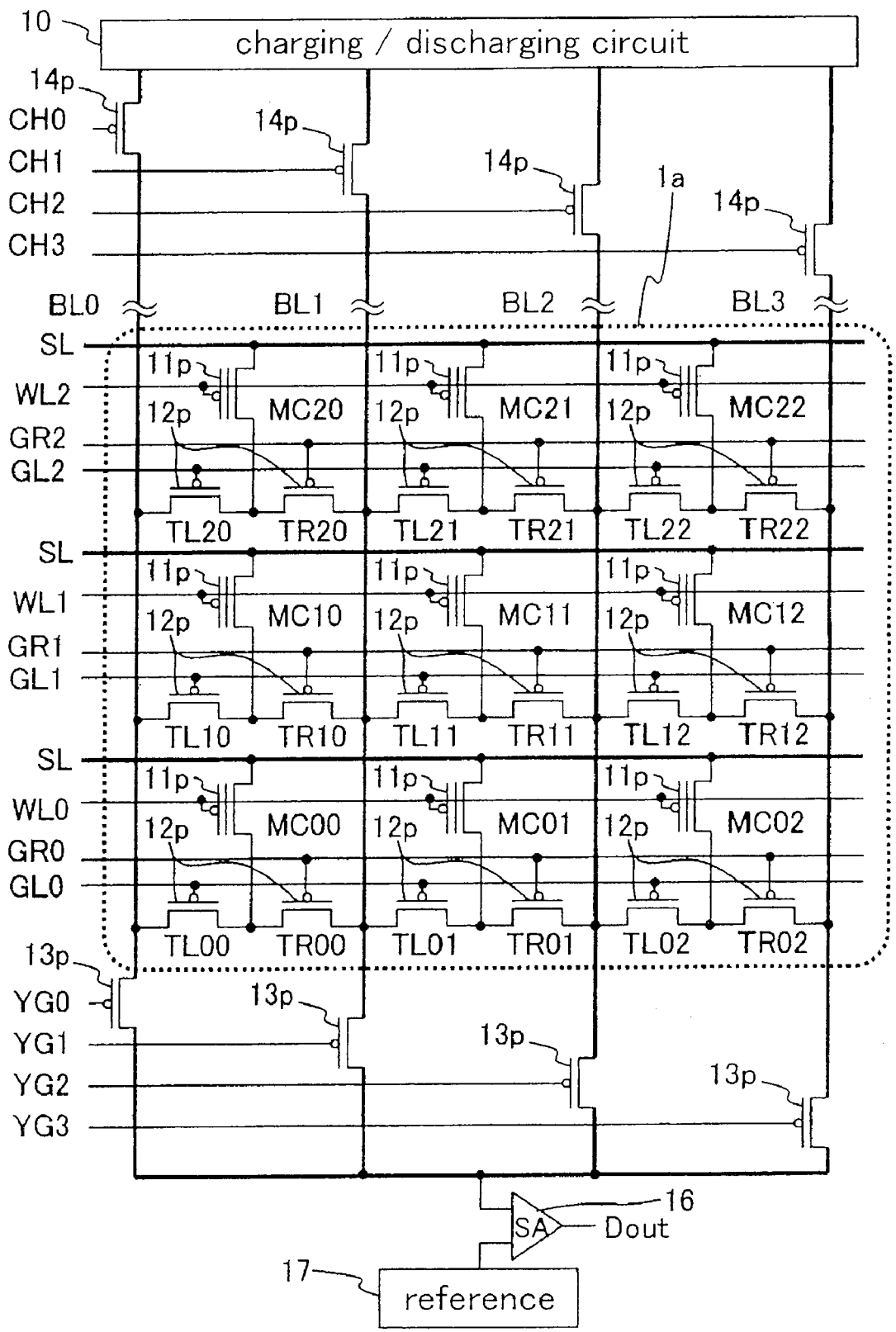
FIG. 8 shows a frame format of the circuit configuration according to the preferred embodiment 1.

In FIG. 8, the constitution shown in FIG. 7 is developed in such a manner that Pch non-volatile memory cells 11p are adopted as the memory cells 11 wherein a Pch transistor constitutes a selecting transistor 12p, a bit line selecting transistor 13p and a charging bit line selecting transistor 14p. The memory cell array 1a consists of at least one Pch memory cell 11p. Memory cells MC00-MC02 are controlled through a single word line WL0 in a lateral direction. Memory cells MC10-MC12 are controlled through a single word line WL1 in a lateral direction. Memory cells MC20-MC22 are controlled through a single word line WL3 in a lateral direction. One ends of the memory cells 11p are respectively connected to the bit lines BL0-BL3 via the two selecting transistors TL and TR. Another ends of the memory cells 11p are connected to a single source line SL. The bit lines Bl0-BL3 are connected respectively to one end of the common sense amplifier 16 via the bit line selecting transistors 13p. The bit line selecting transistors 13p are respectively controlled through the bit line selecting lines YG0-YG3. The sense amplifier 16 comprises a circuit for discharging the voltage of the bit line. Another end of the sense amplifier 16 is connected to the reference 17. A result of comparison of the contents of the memory cells 11p to the reference 17 in the sense amplifier 16 is outputted from a data output terminal Dout which is an output terminal of the sense amplifier 16.

In addition, the reference 17 may be any of a current source such as a memory cell and a transistor capable of outputting an intermediate current between a cell current of the memory cell 11p which retains "1" data and a cell current of the memory cell 11p which retains "0" data. Furthermore, the reference 17 may be a voltage source having an intermediate voltage between the bit-line voltage in the reading operation with respect to the memory cell 11p retaining the "1" data and the bit-line voltage in the reading operation with respect to the memory cell 11p retaining the "0" data. Further, the reference 17 may be configured in such a manner that two selecting transistors are connected to one end of the reference cell or memory cell and the two selecting transistors are alternately switched every time when the data is read from the memory cell so that they can be connected to the different bit lines in the same manner as the configuration of the memory cells described earlier. Like this, there is no special limitation to a structure of the reference 17 as far as it serves as a comparison reference when the data of the memory cell 11p is discriminated by the sense amplifier 16.

The bit lines BL0-BL3 are connected respectively to the charging/discharging circuit 10 via the charging bit line selecting transistors 14p. The charging bit line selecting transistors 14p are controlled respectively through the charging bit line selecting lines CH0-CH3. When the voltages of the bit lines BL0-BL3 are set to a predetermined voltage, the charging bit line selecting transistors 14p are selected. The charging/discharging circuit 10 has a function of pre-charging the bit-line voltage to the predetermined voltage.

A reading operation with respect to the Pch memory cell 11p is carried out as follows. In a reading mode, the voltage of the source line SL and the voltages of all of the bit lines are set to a power-supply voltage, and a predetermined voltage (for example, 1V) is applied to all of the word lines. When the clock signal falls, the charging bit line selecting transistor 14p in accordance with the inputted address becomes nonselective, and the selecting transistor 12p and the bit line selecting transistor 13p are selected. Accordingly, the voltage of the selected bit line drops from the power-supply voltage through a discharging circuit provided in the sense amplifier 16. At the time, the cell current in accordance with the data stored in the selected memory cell 11p flows in the selected bit line, and the voltage of the selected bit line thereby changes. The cell current or the voltage of the selected bit line is compared to the reference 17 in the sense amplifier 16 so that the data is decided to be "0" or "1".

Figure 9:
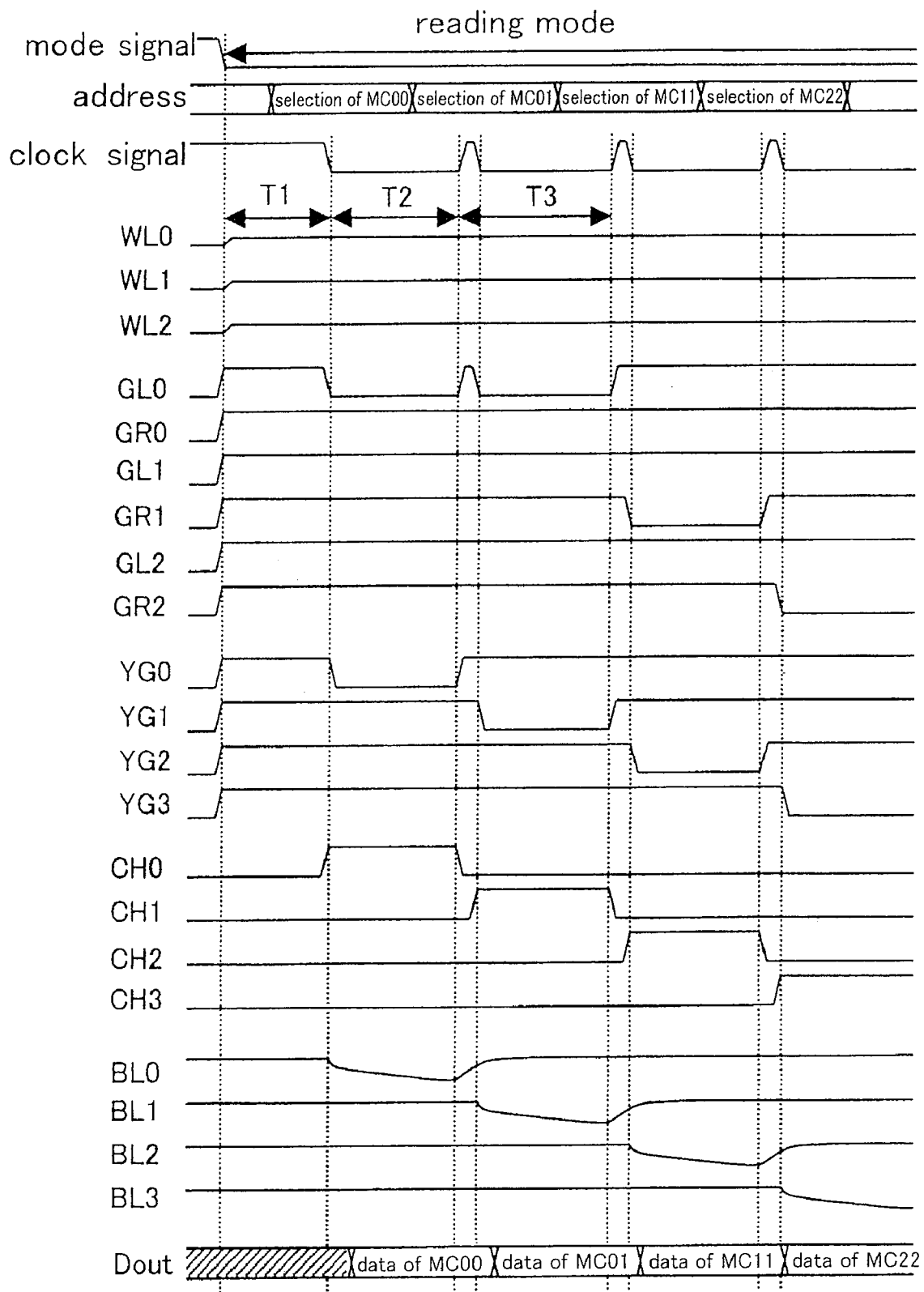
FIG. 9 is a time chart in a reading operation in the circuit shown in FIG. 8.

FIG. 9 shows timings of voltage variations in the respective wirings when the data in the memory cells MC00, MC01, MC11 and MC22 is sequentially read as an example of the random reading operation in the circuit configuration shown in FIG. 8. A description is given below provided that the address latch control signal AL is regarded as the clock signal and the address determination signal reset signal RAJ is regarded as the mode signal by using the address determination circuit 8 shown in FIG. 2. The description is further given based on the assumption that the address determination signal control signal CAJ shifts to the "H" state and the address determination signal AJ becomes valid by releasing the address latch after the address signals are compared as shown in the signal timings of FIG. 3. In FIG. 9, the variation timing of the address determination signal control signal CAJ is omitted.

When the operation shifts to the reading mode based on the mode signal (address determination signal reset signal RAJ), the output of the address determination circuit 8 is reset so as to be the "L" state. Further, the voltage of the source line SL is set to the power-supply voltage and the charging bit line selecting lines CH0-CH3 are all selected not later than the address that selects the memory cell MC00 is inputted. As a result, the voltages of all of the bit lines BL0-BL3 are charged to the power-supply voltage.

Meanwhile, a predetermined voltage is applied to the word lines WL0-WL2 (period T1). The address that selects the memory cell MC00 inputted during the period T1 is transmitted to the row decoder 2 and the column decoder 3 via the address latch circuit 9, and the word and bit lines are decoded in accordance with the inputted address. During the period, the address is not latched in the address latch circuit 9 because the clock signal is in the "H" state.

Next, when the clock signal falls, the address latch becomes valid, and the address that selects the memory cell MC00 is latched in the address latch circuit 9. Further, the charging bit line selecting line CH0 becomes nonselective, and the bit line selecting line YG0 is selected. Then, the voltage of the bit line BL0 further drops from the power-supply voltage by the function of the discharging circuit in the sense amplifier 16.

Next, the selecting transistor control line GL0 is selected and the selecting transistors TL0-TL2 are turned on, and the bit line BL0 and the source line SL are thereby connected to each other via the memory cell MC00. At the time, the cell current in accordance with the data stored in the memory cell MC00 flows in the bit line BL0, which changes the voltage of the bit line BL0. The cell current or the voltage of the bit line is compared to the reference 17 in the sense amplifier 16 so that the data is decided to be "0" or "1". Then, the read data showing the determination result is outputted from the data output terminal Dout (period T2).

As the bit line selecting lines YG1-YG3 are in the nonselective state during the period T2, the bit lines BL1-BL3 are not discharged through the discharging circuit in the sense amplifier 16. Further, at the time, the selecting transistor control line GL0 is selected so that the selecting transistors TL01 and TL02 are also turned on. However, the voltages of the bit lines BL1 and BL2 are maintained to be the power-supply voltage because the voltage of the source line SL is the power-supply voltage. Further, the charging bit line selecting lines CH1-CH3 are selected at the time. In other words, the voltages of the bit lines BL1-BL3 are maintained to be the power-supply voltage during the period T2.

Further, the address that selects the memory cell MC01 is inputted while the data in the memory cell MC00 is being read during the period T2. During the period T2, the address retained in the address latch circuit 9 (address that selects the memory cell MC00) is valid because the clock signal is in the "L" state. Therefore, the selection of the word lines and bit lines is not immediately switched by the address that selects the memory cell MC01 inputted from the address signal AD. The address that selects the memory cell MC01 is transmitted to the address determination circuit 8 and compared to the select address of the memory cell MC00 retained in the address latch circuit 9. The comparison is carried out based on the determination whether or not the bit line used in the current reading operation and the bit line used in the next reading operation are the same. The bit line BL1 is used for reading the data in the memory cell MC01 in the case where the selecting transistor TL01 is selected. Because the used bit line BL1 is different from the bit line BL0 used in the reading operation with respect to the memory cell MC00, the determination result by the address determination circuit 8 shows the inconsistency. When the address determination signal AJ shows the inconsistency, the selecting transistor control line and the bit line selecting line are not counterchanged, and the selecting transistor control line GL0 and the bit line selecting line YG1 are used in the reading operation with respect to the memory cell MC01.

Next, when the reading operation with respect to the memory cell MC00 is completed and the clock signal rises, the address latch is released and the word lines and bit lines are decoded in the row decoder 2 and the column decoder 3 in accordance with the address that selects the memory cell MC01 and the address determination signal AJ. Further, the selecting transistor control line GL0 becomes nonselective so that the selecting transistors TL00-TL02 are turned off and the charging bit line selecting line CH0 is selected. As a result, the voltage of the bit line BL0 is reset to the power-supply voltage (period T3).

During the period T3, after the address decoding in the row decoder 2 and the column decoder 3 is completed, the data in the memory cell MC01 is read before the reset of the voltage of the bit line BL0 is completed. When the data in the memory cell MC01 is read, first, the clock signal falls, and then, the address that selects the memory cell MC01 is latched in the address latch circuit 9 and the charging bit line selecting line CH1 becomes nonselective. Accordingly, the selecting transistors GL00-TL02 are turned on by selecting the selecting transistor control line GL0.

Further, during the period T3, the bit line selecting line YG1 is selected, and the voltage of the bit line BL1 further drops from the power-supply voltage by the discharging circuit in the sense amplifier 16. At the time, the cell current in accordance with the data stored in the memory cell MC01 flows in the bit line BL1, and the voltage of the bit line BL1 thereby changes. The cell current or the voltage of the bit line is compared to the reference 17 in the sense amplifier 16 so that the data is decided to be "0" or "1". The read data showing the determination result is outputted from the data output terminal Dout.

Meanwhile, while the data in the memory cell MC01 is being read, the reset of the voltage of the bit line BL0 is completed, and the voltage of the bit line BL0 is set to the power-supply voltage. Further, while the data in the memory cell MC01 is being read, the address that selects the memory cell MC11 is inputted. In a manner similar to the reading operation with respect to the memory cell MC00, the address that selects the memory cell MC11 is compared to the select address of the memory cell MC01 retained in the address latch circuit 9. The bit line BL1 is used for reading the data in the memory cell MC11 in the state where the selecting transistor TL11 is selected, and the bit line is the same as the bit line BL1 used in the reading operation with respect to the memory cell MC01. Therefore, the determination result by the address determination circuit 8 shows the consistency. At the time, the selecting transistor control line and the bit line selecting line are counterchanged, and consequently, the selecting transistor control line GR1 and the bit line selecting line YG2 are used when the data in the memory cell MC11 is read.

When the reading operation with respect to the memory cell MC01 is completed and the clock signal rises, the address latch is released, and the word lines and bit lines are decoded in the row decoder 2 and the column decoder 3 in accordance with the select address of the memory cell MC11 and the address determination signal AJ. Further, the selecting transistor control line GL0 becomes nonselective, the selecting transistors TL00-TS02 are turned off, and the charging bit line selecting line CH1 is selected. As a result, the voltage of the bit line BL1 is reset to the power-supply voltage.

Next, while the voltage of the bit line BL1 is being reset, the data in the memory cell MC11 is read. In the reading operation with respect to the memory cell MC11, firsts the clock signal falls, and the select address of the memory cell MC11 is latched in the address latch circuit 9. Then, the charging bit line selecting line CH2 becomes nonselective and the selecting transistor control line GR1 is selected so that the selecting transistors TR10-TR12 are turned on. Further, the bit line selecting line YG2 is selected, and the voltage of the bit line BL2 further drops from the power-supply voltage by the function of the discharging circuit in the sense amplifier 16. At the time, the cell current in accordance with the data stored in the memory cell MC11 flows in the bit line BL2, and the voltage of the bit line BL2 thereby changes. The cell current or the voltage of the bit line is compared to the reference 17 in the sense amplifier 16 so that the data is decided to be "0" or "1". Then, the read data showing the determination result is outputted from the data output terminal Dout. Because the bit line BL2 is used in the reading operation with respect to the memory cell MC11, the data in the memory cell MC11 can be read even during resetting the voltage of the bit line BL1.

Next, while the data is being read from the memory cell MC11, the address that selects the memory cell MC22 is inputted. In a manner similar to the foregoing description, the select address of the memory cell MC22 is compared to the select address of the memory cell MC11 retained in the address latch circuit 9. In the state where the selecting transistor TR22 is selected, the bit line BL3 is used in the reading operation with respect to the memory cell MC22. The bit line BL3 is different from the bit line BL2 used in the reading operation with respect to the memory cell MC11, and the determination result by the address determination circuit 8 shows the inconsistency. Therefore, the selecting transistor control line and the bit line selecting line are not switched, and the selecting transistor control line GR2 and the bit line selecting line YG3 are used in the reading operation of the memory cell MC22.

When the reading operation with respect to the memory cell MC11 is completed and the clock signal rises, the address latch is released, and the word lines and bit lines are decoded in the row decoder 2 and the column decoder 3 in accordance with the address that selects the memory cell MC11 and the address determination signal AJ. Further, the selecting transistor control line GR1 becomes nonselective so that the selecting transistors TL10-TL12 are turned off, the charging bit line selecting line CH2 is selected and the voltage of the bit line BL2 is reset to the power-supply voltage. As a result, while the voltage of the bit line BL2 is resetting, the data in the memory cell MC22 is read via the bit line BL3 while the voltage of the bit line BL2 is being reset.

And then, when the clock signal falls, the select address of the memory cell MC22 is latched in the address latch circuit 9, the charging bit line selecting line CH3 becomes nonselective, and the selecting transistor control line GR2 is selected. As a result, the selecting transistors TR20-TR22 are turned on. Further, the bit line selecting line YG3 is selected, and the voltage of the bit line BL3 further drops from the power-supply voltage by the function of the discharging circuit in the sense amplifier 16. At the time, the cell current in accordance with the data stored in the memory cell MC22 flows in the bit line BL3, and the voltage of the bit line BL3 thereby changes. The cell current or the voltage of the bit line is compared to the reference 17 in the sense amplifier 16 so that the data is decided to be "0" or "1". Then, the read data showing the determination result is outputted from the data output terminal Dout.

As described above, the selecting transistor control lines GL and GR and the bit line selecting line YG are switched over by the determination signal of the address determination circuit 8 so that the bit line used in the reading operations is switched. Thereby, the data in the next cell can be read while the voltage of the bit line is being reset after the reading operation. As a result, the data can be randomly read at a high speed.

In the aforementioned description of the preferred embodiment 1, though the Pch transistor constitutes the selecting transistor 12, bit line selecting transistor 13 and charging bit line selecting transistor 14 shown in FIG. 7, and one Pch non-volatile memory cell constitutes the memory cell array 1a, at least two of Pch non-volatile memory cells may constitute the memory cell array 1a. The structure of the memory cell is not particularly limited, and an NOR structure may be adopted. Furthermore, the present preferred embodiment is not limited to the Pch non-volatile memory cell and at least one of depression non-volatile memory can be applied. More specifically, the present preferred embodiment can be applied to a semiconductor memory device comprising memory cells in which it is unnecessary to pre-charge the voltage of the bit line to a predetermined voltage before the reading operation.

Such a semiconductor memory device can also randomly read data at a high speed in a similar operation.

Preferred Embodiment 2

Figure 10:
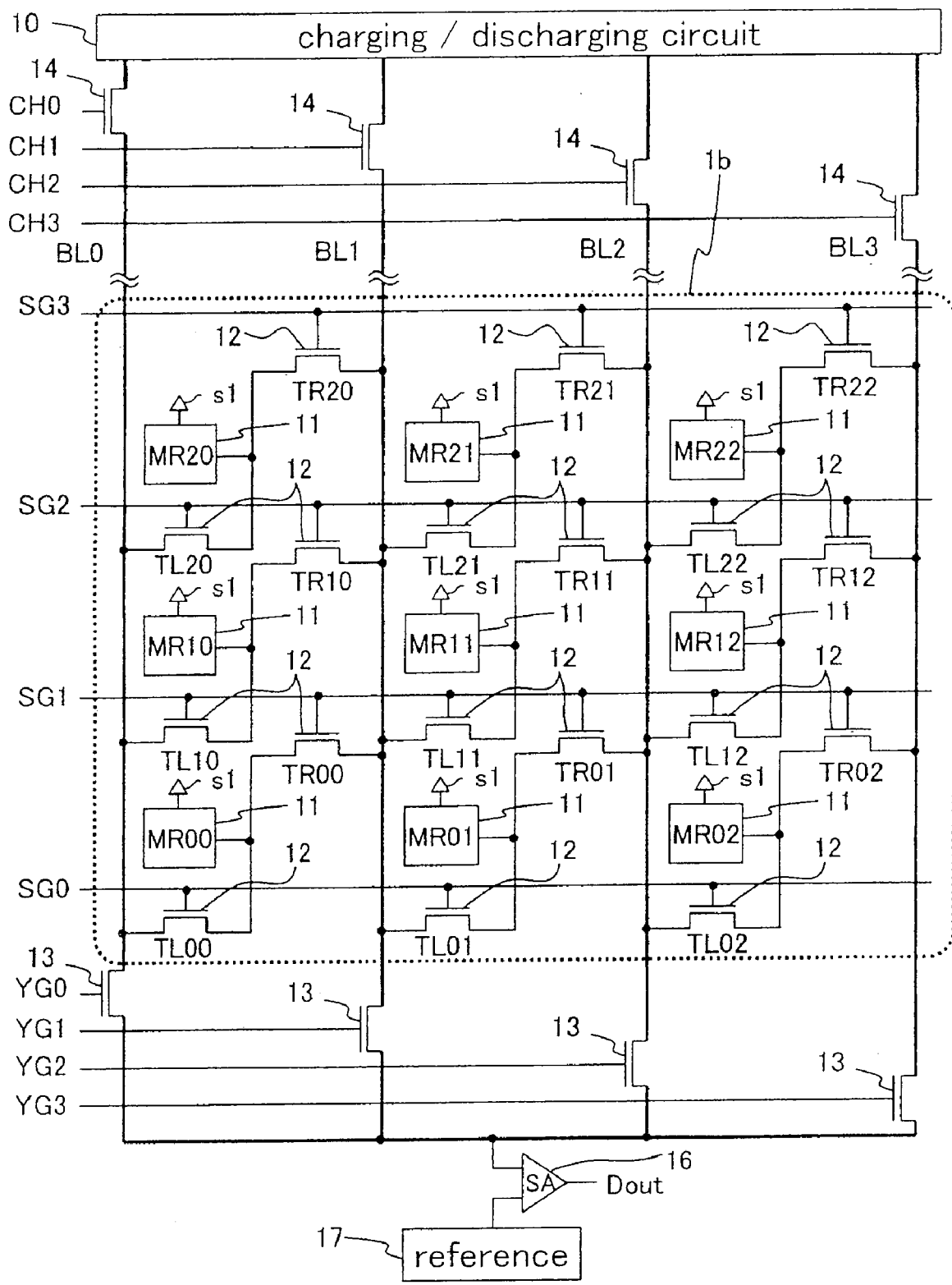
FIG. 10 shows a schematic circuit configuration of a memory cell array according to a preferred embodiment 2 of the present invention.

An object of a preferred embodiment 2 of the present invention is to reduce the number of the control lines by sharing the selecting transistor control lines. FIG. 10 shows a schematic plan structure of a memory cell array according to the preferred embodiment 2. As shown in FIG. 10, a semiconductor memory device according to the present preferred embodiment comprises a memory cell array 1b comprising memory cells with source terminals s1. Two selecting transistors TL [n, m] and TR [n, m] (n≧0, m≧0) are connected to a first terminal of a memory cell MR [n, m]. The selecting transistors TL [n, m] are connected to first bit lines BL [m], and the selecting transistors TR [n, m] are connected to second bit lines BL [m+1]. The respective bit lines BL [m] are connected to an end of a sense amplifier 16 via bit line selecting transistors 13 controlled by bit line selecting lines YG [m]. The respective bit lines BL [m] are connected to a charging/discharging circuit 10 via charging bit line selecting transistors 14 controlled by charging bit line selecting lines CH [m]. The selecting transistors TL [n, m] and TR [n, m] are controlled through selecting transistor control lines SG [n] and SG [n+1]. A reference 17 is connected to another end of the sense amplifier 16. The charging/discharging circuit 10 precharges and resets voltages of the bit lines BL0-BL3.

There is no particular limitation to the present preferred embodiment, however, at least one of Pch non-volatile memory or depression non-volatile memory capable of controlling only the selected word line can be applied to the memory cell 11 shown in FIG. 10. More specifically, a memory cell in which it is unnecessary to pre-charge the voltage of the bit line to a predetermined voltage before the reading operation can be adopted as the memory cell 11. Further, there is no particular limitation to a type of the memory cell 11, to which any of NOR, NAND and AND memory cells is applicable. The memory cell array 1b may have a structure wherein the memory cells are connected to the source and bit lines.

Figure 11:
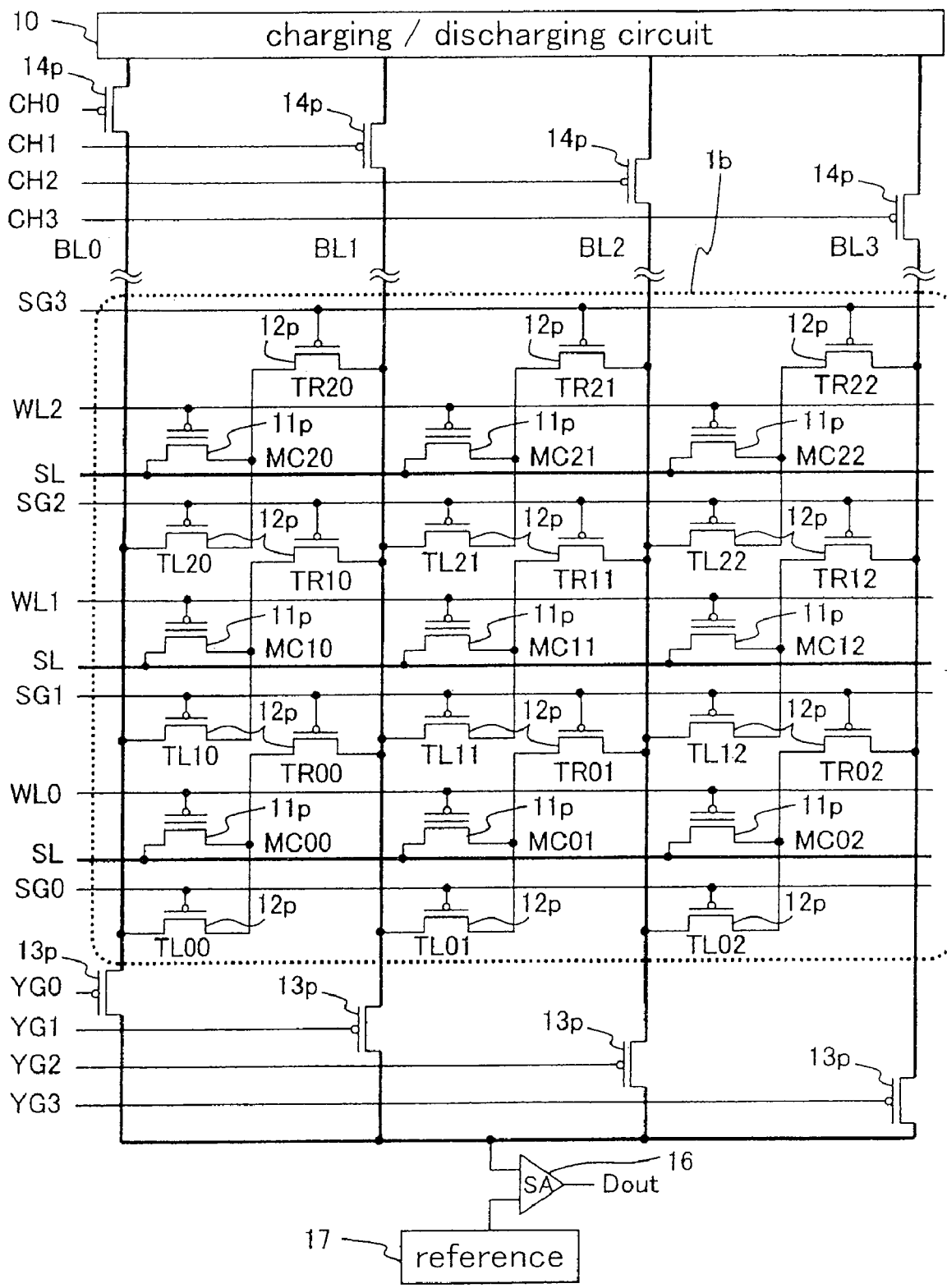
FIG. 11 shows a frame format of the circuit configuration according to the preferred embodiment 2.

In FIG. 11, the constitution shown in FIG. 10 is developed in such a manner that Pch non-volatile memory cells 11p are applied to the memory cells 11. In the drawing, a Pch transistor constitutes a selecting transistor 12p, a bit line selecting transistor 13p and a charging bit line selecting transistor 14p. The memory cell array 1b comprises at least one of Pch memory cell 11p. Memory cells MC00-MC02 are controlled through a single word line WL0 in a lateral direction. Memory cells MC10-MC12 are controlled through a single word line WL1 in a lateral direction. Memory cells MC20-MC22 are controlled through a single word line WL2 in a lateral direction. One ends of the memory cells 11p are respectively connected to the bit lines BL0-BL3 via the two selecting transistors TL and TR. Another ends of the memory cells 11p are connected to a common source line SL. The bit lines Bl0-BL3 are connected to one end of the common sense amplifier 16 via the bit line selecting transistors 13p. The bit line selecting transistors 13p are respectively controlled through the bit line selecting lines YG0-YG3. The sense amplifier 16 comprises a circuit for discharging the voltage of the bit line. Another end of the sense amplifier 16 is connected to the reference 17. A result of comparison of the contents of the memory cells 11p to the reference 17 in the sense amplifier 16 is outputted from a data output terminal Dout which is an output terminal of the sense amplifier 16.

Furthermore, the reference 17 may be any of a current source, a memory cell and a transistor capable of outputting an intermediate current between a cell current of the memory cell which retains "1" data and a cell current of the memory cell 11p which retains "0" data. The reference 17 may be a voltage source having an intermediate voltage between the bit-line voltage in the reading operation with respect to the memory cell 11p retaining the "1" data and the bit-line voltage in the reading operation with respect to the memory cell 11p retaining the "0" data. Further, the reference 17 may be configured in such a manner that two selecting transistors are connected to one end of the reference cell or memory cell and the two selecting transistors are alternately switched over every time when the data is read from the memory cell so that they can be connected to the different bit lines in the same manner as the configuration of the memory cells described earlier. Like this, there is no special limitation to the reference 17 as far as it serves as a comparison reference for deciding the data of the memory cells 11p by the sense amplifier 16.

The bit lines BL0-BL3 are connected respectively to the charging/discharging circuit 10 via the charging bit line selecting transistors 14p. The charging bit line selecting transistors 14p are respectively controlled through the charging bit line selecting lines CH0-CH3. When the voltages of the bit lines BL0-BL3 are set to a predetermined voltage, the charging bit line selecting transistors 14p are selected. The charging/discharging circuit 10 has a function of pre-charging the bit-line voltage to the predetermined voltage.

A reading operation with respect to the Pch memory cell 11p is carried out as below. In a reading mode, the voltage of the source line SL and the voltages of all of the bit lines are set to a power-supply voltage, a predetermined voltage (for example, 1V) is applied to the selected word line, and the power-supply voltage is applied to the nonselective word line. When the clock signal falls, the selecting transistor 12p, bit line selecting transistor 13p and word line in accordance with the inputted address are selected. Accordingly, the voltage of the selected bit line further drops from the power-supply voltage by function of a discharging circuit provided in the sense amplifier 16. At the time, the cell current in accordance with the data stored in the selected memory cell 11p flows in the selected bit line, and the voltage of the selected bit line thereby changes. The cell current or the voltage of the selected bit line is compared to the reference 17 in the sense amplifier 16 so that the data is decided to be "0" or "1".

Figure 12:
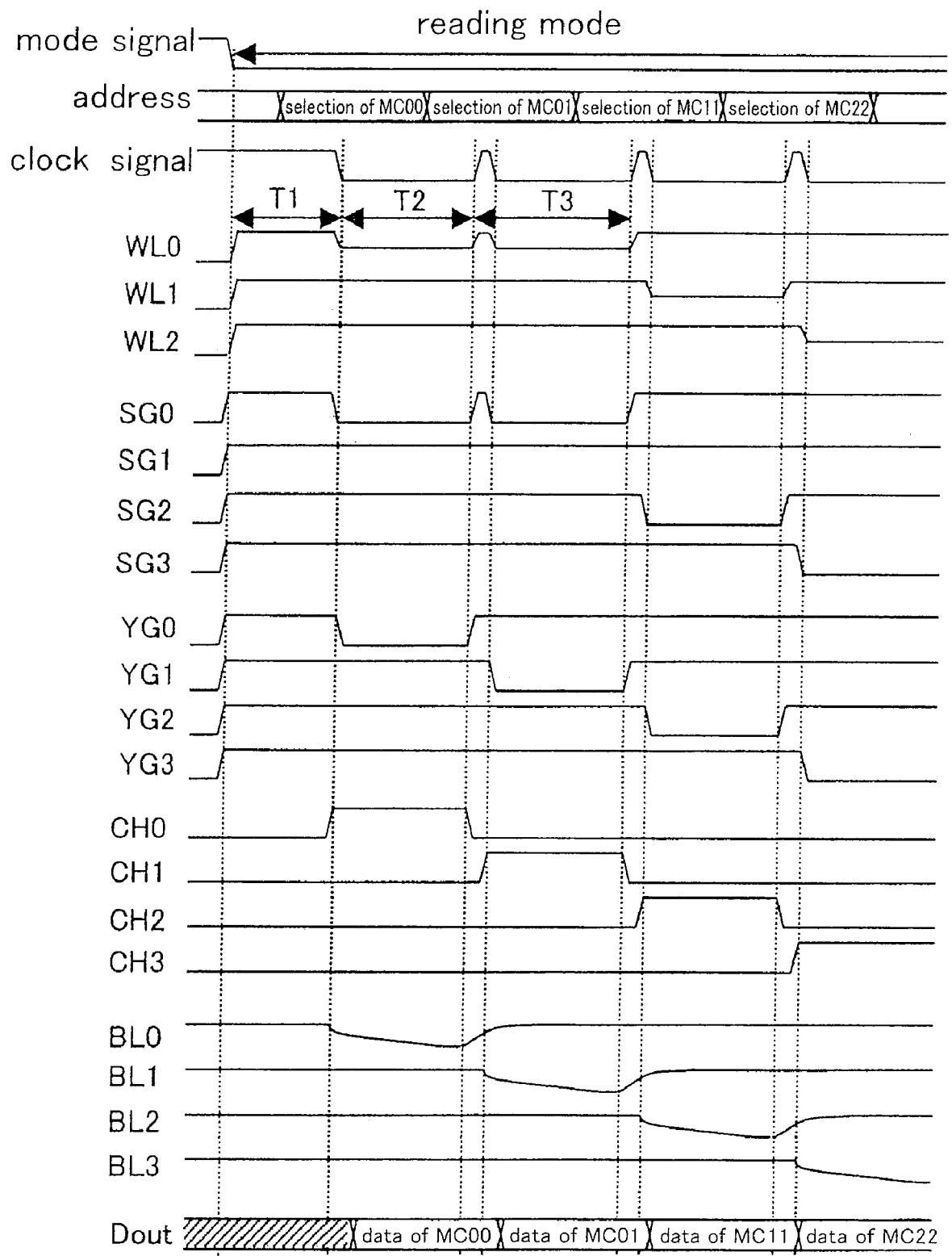
FIG. 12 is a time chart in a reading operation in the circuit shown in FIG. 11.

FIG. 12 shows timings of voltage variations in the respective wirings when the data in the memory cells MC00, MC01, MC11 and MC22 is sequentially read as an example of the random reading operation in the circuit configuration shown in FIG. 11. A description is given below provided that the address latch control signal AL is regarded as the clock signal and the address determination signal reset signal RAJ is regarded as the mode signal in the address determination circuit 8 shown in FIG. 2. The description is further given based on the assumption that the address determination signal control signal CAJ shifts to the "H" state and the address determination signal AJ becomes valid before the address latch is released after the comparison of the address signals is carried out as shown in the signal timings of FIG. 3. In FIG. 12, the variation timing of the address determination signal control signal CAJ is omitted.

When the operation shifts to the reading mode based on the mode signal (address determination signal reset signal RAJ), the output of the address determination circuit 8 is reset and shifts to the "L" state. Further, the voltage of the source line SL is set to the power-supply voltage and the charging bit line selecting lines CH0-CH3 are all selected by the time when the address that selects the memory cell MC00 is inputted. As a result, the voltages of all of the bit lines BL0-BL3 are charged to the power-supply voltage.

Meanwhile, the power-supply voltage is applied to the word lines WL0-WL2 (period T1). The address that selects the memory cell MC00 inputted during the period T1 is transmitted to the row decoder 2 and the column decoder 3 via the address latch circuit 9, and the word lines and bit lines in accordance with the inputted address are decoded. During the period, the address is not latched in the address latch circuit 9 because the clock signal is in the "H" state.

Next, when the clock signal falls, the address latch becomes valid, and the address that selects the memory cell MC00 is latched in the address latch circuit 9. A predetermined voltage is applied to the word line WL0, the charging bit line selecting line CH0 becomes nonselective, and the bit line selecting line YG0 is selected. Then, the voltage of the bit line BL0 further drops from the power-supply voltage by the function of the discharging circuit in the sense amplifier 16.

Next, the selecting transistor control line SG0 is selected and the selecting transistors TL0-TL2 are turned on, and the bit line BL0 and the source line SL are thereby connected to each other via the memory cell MC00. At the time, the cell current in accordance with the data stored in the memory cell MC00 flows in the bit line BL0, which changes the voltage of the bit line BL0. The cell current or the voltage of the bit line is compared to the reference 17 in the sense amplifier 16 so that the data is decided to be "0" or "1". Then, the read data showing the determination result is outputted from the data output terminal Dout (period T2).

During the period T2, the bit line selecting lines YG1-YG3 are in the nonselective state. Therefore, the bit lines BL1-BL3 are not discharged through the discharging circuit in the sense amplifier 16. Further, at the time, the selecting transistor control line SG0 is selected so that the selecting transistors TL01 and TL02 are also turned on. However, the voltages of the bit lines BL1 and BL2 are maintained to be the power-supply voltage because the voltage of the source line SL is the power-supply voltage. Further, the charging bit line selecting lines CH1-CH3 are selected at the time. In other words, the bit lines BL1-BL3 maintain the power-supply voltage during the period T2.

Further, the address that selects the memory cell MC01 is inputted while the data in the memory cell MC00 is being read during the period T2. The address retained in the address latch circuit 9 (select address of the memory cell MC00) is valid because the clock signal is in the "L" state during the period T2. Therefore, the selection of the word lines and bit lines is not immediately switched over by the select address of the memory cell MC01 inputted from the address signal AD. The select address of the memory cell MC01 is transmitted to the address determination circuit 8 and compared to the select address of the memory cell MC00 retained in the address latch circuit 9. The comparison is carried out based on the determination whether or not the bit line used in the current reading operation and the bit line used in the next reading operation are the same. When the data in the memory cell MC01 is read, the bit line BL1 is used in the case where the selecting transistor TL01 is selected. Because the bit line BL1 is different from the bit line BL0 used in the reading operation with respect to the memory cell MC00, the determination result by the address determination circuit 8 shows the inconsistency. When the address determination signal AJ shows the inconsistency, the selecting transistor control line and the bit line selecting line are not switched over, and the selecting transistor control line SG0 and the bit line selecting line YG1 are used in the reading operation with respect to the memory cell MC01.

Next, when the reading operation with respect to the memory cell MC00 is completed and the clock signal rises, the address latch is released, and the word lines and bit lines are decoded in the row decoder 2 and the column decoder 3 in accordance with the address that selects the memory cell MC01 and the address determination signal AJ. Further, the selecting transistor control line SG0 becomes nonselective since the word line WL0 becomes nonselective. Then, the selecting transistors TL00-TL02 are turned off, and the charging bit line selecting line CH0 is selected. As a result, the voltage of the bit line BL0 is reset to the power-supply voltage (period T3).

During the period T3, after the address decoding in the row decoder 2 and the column decoder 3 is completed, the data in the memory cell MC01 is read before the reset of the voltage of the bit line BL0 is completed. When the data in the memory cell MC01 is read, first, the clock signal falls, and the select address of the memory cell MC01 is latched in the address latch circuit 9. Then, the word line WL0 is selected, and the charging bit line selecting line CH1 becomes nonselective. As a result, the bit line selecting line YG1 is selected.

Further, when the selecting transistor control line SG0 is selected and the selecting transistors TL0-TL2 are turned on, the voltage of the bit line BL1 further drops from the power-supply voltage by the function of the discharging circuit in the sense amplifier 16. At the time, the cell current in accordance with the data stored in the memory cell MC01 flows in the bit line BL1, and the voltage of the bit line BL1 thereby changes. The cell current or the voltage of the bit line is compared to the reference 17 in the sense amplifier 16 so that the data is decided to be "0" or "1". The read data showing the determination result is outputted from the data output terminal Dout.

Meanwhile, while the data in the memory cell MC01 is being read, the reset of the voltage of the bit line BL0 is completed, and the voltage of the bit line BL0 is set to the power-supply voltage. Further, while the data in the memory cell MC01 is being read, the address that selects the memory cell MC11 is inputted. In a manner similar to the reading operation with respect to the memory cell MC00, the select address of the memory cell MC11 is compared to the select address of the memory cell MC01 retained in the address latch circuit 9. When the data in the memory cell MC11 is read in the state where the selecting transistor TL11 is selected, the bit line BL1 is used, which is the same as the bit line BL1 used in the reading operation with respect to the memory cell MC01. Therefore, the determination result by the address determination circuit 8 shows the consistency. At the time, the selecting transistor control line and the bit line selecting line are changed over, and as a result, the selecting transistor control line SG2 and the bit line selecting line YG2 are used in the reading operation of the memory cell MC11.

When the reading operation with respect to the memory cell MC01 is completed and the clock signal rises, the address latch is released, and the word lines and bit lines are decoded in the row decoder 2 and the column decoder 3 in accordance with the address that selects the memory cell MC11 and the address determination signal AJ. Further, the selecting transistor control line SG0 becomes nonselective, the selecting transistors TL00-TS02 are turned off, and the charging bit line selecting line CH1 is selected. As a result, the voltage of the bit line BL1 is reset to the power-supply voltage.

Next, while the voltage of the bit line BL1 is being reset, the data in the memory cell MC11 is read. In the reading operation with respect to the memory cell MC11, first, the clock signal falls, and the select address of the memory cell MC11 is latched in the address latch circuit 9. Then, the word line WL1 is selected, the charging bit line selecting line CH2 becomes nonselective, and the selecting transistor control line SG2 is selected. As a result, the selecting transistors TL20-TL22 and TR10-TR12 are turned on. Further, the bit line selecting line YG2 is selected, and the voltage of the bit line BL2 further drops from the power-supply voltage by the function of the discharging circuit in the sense amplifier 16. At the time, the cell current in accordance with the data stored in the memory cell MC11 flows in the bit line BL2, and the voltage of the bit line BL2 thereby changes. The cell current or the voltage of the bit line is compared to the reference 17 in the sense amplifier 16 so that the data is decided to be "0" or "1". Then, the read data showing the determination result is outputted from the data output terminal Dout. Because the bit line BL2 is used in the reading operation with respect to the memory cell MC11, the data in the memory cell MC11 can be read even during the period when the voltage of the bit line BL1 is being reset.

During the period when the data is read from the memory cell MC11 as described above, as the bit line selecting lines YG0, YG1 and YG3 are in the nonselective state, the bit lines BL0, BL1 and BL3 are not discharged by the function of the discharging circuit in the sense amplifier 16. Further, the selecting transistor control line SG2 is selected so that the selecting transistors TL20-TL22 and TR10-TR12 are turned on. However, the voltages of the bit lines BL1 and BL3 are not changed by the memory cells MC10 and MC12 and maintain the power-supply voltage because the voltage of the source line SL is the power-supply voltage.

Meanwhile, there is no flow of the cell current from the memory cell MC22 even if the selecting transistor TL22 is turned on because the word line WL2 is in the nonselective state. Therefore, the voltage of the bit line BL2 used in the reading operation with respect to the memory cell MC11 is not thereby affected. Further, the charging bit line selecting lines CH0, CH1 and CH3 are selected, and the bit lines BL0, BL1 and BL3 maintain the power-supply voltage during the period when the data in the memory cell MC11 is read. Therefore, the bit line BL2 and the power-supply voltage are not short-circuited.

Next, while the data is being read from the memory cell MC11, the address that selects the memory cell MC22 is inputted. In a manner similar to the foregoing description, the select address of the memory cell MC22 is compared to the select address of the memory cell MC11 retained in the address latch circuit 9. In the state where the selecting transistor TR22 is selected, the bit line BL3 is used in the reading operation with respect to the memory cell MC22. The bit line BL3 is different from the bit line BL2 used in the reading operation with respect to the memory cell MC11, and therefore, the determination result by the address determination circuit 8 shows the inconsistency. Accordingly, the selecting transistor control line and the bit line selecting line are not changed over, and the selecting transistor control line SG3 and the bit line selecting line YG3 are used when the data is read from the memory cell MC22.

When the reading operation with respect to the memory cell MC11 is completed and the clock signal rises, the address latch is released, and the word lines and bit lines are decoded in the row decoder 2 and the column decoder 3 in accordance with the address that selects the memory cell MC11 and the address determination signal AJ. Further, the word line WL1 becomes nonselective and the selecting transistor control line SG1 also becomes nonselective. Then, the selecting transistors TL20-TL22 and TR10-TR12 are turned off, and the charging bit line selecting line CH2 is selected. Accordingly, the voltage of the bit line BL2 is reset to the power-supply voltage. The data in the memory cell MC22 is read via the bit line BL3 while the voltage of the bit line BL2 is being reset. When the clock signal falls, the select address of the memory cell MC22 is latched in the address latch circuit 9, and then, the charging bit line selecting line CH3 becomes nonselective and the selecting transistor control line SG2 is selected. As a result, the selecting transistors TR20-TR22 are turned on. Further, the bit line selecting line YG3 is selected, and the voltage of the bit line BL3 further drops from the power-supply voltage by the function of the discharging circuit in the sense amplifier 16. At the time, the cell current in accordance with the data stored in the memory cell MC22 flows in the bit line BL3, and the voltage of the bit line BL3 thereby changes. The cell current or the voltage of the bit line is compared to the reference 17 in the sense amplifier 16 so that the data is decided to be "0" or "1". Then, the read data showing the determination result is outputted from the data output terminal Dout.

As described above, the selecting transistor control lines SG2 [n] and SG [N+1] ($n \geq 0$) and the bit line selecting line YG [m] ($m \geq 0$) are switched over by the determination signal of the address determination circuit 8. Thereby, the data in the next cell can be read while the voltage of the bit line after the reading operation is being reset, and the data can be randomly read at a high speed.

Additionally, the selecting transistors TL [n+1, m] and TR [n, m] ($n \geq 0, m \geq 0$) are commonly controlled by the selecting transistor control line SG [n+1] so that the number of the control lines can be reduced in comparison to the preferred embodiment 1.

In the foregoing description of the preferred embodiment 2, the Pch transistor constitutes the selecting transistor 12, bit line selecting transistor 13 and charging bit line selecting transistor 14 shown in FIG. 10, and one Pch non-volatile memory cell constitutes the memory cell 11, however, at least two Pch non-volatile memory cells may constitute the memory cell 11. The structure of the memory cell is not particularly limited, and, for example, the NOR structure may be adopted. The present preferred embodiment is not limited to the Pch non-volatile memory cell as described earlier, and even at least one of depression non-volatile memory controllable by only the selected word line, can be applied. More specifically, the present preferred embodiment can be applied to a semiconductor memory device comprising memory cells controllable by only the selected word line in which it is unnecessary to pre-charge the voltage of the bit line to a predetermined voltage before the reading operation. Such a semiconductor memory device can also randomly read data at a high speed in a similar operation.

Preferred Embodiment 3

FIG. 13 shows a schematic plan structure of a memory cell array according to a preferred embodiment 3 of the present invention. As shown in FIG. 13, a semiconductor memory device according to the present preferred embodiment has a memory cell array 1c comprising memory cells with source terminals s1. Two selecting transistors TL [n, m] and TR [n, m] ($n \geq 0, m \geq 0$) are connected to a first terminal of a memory cell MR [n, m]. The selecting transistors TL [n, m] are connected to first bit lines BL [m], and the selecting transistors TR [n, m] are connected to second bit lines BL [m+1]. The selecting transistors TL [n+1, m], TR [n+1, m], TL [n, m+1] and TR [n, m+1] are controlled by the selecting transistor control lines GL [n+1] and GR [n+1]. For example, the selecting transistor control line GL1 controls the selecting transistors TL10, TL01 and TL12, and the selecting transistor control line GR1 controls the selecting transistors TR10, TR01 and TR12. An end of a sense amplifier 16 is connected to the respective bit lines BL [m] via bit line selecting transistors 13 controlled by bit line selecting lines YG [m]. A reference 17 is connected to another end of the sense amplifier 16. The respective bit lines BL [m] are connected to a charging/discharging circuit 10 via charging bit line selecting transistors 14a controlled by charging bit line selecting lines CH [m] and reset bit line selecting transistors 14b controlled by reset bit line selecting lines RS [m]. The charging/discharging circuit 10 pre-charges and resets voltages of the bit lines BL [m]. When the voltage of the bit line BL [m] is set to a predetermined voltage, the charging bit line selecting transistor 14a is selected. When the voltage of the bit line [M] is reset, the reset bit line selecting transistor 14b is selected.

There is no particular limitation to the present preferred embodiment, however, at least one of capacitor, depression non-volatile memory, Nch non-volatile memory, Pch non-volatile memory or resistance-variable non-volatile memory (RRAM), which are controllable by only the selected word line, can be applied to the memory cell array 1c shown in FIG. 13. In other words, any memory cell capable of storing "0" and "1" data can be adopted as the memory cell 11. Further, there is no particular limitation to a type of the memory cell 11, to which any of NOR, NAND and AND memory cells is applicable. It is good that the memory cell array 1c is configured in such a manner that the memory cells are connected to the source and bit lines.

Figure 14:
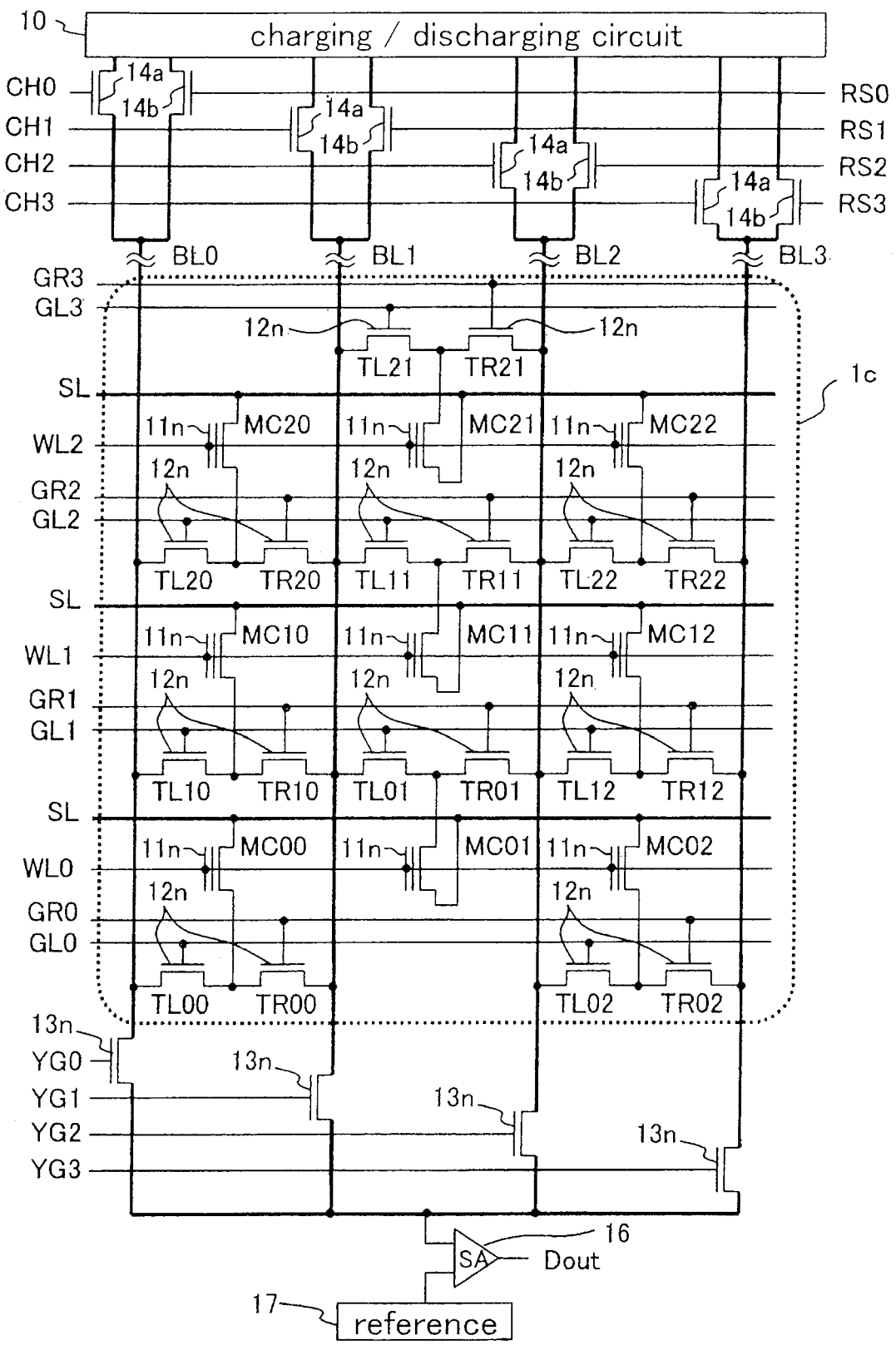
FIG. 14 shows a frame format of the circuit configuration according to the preferred embodiment 3.

In FIG. 14, the constitution shown in FIG. 13 is developed in such a manner that Nch non-volatile memory cells 11n are applied to the memory cells 11. In the drawing, an Nch transistor constitutes a selecting transistor 12n, a bit line selecting transistor 13n, a charging bit line selecting transistor 14a, and a reset bit line selecting transistor 14b. The memory cell array 1c consists of at least one of Nch memory cell 11n. Memory cells MC00-MC02 are controlled through a single word line WL0 in a lateral direction. Memory cells MC10-MC12 are controlled through a single word line WL1 in a lateral direction. Memory cells MC20-MC22 are through a single word line WL2 in a lateral direction. One ends of the memory cells 11n are respectively connected to the bit lines BL0-BL3 via the two selecting transistors TL and TR. Another ends of the memory cells 11n are connected to a common source line SL. The bit lines Bl0-BL3 are connected to one end of the common sense amplifier 16 via the bit line selecting transistors 13n respectively controlled by the bit line selecting lines YG0-YG3. Another end of the sense amplifier 16 is connected to the reference 17. A result of comparison of the contents of the memory cells 11n to the reference 17 in the sense amplifier 16 is outputted from a data output terminal Dout which is an output terminal of the sense amplifier 16.

The reference 17 may be any of a current source, a memory cell and a transistor capable of outputting an intermediate current between a cell current of the memory cell 11n which retains "1" data and a cell current of the memory cell 11n which retains "0" data. The reference 17 may be a voltage source having an intermediate voltage between the bit-line voltage in the reading operation with respect to the memory cell 11n retaining the "1" data and the bit-line voltage in the reading operation with respect to the memory cell 11n retaining the "0" data. Further, the reference 17 may be configured in such a manner that two selecting transistors are connected to one end of the reference cell or memory cell and the two selecting transistors are alternately switched over every time when the data is read from the memory cell so that they can be connected to the different bit lines in the same manner as the configuration of the memory cells described earlier. Like this, structure of the reference 17 is not specially limited and it is good that it serves as a comparison reference when the data of the memory cells 11n are decided through the sense amplifier 16.

The bit lines BL0-BL3 are connected respectively to the charging/discharging circuit 10 via the charging bit line selecting transistors 14a and the reset bit line selecting transistors 14b. The charging bit line selecting transistors 14a are respectively controlled through the charging bit line selecting lines CH0-CH3. The reset bit line selecting transistors 14b are respectively controlled by the reset bit line selecting lines RS0-RS3. When the voltages of the bit lines BL0-BL3 are set to a predetermined voltage, the charging bit line selecting transistors 14a are selected. When the voltages of the bit lines BL0-BL3 are reset to a predetermined voltage, the reset bit line selecting transistors 14b are selected. The charging/discharging circuit 10 has a function of pre-charging the bit-line voltage to the predetermined voltage.

A reading operation with respect to the Nch memory cell 11n is carried out as below. In a reading mode, the voltage of the source line SL is set to the ground voltage (0V). When the address is inputted and the selected memory cell is determined, the voltage of the bit line for the reading operation is set to a predetermined voltage (for example, 3V) by the charging bit line selecting transistor 14a selected based on the inputted address.

Next, a predetermined voltage (for example, 3V) is applied to the word line connected to the selected memory cell in accordance with the inputted address, and the bite line selecting transistor 13n and the selecting transistor 12n are selected. At the time, the selected bit line is connected to the source line SL via the selected memory cell 11n. Therefore, the cell current in accordance with data stored in the selected memory cell. In flows in the selected bit line, and the voltage of the selected bit line thereby changes. The cell current or the voltage of the selected bit line is compared to the reference 17 in the sense amplifier 16 so that the data is decided to be "0" or "1".

Figure 15:
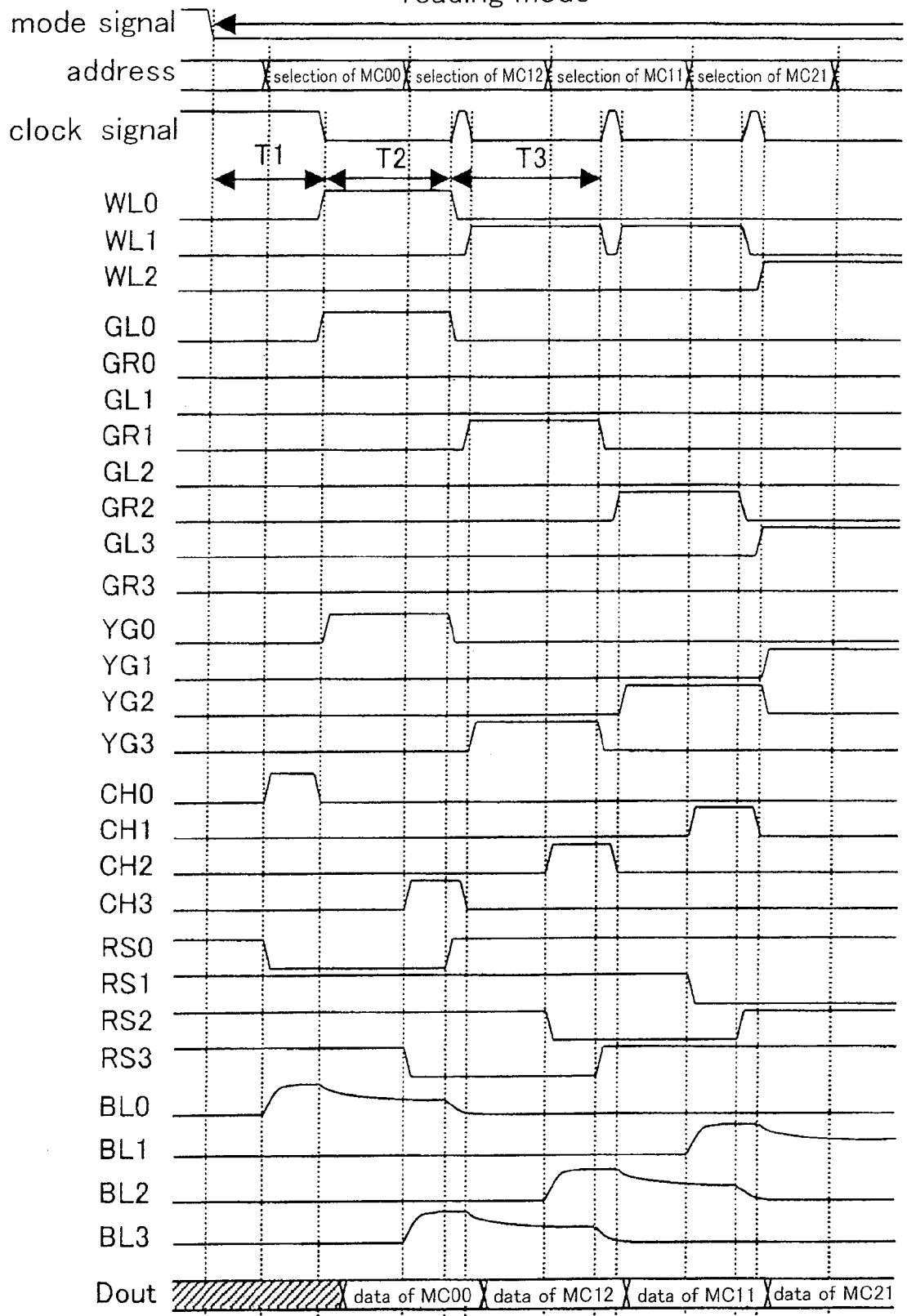
FIG. 15 is a time chart in a reading operation in the circuit shown in FIG. 14.

FIG. 15 shows timings of voltage variations in the respective wirings when the data in the memory cells MC00, MC12, MC11 and MC21 is sequentially read as an example of the random reading operation, in the circuit configuration shown in FIG. 14. A description is given here provided that the address latch control signal AL is regarded as the clock signal and the address determination signal reset signal RAJ is regarded as the mode signal by use of the address determination circuit 8' shown in FIG. 6. The description is further given based on the assumption that the address determination signal control signal CAJ shifts to the "H" state and the address determination signal AJ becomes valid by the time when the address latch is released after the address signals are compared as shown in the signal timings of FIG. 3. In FIG. 15, the variation timing of the address determination signal control signal CAJ is omitted.

When the operation shifts to the reading mode based on the mode signal (address determination signal reset signal RAJ), the output of the address determination circuit 8' is reset and shifts to the "L" state. Further, the voltage of the source line SL is set to the ground voltage and the reset bit line selecting lines RS0-RS3 are all selected by the time when the address that selects the memory cell MC00 is inputted. As a result, the voltages of all of the bit lines BL0-BL3 are set to the ground voltage.

Meanwhile, the ground voltage is applied to the word lines WL0-WL2 (period T1). The address that selects the memory cell MC00 inputted during the period T1 is transmitted to the row decoder 2 and the column decoder 3 via the address latch circuit 9, and the word lines and bit lines are decoded in accordance with the inputted address. During the period, the address is not latched in the address latch circuit 9 because the clock signal is in the "H" state. When the decoding of the bit line is completed, the reset bit line selecting line RS0 becomes nonselective, and the charging bit line selecting line CH0 is selected. As a result, the voltage of the bit line BL0 is pre-charged to a predetermined voltage.

Next, when the clock signal falls, the address latch becomes valid, and the address that selects the memory cell MC00 is latched in the address latch circuit 9. Further, a predetermined voltage is applied to the word line WL0, the charging bit line selecting line CH0 becomes nonselective, and the bit line selecting line YG0 is selected. Thereby, the sense amplifier 16 is connected to the bit line BL0. Further, the selecting transistor control line GL0 is selected so that the selecting transistors TL00 and TL02 are selected. At the time, the bit line BL0 is connected to the source line SL via the memory cell MC00, and the cell current in accordance with the data stored in the memory cell MC00 flows in the bit line BL0, which changes the voltage of the bit line BL0. The cell current or the voltage of the bit line is compared to the reference 17 in the sense amplifier 16 so that the data is decided to be "0" or "1", and the read data showing the determination result is outputted from the data output terminal Dout (period T2).

During period T2, the word line WL0 is selected so that the memory cells MC01 and MC02 are selected. However, the voltage of the bit lines BL1 is changed through the memory cell MC01 because the selecting transistor control line GL1 is not selected. Further, the selecting transistor TL02 is selected by selecting the selecting transistor control line GL0, and the bit line BL2 and the source line SL are connected to each other via the memory cell MC02. However, there is no current flow from the bit line BL2 to the source line SL because the reset bit line selecting line RS2 is selected. As a result, the voltage of the bit line BL2 is maintained to be the ground voltage.

During the period T2, the address that selects the memory cell MC12 is inputted while the data in the memory cell MC00 is being read. During the period T2, the clock signal is in the "L" state, and the address retained in the address latch circuit 9 (select address of the memory cell MC00) thereby becomes valid. Therefore, the selection of the word and bit lines is not immediately switched over by the select address of the memory cell MC12 inputted from the address signal AD. The select address of the memory cell MC12 is transmitted to the address determination circuit 8' and compared to the select address of the memory cell MC00 retained in the address latch circuit 9. The comparison is carried out when the bit line used in the current reading operation and the bit line used in the next reading operation are both even-numbered or odd-numbered. When the data in the memory cell MC12 is read, the bit line BL2 (even-numbered bit line) is used in the case where the selecting transistor TL12 is selected. Because the bit line BL2 is consistent with the bit line BL0 (even-numbered bit line) used in the reading operation with respect to the memory cell MC00. Therefore, the determination result by the address determination circuit 8' shows the consistency. When the address determination signal AJ shows the consistency, the selecting transistor control line and the bit line selecting line are switched over, and the selecting transistor control line GR1 and the bit line selecting line YG3 are used in the reading operation with respect to the memory cell MC12 so that the data is read via the bit line BL3.

The non-latched address and address-determination signal AJ are transmitted to the decoding circuit of the charging bit line selecting lines CH0-CH3 in the column decoder 3, and the charging bit line selecting line CH3 is selected, while the reset bit line selecting line RS3 becomes nonselective. As a result, the bit line BL3 is pre-charged. At the time, the reset bit line selecting line RS0, which is in the nonselective state in order to read the data from the memory cell MC00, remains nonselective.

Next, when the reading operation with respect to the memory cell MC00 is completed and the clock signal rises, the address latch is released, and the word lines and bit lines are decoded in the row decoder 2 and the column decoder 3 in accordance with the address that selects the memory cell MC12 and the address determination signal AJ. The word line WL0 becomes nonselective, and the selecting transistor control line GL0 becomes nonselective. As a result, the selecting transistors TL00-TL02 are turned off and the reset voltage of the bit line RS0 is selected. The voltage of the bit line BL0 is then reset to the ground voltage.

At the time, the selective state of the charging bit line selecting line CH3 and the nonselective state of the reset bit line selecting line RS3 are maintained. After the address decoding with respect to the memory cell MC12 is completed in the row decoder 2 and the column decoder 3, the data in the memory cell MC12 is read without waiting for completing the reset of the voltage of the bit line BL0 (period T3).

Because the clock signal falls during the period T3, the select address of the memory cell MC12 is latched in the address latch circuit 9, a predetermined voltage is applied to the word line WL1, the charging bit line selecting line CH3 becomes nonselective, and the bit line selecting line YG3 is selected. As a result, the selecting transistor control line GR1 is selected so that the selecting transistors TR10, TR01 and TR12 are turned on. The data in the memory cell MC12 is read by achieving the foregoing conditions.

At the time, the bit line BL3 is connected to the source line SL via the memory cell MC12, and the cell current in accordance with the data stored in the memory cell MC12 flows in the bit line BL3, which changes the voltage of the bit line BL3. The cell current or the voltage of the bit line is compared to the reference 17 in the sense amplifier 16 so that the data is decided to be "0" or "1". Then, the read data showing the determination result is outputted from the data output terminal Dout.

At the time, the memory cell MC11 is also selected by selecting the word line WL1. However, the voltage of the bit line BL2 is not changed by the memory cell MC11 because the selecting transistor control line GR2 is in the nonselective state. Further, the selecting transistor TR01 is selected since the selecting transistor control line GR1 is selected. However, the bit line BL2 is not connected to the source line SL via the memory cell MC01 because the word line WL0 is nonselective. Therefore, the voltage of the bit line BL2 is not changed. Further, the memory cell MC10 is selected, the selecting transistor TR10 is selected, and the bit line BL1 and the source line SL are connected to each other via the memory cell MC10. However, there is no current flow from the bit line BL1 to the source line SL because the reset bit line selecting line RS1 is selected. As a result, the voltage of the bit line BL1 is maintained to be the ground voltage.

While the data in the memory cell MC12 is being read, the reset of the voltage of the bit line BL0 is completed, and the voltage of the bit line BL0 is set to the ground voltage. Further, while the data in the memory cell MC12 is being read, the address that selects the memory cell MC11 is inputted. In a manner similar to the reading operation with respect to the memory cell MC00, the select address of the memory cell MC11 is compared to the select address of the memory cell MC12 retained in the address latch circuit 9. In the case where the selecting transistor TR11 is selected, the bit line BL2 (even-numbered bit line) is used in order to read the data from the memory cell MC12. The bit line BL2 is not consistent with the bit line BL3 (odd-numbered bit line) used for the reading operation with respect to the memory cell MC12. Therefore, the determination result of the address determination circuit 8' shows the inconsistency. In a state where the address determination signal AJ shows the inconsistency, the selecting transistor control line and the bit line selecting line are not switched over, the selecting transistor control line GR2 and the bit line selecting line YG2 are used in the reading operation with respect to the memory cell MC11, and the data is read via the bit line BL2. The non-latched address and address determination signal AJ are transmitted to the decoding circuit of the charging bit line selecting lines CH0-CH3 in the column decoder 3, and the charging bit line selecting line CH2 is selected, while the reset bit line selecting line RS2 becomes nonselective. As a result, the bit line BL2 is pre-charged. At the time, the reset bit line selecting line RS3, which is in the nonselective state in order to read the data from the memory cell MC12, remains nonselective.

Next, When the reading operation with respect to the memory cell MC12 is completed and the clock signal rises, the address latch is released, and the word lines and bit lines are decoded in the row decoder 2 and the column decoder 3 in accordance with the address that selects the memory cell MC11 and the address determination signal AJ. Further, the word line WL1 becomes nonselective and the selecting transistor control line GR1 becomes nonselective so that the selecting transistors TR10, TR01 and TR12 becomes nonselective, and the reset bit line selecting line RS3 is selected. As a result, the voltage of the bit line BL3 is reset to the ground voltage.

At the time, the selective state of the charging bit line selecting line CH2 and the nonselective state of the reset bit line selecting line RS2 are maintained. After the address decoding with respect to the memory cell MC11 is completed in the row decoder 2 and the column decoder 3, the data is read from the memory cell MC11 without waiting for completing the reset of the voltage of the bit line BL3.

Further, as the clock signal falls at the time, the select address of the memory cell MC11 is latched in the address latch circuit 9, a predetermined voltage is applied to the word line WL1, the charging bit line selecting line CH2 becomes nonselective, the bit line selecting line YG2 is selected, and the selecting transistor control line GR2 is selected. As a result, the transistors TR20, TR11 and TR22 are turned on, and the data is thereby read from the memory cell MC11. At the time, the bit line BL2 is connected to the source line SL via the memory cell MC11, and the cell current in accordance with the data stored in the memory cell MC11 flows in the bit line BL2, which changes the voltage of the bit line BL2. The cell current or the voltage of the bit line is compared to the reference 17 in the sense amplifier 16 so that the data is decided to be "0" or "1". The read data that shows the determination result is outputted from the data output terminal Dout.

At the time, the memory cells MC10 and MC12 are also selected because the word line WL1 is selected. However, the voltages of the bit line BL1 and the bit line BL3 are not changed by the memory cells MC10 and MC12 since the selecting transistor control line GR1 is in the nonselective state. Further, the selecting transistor control line GR2 is selected so that the selecting transistors TR20 and TR22 are selected. However, the bit line BL1 is not connected to the source line SL via the memory cell MC20 because the word line WL2 is in the nonselective state, and therefore, the bit line BL3 is not connected to the source line SL via the memory cell MC22. Therefore, the voltages of the bit line BL1 and the bit line BL3 are not changed.

In the meantime, while the data in the memory cell MC11 is being read, the reset of the voltage of the bit line BL3 is completed, and the voltage of the bit line BL3 is set to the ground voltage. While the data in the memory cell MC11 is being read, the address that selects the memory cell MC21 is inputted. In a manner similar to the reading operation with respect to the memory cell MC12, the select address of the memory cell MC21 is compared to the select address of the memory cell MC11 retained in the address latch circuit 9. When the data in the memory cell MC21 is read in the state where the selecting transistor TR21 is selected, the bit line BL2 (even-numbered bit line) is used, and the bit line BL2 is consistent with the bit line BL2 (even-numbered bit line) used in the reading operation with respect to the memory cell MC11. Therefore, the determination result by the address determination circuit 8' shows the consistency. When the address determination signal AJ shows the consistency, the selecting transistor control line and the bit line selecting line are switched over, and the selecting transistor control line GL3 and the bit line selecting line YG1 are used for the reading operation with respect to the memory cell MC21. The result of the reading operation is read via the bit line BL1. The non-latched address and address determination signal AJ are transmitted to the decoding circuit of the charging bit line selecting lines CH0-CH3 in the column decoder 3, and the charging bit line selecting line CH1 is selected, while the reset bit line selecting line RS1 becomes nonselective. As a result, the bit line BL1 is pre-charged. At the time, the reset bit line selecting line RS2, which is in the nonselective state in order to read the data from the memory cell MC11, remains nonselective.

When the reading operation with respect to the memory cell MC11 is completed and the clock signal rises, the address latch is released, and the word lines and bit lines are decoded in the row decoder 2 and the column decoder 3 in accordance with the address that selects the memory cell MC21 and the address determination signal AJ. Further, the word line WL1 becomes nonselective and the selecting transistor control line GR2 becomes nonselective, and then, the selecting transistors TR20, TR11 and TR22 are turned off. The reset bit line selecting line RS2 is selected, and the voltage of the bit line BL2 is reset to the ground voltage.

At the time, the selective state of the charging bit line selecting line CH1 and the nonselective state of the reset bit line selecting line RS1 are maintained. After the address decoding with respect to the memory cell MC21 is completed in the row decoder 2 and the column decoder 3, the data is read from the memory cell MC21 without waiting for completing the reset of the voltage of the bit line BL2. The data is read from the memory cell MC21 by generating the following states. Namely, due to a falling edge of the clock signal, the select address of the memory cell MC21 is latched in the address latch circuit 9, a predetermined voltage is applied to the word line WL2, the charging bit line selecting line CH1 becomes nonselective, the bit line selecting line YG1 is selected, and the selecting transistor TL21 is turned on based on the selection of the selecting transistor control line GL3. As a result, the reading operation from the memory cell MC21 is carried out.

At the time, the bit line BL1 is connected to the source line SL via the memory cell MC21, and the cell current in accordance with the data stored in the memory cell MC21 flows in the bit line BL1, which changes the voltage of the bit line BL1. The cell current or the voltage of the bit line is compared to the reference 17 in the sense amplifier 16 so that the data is decided to be "0" or "1". The read data that shows the determination result is outputted from the data output terminal Dout.

As described above, the selecting transistor control lines GL and GR and the bit line selecting line YG are switched over based on the determination signal of the address determination circuit 8' so that the bit line used in the reading operation is changed. Accordingly, the bit line of the next memory cell can be pre-charged during the reading operation with respect to the current memory cell, and the data can be read from the next memory cell while the voltage of the bit line after the reading operation is being reset. As a result, the data can be randomly read at a high speed.

In the foregoing description of the preferred embodiment 3, it is shown the case wherein the Nch transistor constitutes the selecting transistor 12, bit line selecting transistor 13 and charging bit line selecting transistor 14 shown in FIG. 13, however, the Pch transistor may constitute these transistors. Further, the case wherein one Nch non-volatile memory cell constitutes the memory cell array 1c, is shown in the present preferred embodiment, however, the same performance is obtained even in the case wherein at least two of Nch non-volatile memory cells constitute the memory cell array 1c. The structure of the memory cell array 1c is not particularly limited, and the NOR structure may be adopted. The present preferred embodiment is not limited to the Nch non-volatile memory cell and can be applied to at least one Pch non-volatile memory or resistance-variable non-volatile memory (RRAM), which are controllable by only the selected word line. More specifically, the present preferred embodiment can be applied to a semiconductor memory device comprising memory cells controllable by only the selected word line. Such a semiconductor memory device can also randomly read data at a high speed in a similar operation.

Preferred Embodiment 4

Figure 16:
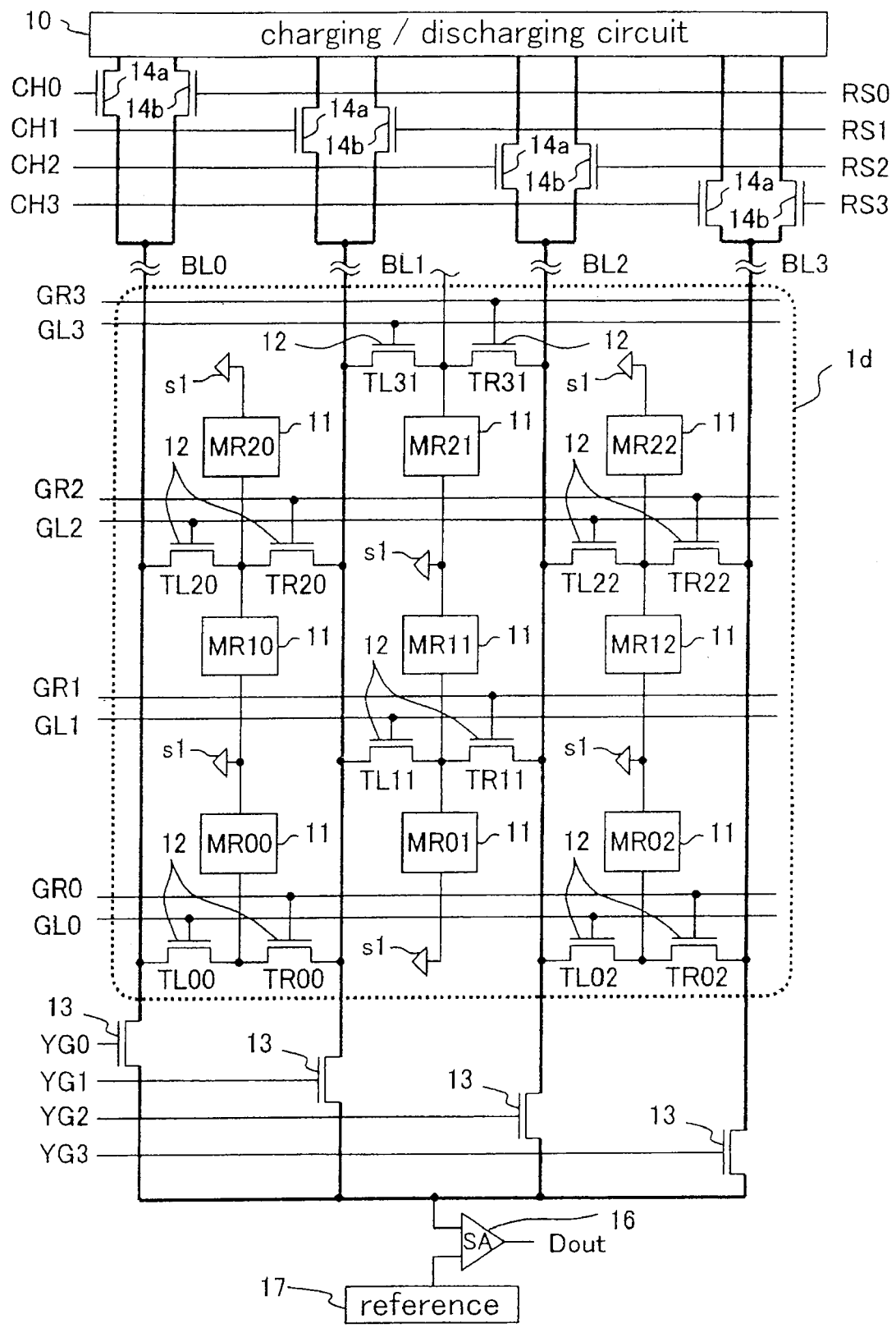
FIG. 16 shows a schematic circuit configuration of a memory cell array according to a preferred embodiment 4 of the present invention.

FIG. 16 shows a schematic plan structure of a memory cell array according to a preferred embodiment 4 of the present invention. As shown in FIG. 16, a semiconductor memory device according to the present preferred embodiment has a memory cell array 1d comprising memory cells with source terminal s1. Two selecting transistors TL [2n+2, 2m] and TR [2n+2, 2m] (n≧0, m≧0) are connected to first terminals of memory cells MR [2n+1, 2m] and MR [2n+2, 2m]. The selecting transistor TL [2n+2, 2m] is connected to first bit lines BL [2m], and the selecting transistor TR [2n+2, 2m] is connected to second bit lines BL [2m+1]. The selecting transistors TL [2n+2, 2m] and TR [2n+2, 2m] are controlled by the selecting transistor control lines GL [2n+2, 2] and GR [2n+2, 2]. Two selecting transistors TL [2n+1, 2m+1] and TR [2n+1, 2m+1] (n≧0, m≧0) are connected to first terminals of memory cells MR [2n, 2m+1] and MR [2n+1, 2m+1]. The selecting transistor TL [2n+1, 2m+1] is connected to first bit lines BL [2m+1], and the selecting transistor TR [2n+1, 2m+1] is connected to second bit lines BL [2m+2]. The selecting transistors TL [2n+1, 2m+1] and TR [2n+1, 2m+1] are controlled by the selecting transistor control lines GL [2n+1] and GR [2n+1]. For example, the selecting transistor control line GL1 controls the selecting transistor TL11, and the selecting transistor control line GR1 controls the selecting transistor TR11. An end of a sense amplifier 16 is connected to the respective bit lines BL [m] via bit line selecting transistors 13 controlled by bit line selecting lines YG [m]. A reference 17 is connected to another end of the sense amplifier 16. The respective bit lines BL [m] are connected to a charging/discharging circuit 10 via charging bit line selecting transistors 14a controlled by charging bit line selecting lines CH [m] and reset bit line selecting transistors 14b controlled by reset bit line selecting lines RS [m]. The charging/discharging circuit 10 pre-charges and resets voltage of the bit line BL [m]. When the voltage of the bit line BL [m] is set to a predetermined voltage, the charging bit line selecting transistor 14a is selected. When the voltage of the bit line BL [m] is reset, the reset bit line selecting transistor 14b is selected.

There is no particular limitation to the present preferred embodiment, however, at least one of capacitor, depression non-volatile memory, Nch non-volatile memory, Pch non-volatile memory or resistance-variable non-volatile memory (RRAM), which is able to control only the selected word line, can be applied to the memory cell array 1d shown in FIG. 16. In other words, any memory cell capable of storing "0" and "1" data can be adopted as the memory cell 11. Further, there is no particular limitation to a type of the memory cell 11, to which any of NOR, NAND and AND memory cells is applicable. Basically, the memory cell array 1d is good if it is configured in such a manner that the memory cells are connected to the source lines and bit lines.

In FIG. 17, the constitution shown in FIG. 16 is developed in such a manner that Nch non-volatile memory cells 11n are adopted as the memory cells 11. In the drawing, an Nch transistor constitutes a selecting transistor 12n, a bit line selecting transistor 13n, a charging bit line selecting transistor 14a, and a reset bit line selecting transistor 14b. The memory cell array 1c comprises at least one of Nch memory cell 11n. Memory cells MC00-MC02 are controlled through a single word line WL0 in a lateral direction. Memory cells MC10-MC12 are controlled through a single word line WL1 in a lateral direction. Memory cells MC20-MC22 are horizontally controlled through a single word line WL2 in a lateral direction. One ends of the memory cells 11n are respectively connected to the bit lines BL0-BL3 via the two selecting transistors TL and TR. Another ends of the memory cells 11n are connected to a common source line SL. The bit lines Bl0-BL3 are connected to one end of the common sense amplifier 16 via the bit line selecting transistors 13n respectively controlled by the bit line selecting lines YG0-YG3. Another end of the sense amplifier 16 is connected to the reference 17. A result of comparison of the contents of the memory cells 11n to the reference 17 in the sense amplifier 16 is outputted from a data output terminal Dout which is an output terminal of the sense amplifier 16.

The reference 17 may be any of a current source, a memory cell and a transistor capable of outputting an intermediate current between a cell current of the memory cell which retains "1" data and a cell current of the memory cell 11p which retains "0," data. Further, the reference 17 may be a voltage source having an intermediate voltage between the bit-line voltage in the reading operation with respect to the memory cell 11n retaining the "1" data and the bit-line voltage in the reading operation with respect to the memory cell 11p retaining the "0" data. Further, the reference 17 may be configured in such a manner that two selecting transistors are connected to one end of the reference cell or memory cell and the two selecting transistors are alternately switched every time when the data is read from the memory cell so that they can be connected to the different bit lines in the same manner as the configuration of the memory cells described earlier. As described above, any particular limitation is not given to the reference 17, it is enough as far as it serves as a comparison reference for when the data of the memory cells 11n are judged by the sense amplifier 16.

The bit lines BL0-BL3 are connected to the charging/discharging circuit 10 respectively via the charging bit line selecting transistors 14a and the reset bit line selecting transistors 14b. The charging bit line selecting transistors 14a are respectively controlled through the charging bit line selecting lines CH0-CH3. The reset bit line selecting transistors 14b are respectively controlled through the reset bit line selecting lines RS0-RS3. When the voltages of the bit lines BL0-BL3 are set to a predetermined voltage, the charging bit line selecting transistors 14a are selected. When the voltages of the bit lines BL0-BL3 are reset to a predetermined voltage, the reset bit line selecting transistors 14b are selected. The charging/discharging circuit 10 has a function of pre-charging and resetting the bit-line voltage to the predetermined voltage.

A reading operation with respect to the Nch memory cell 11n is carried out as described below. In a reading mode, the voltage of the source line SL is set to the ground voltage (0V). When the address is inputted and the selected memory cell is determined, the voltage of the bit line for the reading operation is set to a predetermined voltage (for example, 3V) by the charging bit line selecting transistor 14a selected based on the inputted address.

Next, a predetermined voltage (for example, 3V) is applied to the word line connected to the selected memory cell, and the bite line selecting transistor 13n and the selecting transistor 12n in accordance with the inputted address are selected. At the time, the selected bit line is connected to the source line SL via the selected memory cell 11n. Therefore, the cell current in accordance with data stored in the selected memory cell flows in the selected bit line, and the voltage of the selected bit line thereby changes. The cell current or the voltage of the selected bit line is compared to the reference 17 in the sense amplifier 16 so that the data is decided to be "0" or "1".

Figure 6:
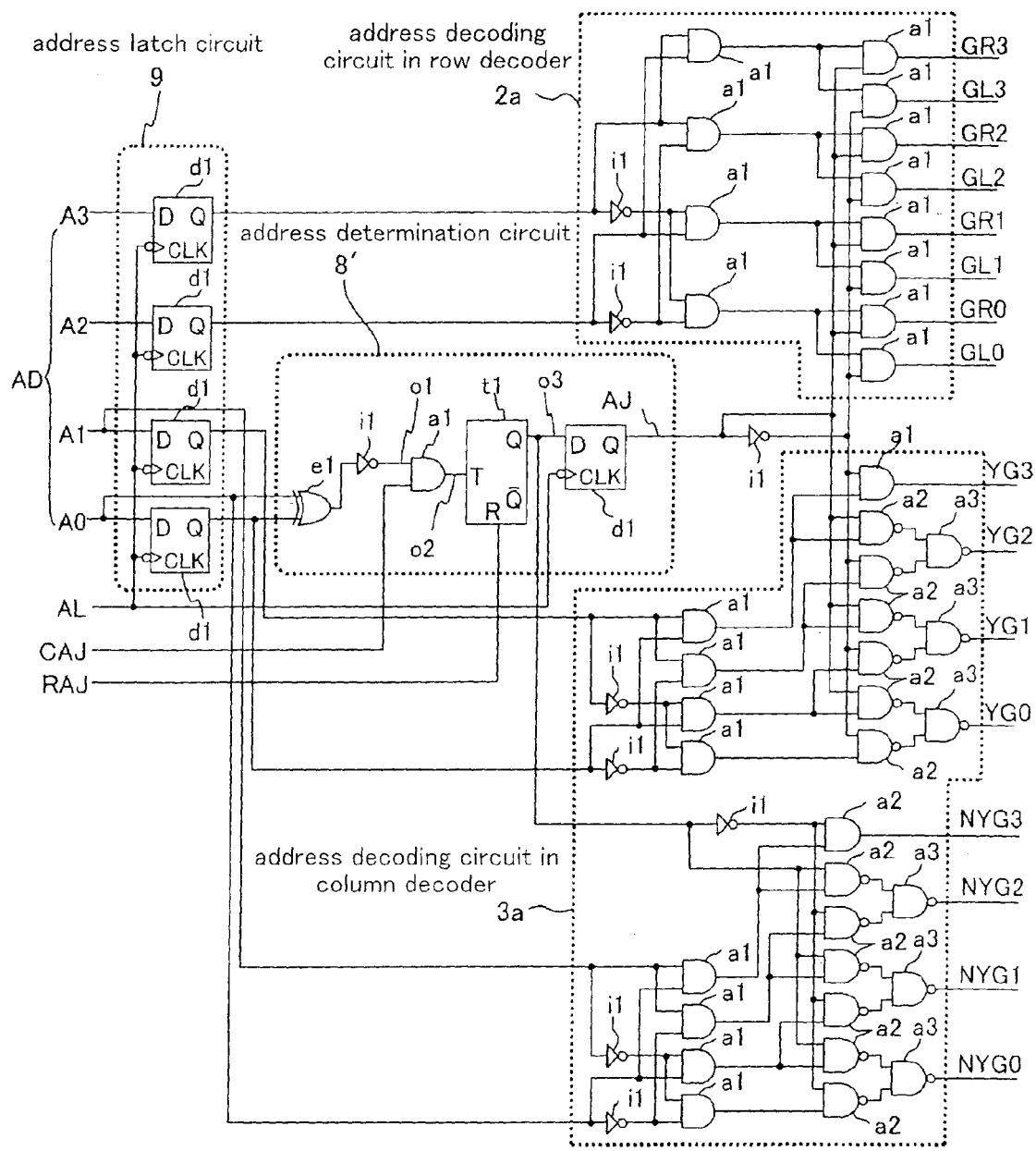
FIG. 6 shows a second constitutional example of the address determination circuit and the peripheral circuits thereof used in the preferred embodiments.
Figure 18:
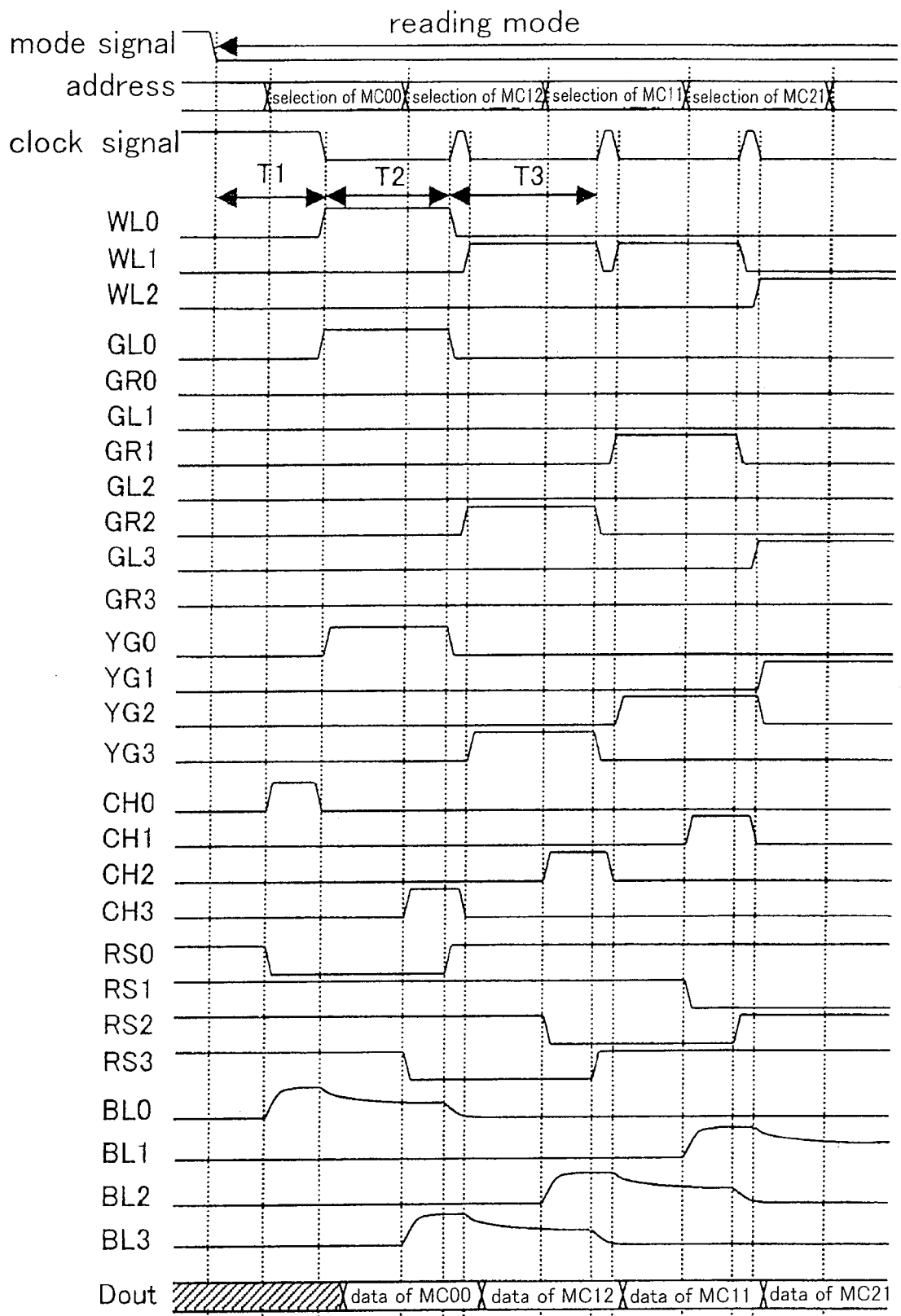
FIG. 18 is a time chart in a reading operation in the circuit shown in FIG. 17.

FIG. 18 shows timings of voltage variations in the respective wirings when the data in the memory cells MC00, MC12, MC11 and MC21 is sequentially read, which is an example of the random reading operation, in the circuit configuration shown in FIG. 17. A description is given below provided that the address determination circuit 8' shown in FIG. 6 is used, the address latch control signal AL is regarded as the clock signal and the address determination signal reset signal RAJ is regarded as the mode signal. The description is further based on the assumption that the address determination signal control signal CAJ shifts to the "H" state and the address determination signal AJ becomes valid by the time when the address latch is released after the address signals are compared as shown in the signal timings of FIG. 3. In FIG. 18, the variation timing of the address determination signal control signal CAJ is omitted.

When the operation shifts to the reading mode based on the mode signal (address determination signal reset signal RAJ) at first, the output of the address determination circuit 8' is reset and shifts to the "L" state. Further, the voltage of the source line SL is set to the ground voltage and the reset bit line selecting lines RS0-RS3 are all selected by before the address which selects the memory cell MC00 is inputted. As a result, all of the bit lines BL0-BL3 are set to the ground voltage.

Meanwhile, the ground voltage is applied to the word lines WL0-WL3 (period T1). The address that selects the memory cell MC00 inputted during the period T1 is transmitted to the row decoder 2 and the column decoder 3 via the address latch circuit 9, and the word lines and bit lines in accordance with the inputted address are decoded. During the period, the address is not latched in the address latch circuit 9 because the clock signal is in the "H" state. When the decoding of the bit line is completed, the reset bit line selecting line RS0 becomes nonselective, and the charging bit line selecting line CH0 is selected. As a result, the voltage of the bit line BL0 is pre-charged to a predetermined voltage.

Next, when the clock signal falls, the address latch becomes valid, and the address that selects the memory cell MC00 is latched in the address latch circuit 9. Further, a predetermined voltage is applied to the word line WL0, the charging bit line selecting line CH0 becomes nonselective, and the bit line selecting line YG0 is selected. Thereby, the sense amplifier 16 is connected to the bit line BL0. Further, the selecting transistors TL00 and TL02 are selected after the selecting transistor control line GL0 is selected. At the time, the bit line BL0 is connected to the source line SL via the memory cell MC00, and the cell current in accordance with the data stored in the memory cell MC00 flows in the bit line BL0, which changes the voltage of the bit line BL0. The cell current or the voltage of the bit line is compared to the reference 17 in the sense amplifier 16 so that the data is decided to be "0" or "1". Then, the read data showing the determination result is outputted from the data output terminal Dout (period T2).

During the period T2, the word line WL0 is selected so that the memory cells MC01 and MC02 are selected. However, the voltage of the bit line BL1 is not changed through the memory cell MC01 because the selecting transistor control line GL1 is the nonselective state. Further, the selecting transistor TL02 is selected since the selecting transistor control line GL0 is selected, and the bit line BL2 and the source line SL are connected to each other via the memory cell MC02. However, there is no current flow from the bit line BL2 to the source line SL because the reset bit line selecting line RS2 is selected. As a result, the voltage of the bit line BL2 is maintained to be the ground voltage.

During the period T2, the address that selects the memory cell MC12 is inputted while the data in the memory cell MC00 is being read. During the period T2, the clock signal is in the "L" state, and the address retained in the address latch circuit 9 (address that selects the memory cell MC00) is thereby valid. Therefore, the selection of the word lines and bit lines is not immediately switched over by the address that selects the memory cell MC12 inputted from the address signal AD. The select address of the memory cell MC12 is transmitted to the address determination circuit 8' and compared to the select address of the memory cell MC00 retained in the address latch circuit 9. The comparison is carried out based on the determination whether or not the bit line used in the current reading operation and the bit line used in the next reading operation are both even-numbered or odd-numbered. When the data in the memory cell MC12 is read, the bit line BL2 (even-numbered bit line) is used in the case where the selecting transistor TL22 is selected. Because the used bit line BL2 is consistent with the bit line BL0 (even-numbered bit line) used in the reading operation with respect to the memory cell MC00, the determination result by the address determination circuit 8 shows the consistency. When the address determination signal AJ shows the consistency, the selecting transistor control line and the bit line selecting line are switched over, and the selecting transistor control line GR2 and the bit line selecting line YG3 are used in the reading operation with respect to the memory cell MC12. Then, the data is read via the bit line BL3. The non-latched address and address determination signal AJ are transmitted to the decoding circuit of the charging bit line selecting lines CH0-CH3 in the column decoder 3, and the charging bit line selecting line CH3 is selected. Thereby, the reset bit line selecting line RS3 becomes nonselective. As a result, the bit line BL3 is precharged. At the time, the reset bit line selecting line RS0, which is in the nonselective state in order to read the data from the memory cell MC00, remains nonselective.

Next, when the reading operation with respect to the memory cell MC00 is completed and the clock signal rises, the address latch is released, and the word lines and bit lines are decoded in the row decoder 2 and the column decoder 3 in accordance with the address that selects the memory cell MC12 and the address determination signal AJ. The word line WL0 becomes nonselective, and the selecting transistor control line GL0 becomes nonselective. As a result, the selecting transistors TL00-TL02 are turned off, and the reset bit line selecting line RS0 is selected. The voltage of the bit line BL0 is then reset to the ground voltage.

At the time, the selective state of the charging bit line selecting line CH3 and the nonselective state of the reset bit line selecting line RS3 are maintained. After the address decoding with respect to the memory cell MC12 is completed in the row decoder 2 and the column decoder 3, the data in the memory cell MC12 is read without waiting for completing the reset of the bit line BL0 (period T3).

Because the clock signal falls during the period T3, the address that selects the memory cell MC12 is latched in the address latch circuit 9, a predetermined voltage is applied to the word line WL1, the charging bit line selecting line CH3 becomes nonselective, the bit line selecting line YG3 is selected, and the selecting transistor control line GR2 is selected. As a result, the selecting transistors TR20 and TR22 are turned on. After the aforementioned state is achieved, the data in the memory cell MC12 is read.

At the time, the bit line BL3 is connected to the source line SL via the memory cell MC12, and the cell current in accordance with the data stored in the memory cell MC12 flows in the bit line BL3, which changes the voltage of the bit line BL3. The cell current or the voltage of the bit line is compared to the reference 17 in the sense amplifier 16 so that the data is decided to be "0" or "1". Then, the read data showing the determination result is outputted from the data output terminal Dout.

At the time, the memory cell MC11 is also selected since the word line WL1 is selected. However, the voltage of the bit line BL2 is not changed through the memory cell MC11 because the selecting transistor control line GR1 is nonselective. Further, the word line WL1 is selected so that the memory cell MC10 is selected and the selecting transistor control line GP2 is selected so that the selecting transistor TR20 is thereby selected. The bit line BL1 and the source line SL are connected to each other via the memory cell MC10. However, there is no current flow from the bit line BL1 to the source line SL because the reset bit line selecting line RS1 is selected. As a result, the voltage of the bit line BL1 is maintained to be the ground voltage.

In the meantime, while the data in the memory cell MC12 is being read, the reset of the voltage of the bit line BL0 is completed, and the voltage of the bit line BL0 is set to the ground voltage. Further, while the data in the memory cell MC12 is being read, the address that selects the memory cell MC11 is inputted. In a manner similar to the reading operation with respect to the memory cell MC00, the select address of the memory cell MC11 is compared to the select address of the memory cell MC12 retained in the address latch circuit 9. In the case where the selecting transistor TR11 is selected, the bit line BL2 (even-numbered bit line) is used in order to read the data from the memory cell MC11. The bit line BL2 is inconsistent with the bit line BL3 (odd-numbered bit line) used for the reading operation with respect to the memory cell MC12. Therefore, the determination result by the address determination circuit 8' shows the inconsistency. Under the state where the address determination signal AJ shows the inconsistency, the selecting transistor control line and the bit line selecting line are not switched over, and the selecting transistor control line GR1 and the bit line selecting line YG2 are used in the reading operation with respect to the memory cell MC11. The data is then read from the bit line BL2. The non-latched address and address determination signal AJ are transmitted to the decoding circuit of the charging bit line selecting lines CH0-CH3 in the column decoder 3, the charging bit line selecting line CH2 is selected, and then the reset bit line selecting line RS2 becomes nonselective. As a result, the bit line BL2 is pre-charged. At the time, the reset bit line selecting line RS3, which is in the nonselective state in order to read the data from the memory cell MC12, remains nonselective.

Next, when the reading operation with respect to the memory cell MC12 is completed and the clock signal rises, the address latch is released, and the word lines and bit lines are decoded in the row decoder 2 and the column decoder 3 in accordance with the address that selects the memory cell MC11 and the address determination signal AJ. Further, the word line WL1 becomes nonselective and the selecting transistor control line GR2 becomes nonselective so that the selecting transistors TR20 and TR22 become nonselective, and the reset bit line selecting line RS3 is selected. As a result, the voltage of the bit line BL3 is reset to the ground voltage.

At the time, the selection of the charging bit line selecting line CH2 and the nonselective state of the reset bit line selecting line RS2 are maintained. After the address decoding with respect to the memory cell MC11 is completed in the row decoder 2 and the column decoder 3, the data is read from the memory cell MC11 without waiting for completing the reset of the voltage of the bit line BL3. At the time, the clock signal falls, and the select address of the memory cell MC11 is latched in the address latch circuit 9. Then, a predetermined voltage is applied to the word line WL1, the charging bit line selecting line CH2 becomes nonselective, and the bit line selecting line YG2 becomes selective. The selecting transistor TR11 is turned on based on the selection of selecting transistor control line GR1, and then, the data is read from the memory cell MC11.

Further, the bit line BL2 is connected to the source line SL via the memory cell MC11 at the time, and the cell current in accordance with the data stored in the memory cell MC11 flows in the bit line BL2, which changes the voltage of the bit line BL2. The cell current or the voltage of the bit line is compared to the reference 17 in the sense amplifier 16 so that the data is decided to be "0" or "1". The read data as the determination result is outputted from the data output terminal Dout.

At the time, the memory cells MC10 and MC12 are also selected because the word line WL1 is selected. However, the voltages of the bit line BL1 and the bit line BL3 are not changed by the memory cells MC10 and MC12 since the selecting transistor control line GR2 is in the nonselective state.

In the meanwhile, while the data in the memory cell MC11 is being read, the reset of the voltage of the bit line BL3 is completed, and the voltage of the bit line BL3 is set to the ground voltage. Further, the address that selects the memory cell MC21 is inputted while the data in the memory cell MC11 is being read. In a manner similar to the reading operation with respect to the memory cell MC12, the select address of the memory cell MC21 is compared to the select address of the memory cell MC11 retained in the address latch circuit 9.

When the data in the memory cell MC21 is read in the state where the selecting transistor TR31 is selected, the bit line BL2 (even-numbered bit line) is used, and the bit line BL2 is consistent with the bit line BL2 (even-numbered bit line) used in the reading operation with respect to the memory cell MC11. Therefore, the determination result by the address determination circuit 8' shows the consistency. When the address determination signal AJ shows the consistency, the selecting transistor control line and the bit line selecting line are switched over, and the selecting transistor control line GL3 and the bit line selecting line YG1 are used for the reading operation with respect to the memory cell MC21. The result of the reading operation is read via the bit line BL1. The non-latched address and address determination signal AJ are transmitted to the decoding circuit of the charging bit line selecting lines CH0-CH3 in the column decoder 3, the charging bit line selecting line CH1 is selected, and then the reset bit line selecting line RS1 becomes nonselective. As a result, the bit line BL1 is pre-charged. At the time, the reset bit line selecting line RS2, which is in the nonselective state in order to read the data from the memory cell MC11, remains nonselective.

When the reading operation with respect to the memory cell MC11 is completed and the clock signal rises, and the address latch is released, the word lines and bit lines are decoded in the row decoder 2 and the column decoder 3 in accordance with the address that selects the memory cell MC21 and the address determination signal AJ. Further, the word line WL1 becomes nonselective and the selecting transistor control line GR1 becomes nonselective. Thereby, the selecting transistors TR11 is turned off, and the reset bit line selecting line RS2 is selected. As a result, the voltage of the bit line BL2 is reset to the ground voltage.

At the time, the selective state of the charging bit line selecting line CH1 and the nonselective state of the reset bit line selecting line RS1 are maintained. After the address decoding with respect to the memory cell MC21 is completed in the row decoder 2 and the column decoder 3, the data is read from the memory cell MC21 without waiting for completing the reset of the voltage of the bit line BL2. The data is read from the memory cell MC21 based on a generation of the following state. Namely, the clock signal falls, the address which selects the memory cell MC21 is latched in the address latch circuit 9, a predetermined voltage is applied to the word line WL2, the charging bit line selecting line CH1 becomes nonselective, the bit line selecting line YG1 is selected, and the selecting transistor TL31 is turned on based on the selection of the selecting transistor control line GL3. As a result, the data is read from the memory cell MC21.

At the time, the bit line BL1 is connected to the source line SL via the memory cell MC21, and the cell current in accordance with the data stored in the memory cell MC21 flows in the bit line BL1, which changes the voltage of the bit line BL1. The cell current or the voltage of the bit line is compared to the reference 17 in the sense amplifier 16 so that the data is decided to be "0" or "1". The read data as the determination result is outputted from the data output terminal Dout.

As described above, the selecting transistor control lines GL and GR and the bit line selecting lines YG are switched over by the determination signal of the address determination circuit 8' so that the bit lines used in the reading operation are switched. Accordingly, the voltage of the bit line of the next memory cell can be pre-charged during the reading operation with respect to the current memory cell, and the data can be read from the next memory cell while the voltage of the bit line after the reading operation with respect to the memory cell is being reset. As a result, the data can be randomly read at a high speed.

Further, the number of the selecting transistors controlled by one selecting transistor control line can be reduced in comparison to the preferred embodiment 3, which can make capacitance loads of the selecting transistor control lines decrease much more.

The preferred embodiment 4 shows the case that the Nch transistors constitute the selecting transistor 12, bit line selecting transistor 13 and charging bit line selecting transistor 14a shown in FIG. 16, however, the Pch transistors may constitute these transistors. Further, one Nch non-volatile memory cell constitutes the memory cell array 1d according to the present preferred embodiment, however, at least two of Nch non-volatile memory cells may constitute the memory cell array 1d. The structure of the memory cell array 1d is not particularly limited, and even the NOR structure may be adopted. The present preferred embodiment is not limited to the Nch non-volatile memory cell and can be applied to at least one of Pch non-volatile memory or resistance-variable non-volatile memory (RRAM), which are controllable by only the selected word line. In short, the present preferred embodiment can be applied to a semiconductor memory device comprising memory cells controllable by only the selected word line. Such a semiconductor memory device can also read randomly data at a high speed in a similar operation.

Preferred Embodiment 5

Figure 19:
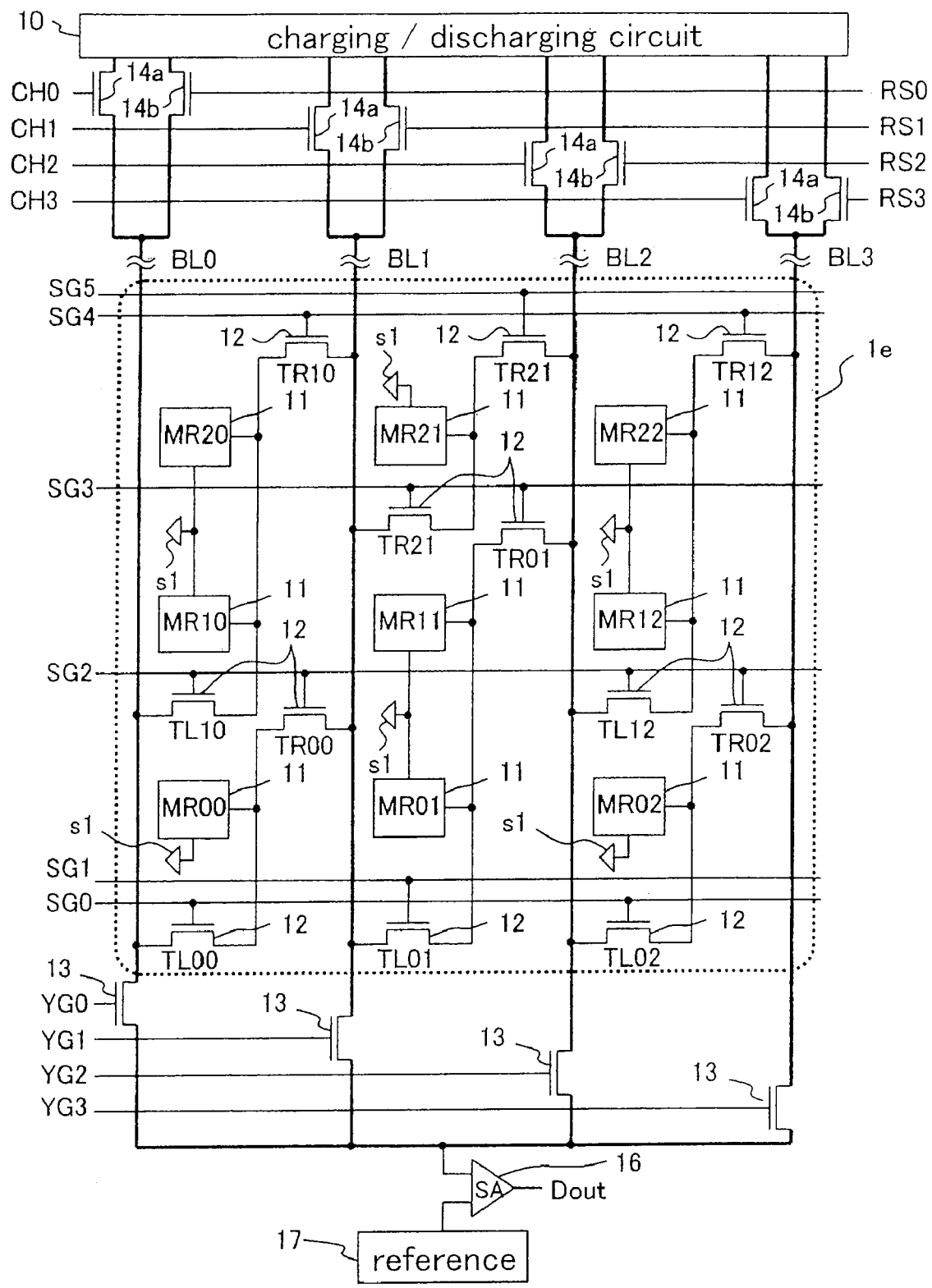
FIG. 19 shows a schematic circuit configuration of a memory cell array according to a preferred embodiment 5 of the present invention.

FIG. 19 shows a schematic plan structure of a memory cell array according to a preferred embodiment 5 of the present invention. As shown in FIG. 19, a semiconductor memory device according to the present preferred embodiment has a memory cell array 1e comprising memory cells with source terminals s1. Two selecting transistors TL [2n+2, 2m] and TR [2n+2, 2m] (n≧0, m≧0) are connected to first terminals of memory cells MR [2n+1, 2m] and [2n+2, 2m]. The selecting transistors TL [2n+2, 2m] are connected to first bit lines BL [2m], and the selecting transistors TR [2n+2, 2m] are connected to second bit lines BL [2m+1]. The selecting transistors TL [2n+2, 2m] and TR [2n+2, 2m] are controlled by the selecting transistor control lines SG [2n] and SG [2n+2]. Two selecting transistors TL [2n+1, 2m+1] and TR [2n+1, 2m+1] (n≧0, m≧0) are connected to first terminals of memory cells MR [2n, 2m+1] and MR [2n+1, 2m+1]. The selecting transistors TL [2n+1, 2m+1] are respectively connected to first bit lines BL [2m+1], and the selecting transistors TR [2n+1, 2m+1] are respectively connected to second bit lines BL [2m+2]. The selecting transistors TL [2n+1, 2m+1] and TR [2n+1, 2m+1] are controlled by the selecting transistor control lines SG [2n+1] and SG [2n+3]. For example, the selecting transistor control line SG2 controls the selecting transistor TL10, TL12, TR00 and TR02. An end of a sense amplifier 16 is connected to the respective bit lines BL [m] via bit line selecting transistors 13 controlled by bit line selecting lines YG [m]. A reference 17 is connected to another end of the sense amplifier 16. The respective bit lines BL [m] are connected to a charging/discharging circuit 10 via charging bit line selecting transistors 14a controlled by charging bit line selecting lines CH [m] and reset bit line selecting transistors 14b controlled by reset bit line selecting lines RS [m]. The charging/discharging circuit 10 pre-charges and resets voltages of the bit lines BL [m]. When the voltage of the bit line BL [m] is set to a predetermined voltage, the charging bit line selecting transistor 14a is selected. When the voltage of the bit line BL [m] is reset, the reset bit line selecting transistor 14b is selected.

There is no particular limitation to the present preferred embodiment, however, at least one of capacitor, depression non-volatile memory, Nch non-volatile memory, Pch non-volatile memory or resistance-variable non-volatile memory (RRAM), which is able to select only the selected word line, can be applied to the memory cell array 1e shown in FIG. 19. In other words, any memory cell capable of storing "0" and "1" data can be adopted as the memory cell array 1e. Further, there is no particular limitation to a type of the memory cell 11, to which any of NOR, NAND and AND memory cells is applicable. The memory cell array 1e may be configured in such a manner that the memory cells are connected to the source and bit lines.

Figure 20:
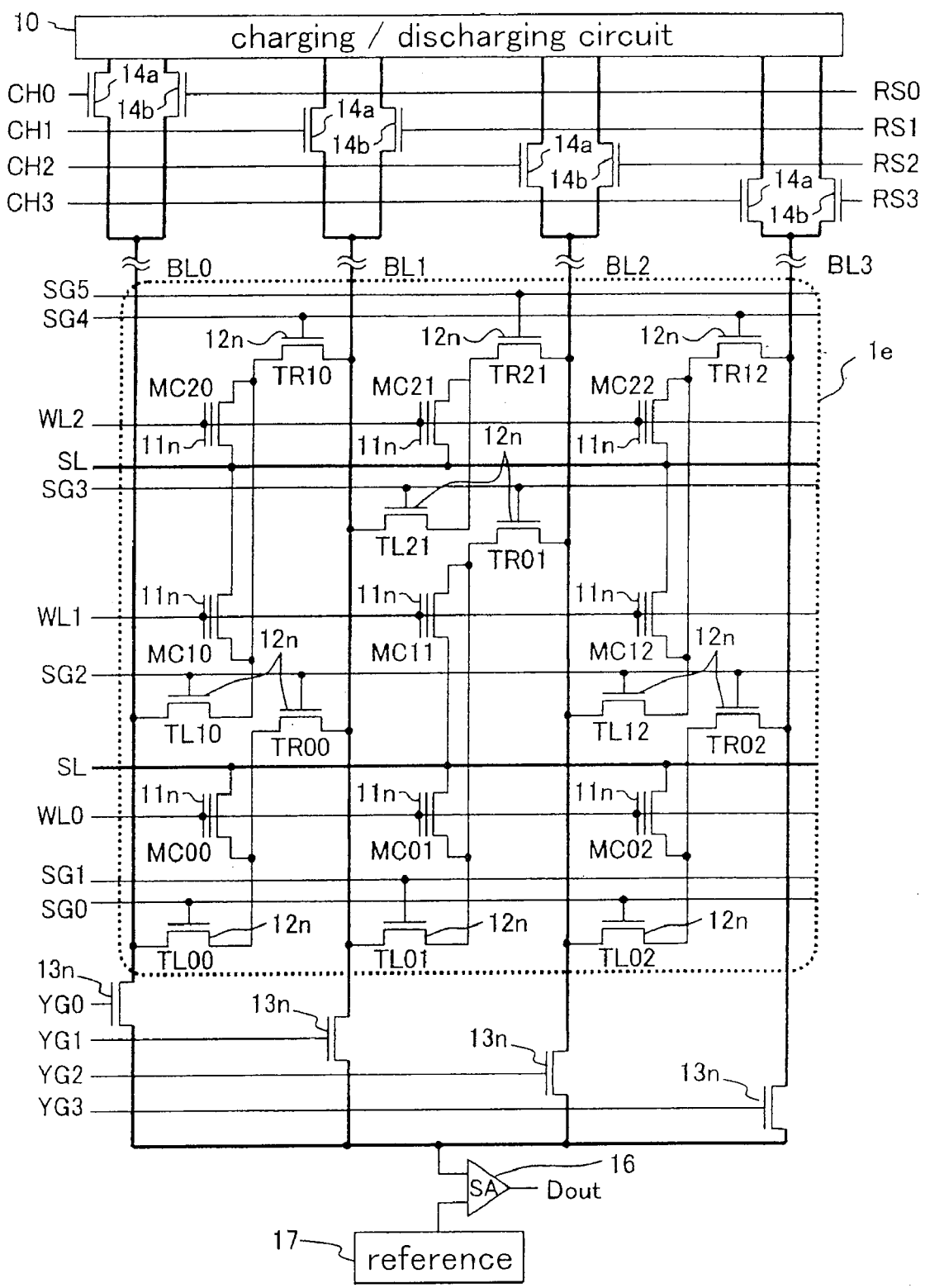
FIG. 20 shows a frame format of the circuit configuration according to the preferred embodiment 5.

In FIG. 20, the constitution shown in FIG. 19 is developed in such a manner that Nch non-volatile memory cells 11n are adopted as the memory cells 11. In the drawing, an Nch transistor constitutes a selecting transistor 12n, a bit line selecting transistor 13n, a charging bit line selecting transistor 14a, and a reset bit line selecting transistor 14b. The memory cell array 1c comprises at least one of Nch memory cell 11n. Memory cells MC00-MC02 are controlled through a single word line WL0 in a lateral direction. Memory cells MC10-MC12 are controlled through a single word line WL1 in a lateral direction. Memory cells MC20-MC22 are horizontally controlled through a single word line WL2 in a lateral direction. One ends of the memory cells 11n are respectively connected to the bit lines BL0-BL3 via the two selecting transistors TL and TR. Another ends of the memory cells 11n are connected to a common source line SL. The bit lines Bl0-BL3 are respectively connected to one end of the common sense amplifier 16 via the bit line selecting transistors 13n respectively controlled by the bit line selecting lines YG0-YG3. Another end of the sense amplifier 16 is connected to the reference 17. A result of comparison of the contents of the memory cells 11n to the reference 17 in the sense amplifier 16 is outputted from a data output terminal Dout which is an output terminal of the sense amplifier 16.

The reference 17 may be any of a current source, a memory cell and a transistor capable of outputting an intermediate current between a cell current of the memory cell which retains "1" data and a cell current of the memory cell 11p which retains "0" data. The reference 17 may be a voltage source having an intermediate voltage between the bit-line voltage in the reading operation with respect to the memory cell 11n retaining the "1" data and the bit-line voltage in the reading operation with respect to the memory cell 11p retaining the "0" data. Further, the reference 17 may be configured in such a manner that two selecting transistors are connected to one end of the reference cell or memory cell and the two selecting transistors are alternately switched every time when the data is read from the memory cell so that they can be connected to the different bit lines in the same manner as the configuration of the memory cells described earlier. Like this, the reference 17 is not specially limited, it is enough that it serves as a comparison reference when the data of the memory cells 11n are judged by the sense amplifier 16.

The bit lines BL0-BL3 are connected to the charging/discharging circuit 10 respectively via the charging bit line selecting transistors 14a and the reset bit line selecting transistors 14b. The charging bit line selecting transistors 14a are controlled through the charging bit line selecting lines CH0-CH3. The reset bit line selecting transistors 14b are controlled through the reset bit line selecting lines RS0-RS3. When the voltages of the bit lines BL0-BL3 are set to a predetermined voltage, the charging bit line selecting transistors 14a are selected. When the voltages of the bit lines BL0-BL3 are reset to a predetermined voltage, the reset bit line selecting transistors 14b are selected. The charging/discharging circuit 10 has a function of pre-charging and resetting the bit-line voltage to the predetermined voltage.

A reading operation with respect to the Nch memory cell 11n is carried out as described below. In a reading mode, the voltage of the source line SL is set to the ground voltage (0V). When the address is inputted and the selected memory cell is determined, the voltage of the bit line for the reading operation is set to a predetermined voltage (for example, 3V) by the charging bit line selecting transistor 14a selected based on the inputted address.

Next, a predetermined voltage (for example, 3V) is applied to the word line connected to the selected memory cell, and the bite line selecting transistor 13n and the selecting transistor 12n in accordance with the inputted address are selected. At the time, the selected bit line is connected to the source line SL via the selected memory cell 11n. As the cell current in accordance with data stored in the selected memory cell flows in the selected bit line, and the voltage of the selected bit line thereby changes. The cell current or the voltage of the selected bit line is compared to the reference 17 in the sense amplifier 16 so that the data is decided to be "0" or "1".

Figure 21:
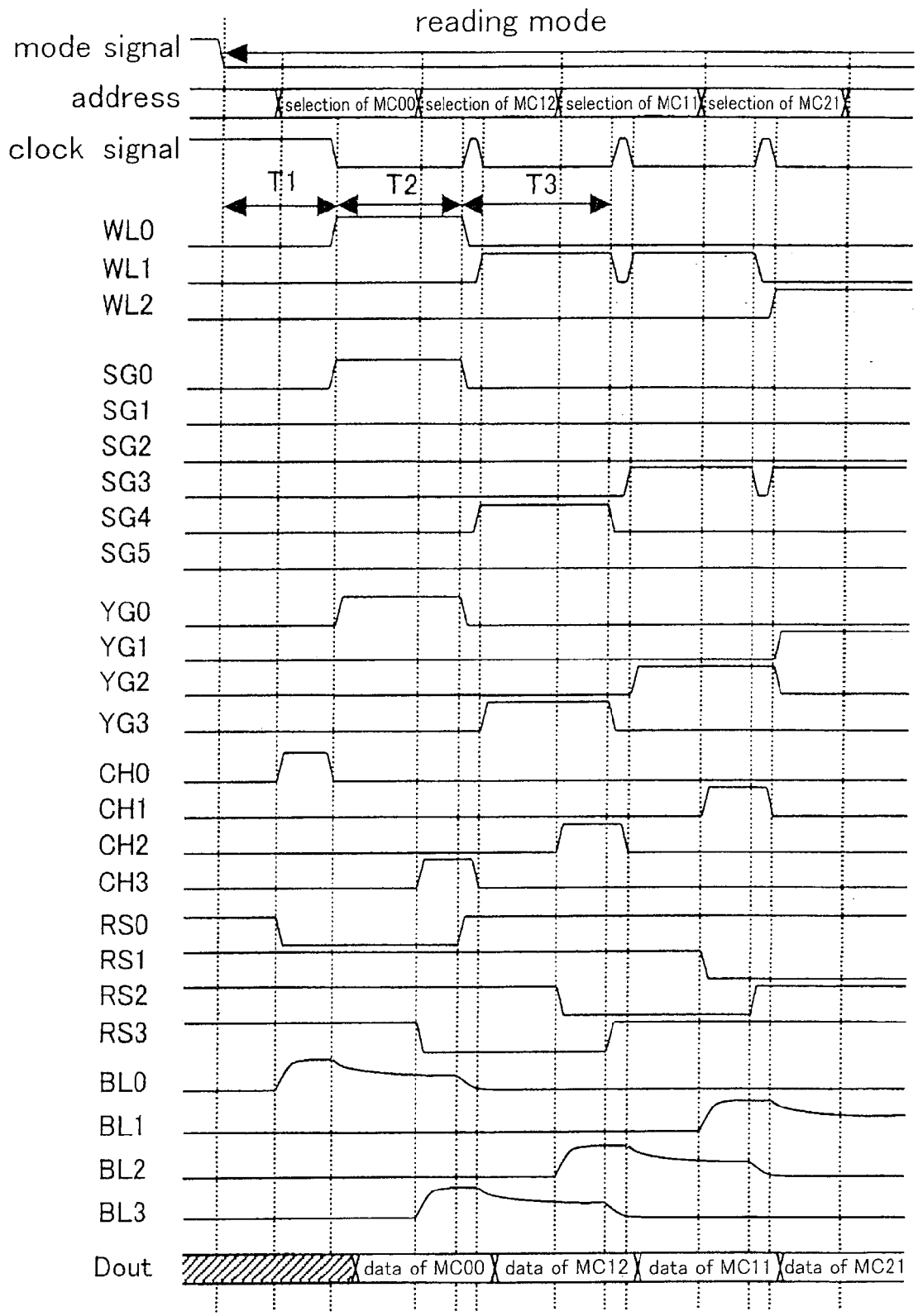
FIG. 21 is a time chart in a reading operation in the circuit shown in FIG. 20.

FIG. 21 shows timings of voltage variations in the respective wirings when the data in the memory cells MC00, MC12, MC11 and MC21 is sequentially read as an example of the random reading operation, in the circuit configuration shown in FIG. 20. A description is given below provided that the address determination circuit 8' shown in FIG. 6 is used, the address latch control signal AL is regarded as the clock signal and the address determination signal reset signal RAJ is regarded as the mode signal. The description is further given based on the assumption that the address determination signal control signal CAJ shifts to the "H" state and the address determination signal AJ becomes valid by before the address latch is released after the address signals are compared as shown in the signal timings of FIG. 3. In FIG. 21, the variation timing of the address determination signal control signal CAJ is omitted.

When the operation shifts to the reading mode based on the mode signal (address determination signal reset signal RAJ) at first, the output of the address determination circuit 8' is reset so as to shift to the "L" state. Further, the voltage of the source line SL is set to the ground voltage and the reset bit line selecting lines RS0-RS3 are all selected by before the address that selects the memory cell MC00 is inputted. As a result, the voltages of all of the bit lines BL0-BL3 are set to the ground voltage.

Meanwhile, the ground voltage is applied to the word lines WL0-WL3 (period T1). The address that selects the memory cell MC00 inputted during the period T1 is transmitted to the row decoder 2 and the column decoder 3 via the address latch circuit 9, and the word lines and bit lines are decoded in accordance with the inputted address. During the period, the address is not latched in the address latch circuit 9 because the clock signal is in the "H" state. When the decoding of the bit line is completed, the reset bit line selecting line RS0 becomes nonselective, and the charging bit line selecting line CH0 is selected. As a result, the voltage of the bit line BL0 is pre-charged to a predetermined voltage.

Next, when the clock signal falls, the address latch becomes valid, and the address that selects the memory cell MC00 is latched in the address latch circuit 9. Further, a predetermined voltage is applied to the word line WL0, the charging bit line selecting line CH0 becomes nonselective, and the bit line selecting line YG0 is selected. Thereby, the sense amplifier 16 is connected to the bit line BL0. Further, the selecting transistor control line SG0 is selected so that the selecting transistors TL00 and TL02 are selected. At the time, the bit line BL0 is connected to the source line SL via the memory cell MC00, and the cell current in accordance with the data stored in the memory cell MC00 flows in the bit line BL0, which changes the voltage of the bit line BL0. The cell current or the voltage of the bit line is compared to the reference 17 in the sense amplifier 16 so that the data is decided to be "0" or "1". Then, the read data as the comparison result is outputted from the data output terminal Dout (period T2).

During the period T2, the word line WL0 is selected so that the memory cells MC01 and MC02 are selected. However, the voltage of the bit line BL1 is not changed by the memory cell MC01 because the selecting transistor control line SG1 is in the nonselective state. Further, the selecting transistor TR02 is selected since the selecting transistor control line GL0 is selected, and the bit line BL2 and the source line SL are connected to each other via the memory cell MC02. However, there is no current flow from the bit line BL2 to the source line SL because the reset bit line selecting line RS2 is selected. As a result, the voltage of the bit line BL2 is maintained to be the ground voltage.

During the period T2, the address that selects the memory cell MC12 is inputted while the data in the memory cell MC00 is being read. During the period T2, the clock signal is in the "L" state, and the address retained in the address latch circuit 9 (select address of the memory cell MC00) is thereby valid. Therefore, the selection of the word lines and bit lines is not immediately switched over by the select address of the memory cell MC12 inputted from the address signal AD. The select address of the memory cell MC12 is transmitted to the address determination circuit 8' and compared to the select address of the memory cell MC00 retained in the address latch circuit 9. The comparison is carried out based on the judgment whether or not the bit line used in the current reading operation and the bit line used in the next reading operation are both even-numbered or odd-numbered. When the data in the memory cell MC12 is read, the bit line BL2 (even-numbered bit line) is used in the case where the selecting transistor TL12 is selected. Because the used bit line BL2 is consistent with the bit line BL0 (even-numbered bit line) used in the reading operation with respect to the memory cell MC00, the determination result by the address determination circuit 8' shows consistency. When the address determination signal AJ shows the consistency, the selecting transistor control line and the bit line selecting line are switched over, and the selecting transistor control line SG4 and the bit line selecting line YG3 are used in the reading operation with respect to the memory cell MC12. Then, the reading result is read via the bit line BL3. The non-latched address and address determination signal AJ are transmitted to the decoding circuit of the charging bit line selecting lines CH0-CH3 in the column decoder 3, the charging bit line selecting line CH3 is selected, and then the reset bit line selecting line RS3 becomes nonselective. As a result, the bit line BL3 is pre-charged. At the time, the reset bit line selecting line RS0, which is in the nonselective state in order to read the data from the memory cell MC00, remains nonselective.

Next, when the reading operation with respect to the memory cell MC00 is completed and the clock signal rises, the address latch is released, and the word lines and bit lines are decoded in the row decoder 2 and the column decoder 3 in accordance with the address that selects the memory cell MC12 and the address determination signal AJ. The word line WL0 becomes nonselective, and the selecting transistor control line SG0 becomes nonselective. As a result, the selecting transistors TL00-TL02 are turned off, and the reset bit line selecting line RS0 is selected so that the voltage of the bit line BL0 is reset to the ground voltage.

At the time, the selective state of the charging bit line selecting line CH3 and the nonselective state of the reset bit line selecting line RS3 are maintained. After the address decoding with respect to the memory cell MC12 is completed in the row decoder 2 and the column decoder 3, the data in the memory cell MC12 is read without waiting for completing the reset of the bit line BL0 (period T3).

Because the clock signal falls during the period T3, the select address of the memory cell MC12 is latched in the address latch circuit 9, a predetermined voltage is applied to the word line WL1, the charging bit line selecting line CH3 becomes nonselective, and the bit line selecting line YG3 is selected. As a result, the selecting transistor control line SG4 is selected so that the selecting transistors TR10 and TR12 are turned on. Then, the data in the memory cell MC12 is read after achieving the aforementioned state.

At the time, the bit line BL3 is connected to the source line SL via the memory cell MC12, and the cell current in accordance with the data stored in the memory cell MC12 flows in the bit line BL3, which changes the voltage of the bit line BL3. The cell current or the voltage of the bit line is compared to the reference 17 in the sense amplifier 16 so that the data is decided to be "0" or "1". Then, the read data as the comparison result is outputted from the data output terminal Dout.

At the time, the memory cell MC11 is also selected since the word line WL1 is selected. However, the voltages of the bit lines BL1 and BL2 are not changed through the memory cell MC11 because the selecting transistor control lines SG1 and SG3 are in the nonselective state. Further, the word line WL1 is selected so that the memory cell MC10 is selected, and the selecting transistor TR10 is selected based on the selection of the selecting transistor control line SG4. Accordingly, the bit line BL1 and the source line SL are connected to each other via the memory cell MC10. However, there is no current flow from the bit line BL1 to the source line SL because the reset bit line selecting line RS1 is selected. As a result, the voltage of the bit line BL1 is maintained to be the ground voltage. Further, the selecting transistor TR21 is turned on since the selecting transistor control line SG4 is selected. However, the bit line BL2 and the source line SL are not connected via the memory cell MC21 because the word line WL2 is in the nonselective state. As a result, the voltage of the bit line BL2 is maintained to be the ground voltage.

In the meantime, while the data in the memory cell MC12 is being read, the reset of the voltage of the bit line BL0 is completed, and the voltage of the bit line BL– is set to the ground voltage. Further, while the data in the memory cell MC12 is being read, the address that selects the memory cell MC11 is inputted. In a manner similar to the reading operation with respect to the memory cell MC00, the select address of the memory cell MC11 is compared to the select address of the memory cell MC12 retained in the address latch circuit 9. In the case where the selecting transistor TR01 is selected, the bit line BL2 (even-numbered bit line) is used in order to read the data from the memory cell MC11. The bit line BL2 is inconsistent with the bit line BL3 (odd-numbered bit line) used for the reading operation with respect to the memory cell MC12. Therefore, the determination result by the address determination circuit 8' shows the inconsistency. When the address determination signal AJ shows the inconsistency, the selecting transistor control line and the bit line selecting line are not switched over, and the selecting transistor control line SG3 and the bit line selecting line YG2 are used in the reading operation with respect to the memory cell MC11, and the data is read via the bit line BL2. The non-latched address and address determination signal AJ are transmitted to the decoding circuit of the charging bit line selecting lines CH0-CH3 in the column decoder 3, the charging bit line selecting line CH2 is selected, and then the reset bit line selecting line RS2 becomes nonselective. As a result, the bit line BL2 is pre-charged. At the time, the reset bit line selecting line RS3, which is in the nonselective state in order to read the data from the memory cell MC12, remains nonselective.

Next, when the reading operation with respect to the memory cell MC12 is completed and the clock signal rises, the address latch is released, and the word lines and bit lines are decoded in the row decoder 2 and the column decoder 3 in accordance with the address that selects the memory cell MC11 and the address determination signal AJ. Further, the word line WL1 becomes nonselective and the selecting transistor control line SG4 becomes nonselective so that the selecting transistors TR10 and TR12 are turned off, and the reset bit line selecting line RS3 is selected. As a result, the voltage of the bit line BL3 is reset to the ground voltage.

At the time, the selective state of the charging bit line selecting line CH2 and the nonselective state of the reset bit line selecting line RS2 are maintained. After the address decoding with respect to the memory cell MC11 is completed in the row decoder 2 and the column decoder 3, the data is read from the memory cell MC11 without waiting for completing the reset of the voltage of the bit line BL3. At the time, the clock signal falls, and the select address of the memory cell MC11 is latched in the address latch circuit 9. Then, a predetermined voltage is applied to the word line WL1, the charging bit line selecting line CH2 becomes nonselective, and the bit line BL2 is selected. The selecting transistor TR01 is selected based on the selection of the selecting transistor control line SG3, and then, the data is read from the memory cell MC11.

Further, the bit line BL2 is connected to the source line SL via the memory cell MC11 at this time, and the cell current in accordance with the data stored in the memory cell MC11 flows in the bit line BL2, which changes the voltage of the bit line BL2. The cell current or the voltage of the bit line is compared to the reference 17 in the sense amplifier 16 so that the data is decided to be "0" or "1". The read data as the determination result is outputted from the data output terminal Dout.

At the time, the memory cells MC10 and MC12 are also selected because the word line WL1 is selected. However, the voltages of the bit lines BL0, BL1 and BL3 are not changed through the memory cells MC10 and MC12 since the selecting transistor control lines SG2 and SG4 are in the nonselective state.

Further, the selecting transistor control line SG3 is selected so that the selecting transistor TL21 is selected. However, the bit line BL1 is not connected to the source line SL via the memory cell MC21 because the word line WL2 is in the nonselective state. As a result, the voltage of the bit line BL1 is maintained to be the ground voltage.

On one hand, while the data in the memory cell MC11 is being read, the reset of the voltage of the bit line BL3 is completed, and the voltage of the bit line BL3 is set to the ground voltage. Further, the address that selects the memory cell MC21 is inputted while the data in the memory cell MC11 is being read. In a manner similar to the reading operation with respect to the memory cell MC12, the select address of the memory cell MC21 is compared to the select address of the memory cell MC11 retained in the address latch circuit 9. When the data in the memory cell MC21 is read in the state where the selecting transistor TR21 is selected, the bit line BL2 (even-numbered bit line) is used, and the bit line BL2 is consistent with the bit line BL2 (even-numbered bit line) used in the reading operation with respect to the memory cell MC11. Therefore, the determination result by the address determination circuit 8' shows the consistency. When the address determination signal AJ shows the consistency, the selecting transistor control line and the bit line selecting line are switched over, and the selecting transistor control line SG3 and the bit line selecting line YG1 are used in the reading operation with respect to the memory cell MC21. The result of the reading operation is read from the bit line BL1. The non-latched address and address determination signal AJ are transmitted to the decoding circuit of the charging bit line selecting lines CH0-CH3 in the column decoder 3, the charging bit line selecting line CH1 is selected, and then the reset bit line selecting line RS1 becomes nonselective. As a result, the bit line BL1 is pre-charged. At the time, the reset bit line selecting line RS2, which is in the nonselective state in order to read the data from the memory cell MC11, remains nonselective.

Next, when the reading operation with respect to the memory cell MC11 is completed and the clock signal rises, and the address latch is released, and the word lines and bit lines are decoded in the row decoder 2 and the column decoder 3 in accordance with the address that selects the memory cell MC21 and the address determination signal AJ. Further, the word line WL1 becomes nonselective and the selecting transistor control line SG3 becomes nonselective so that the selecting transistor TR01 is turned off. The reset bit line selecting line RS2 is selected, and the voltage of the bit line BL2 is reset to the ground voltage.

At the time, the selective state of the charging bit line selecting line CH1 and the nonselective state of the reset bit line selecting line RS1 are maintained. After the address decoding with respect to the memory cell MC21 is completed in the row decoder 2 and the column decoder 3, the data is read from the memory cell MC21 without waiting for completing the reset of the voltage of the bit line BL2. The data is read from the memory cell MC21 based on a generation of the following state. The clock signal falls, the select address of the memory cell MC21 is latched in the address latch circuit 9, a predetermined voltage is applied to the word line WL2, the charging bit line selecting line CH1 becomes nonselective, the bit line BL1 is selected, and the selecting transistor TL21 is selected based on the selection of the selecting transistor control line SG3. Accordingly, the data is read from the memory cell MC21.

At the time, the bit line BL1 is connected to the source line SL via the memory cell MC21, and the cell current in accordance with the data stored in the memory cell MC21 flows in the bit line BL1, which changes the voltage of the bit line BL1. The cell current or the voltage of the bit line is compared to the reference 17 in the sense amplifier 16 so that the data is decided to be "0" or "1". The read data as the determination result is outputted from the data output terminal Dout.

As described above, the selecting transistor control lines SG and the bit line selecting lines YG are switched over by the determination signal of the address determination circuit 8', the voltage of the bit line of the next memory cell can be pre-charged during the reading operation with respect to the current memory cell through switching over the bit lines used in the reading operation. In addition, the data can be read from the next memory cell while the voltage of the bit line after the reading operation with respect to the memory cell is being reset. As a result, the data can be randomly read at a high speed.

Further, the number of the control lines can be reduced in comparison to the preferred embodiment 4 in such a manner that the selecting transistors TL [n+2, m] and TR [n, m] (n≧0, m≧0) are commonly controlled by the selecting transistor control lines SG [n+3].

In the foregoing description of the preferred embodiment 5, the Nch transistors constitute the selecting transistor 12, bit line selecting transistor 13 and charging bit line selecting transistor 14a shown in FIG. 13, however, the Pch transistors may constitute these transistors. Further, one Nch non-volatile memory cell constitutes the memory cell array 1e in the present preferred embodiment, however, it can be implemented as same even in the case where at least two of Nch non-volatile memory cells may constitute the memory cell array 1e. The structure of the memory cell array 1e is not particularly limited, and, for example, the NOR structure may be adopted. The present preferred embodiment is not limited to the Nch non-volatile memory cell and even at least one of Pch non-volatile memory or resistance-variable non-volatile memory (RRAM), which are able to control only the selected word line, can be applied. More specifically, the present preferred embodiment can be applied to a semiconductor memory device comprising memory cells capable of controlling only the selected wordline. Such a semiconductor memory device can also randomly read data at a high speed in a similar operation.

Preferred Embodiment 6

Figure 22:
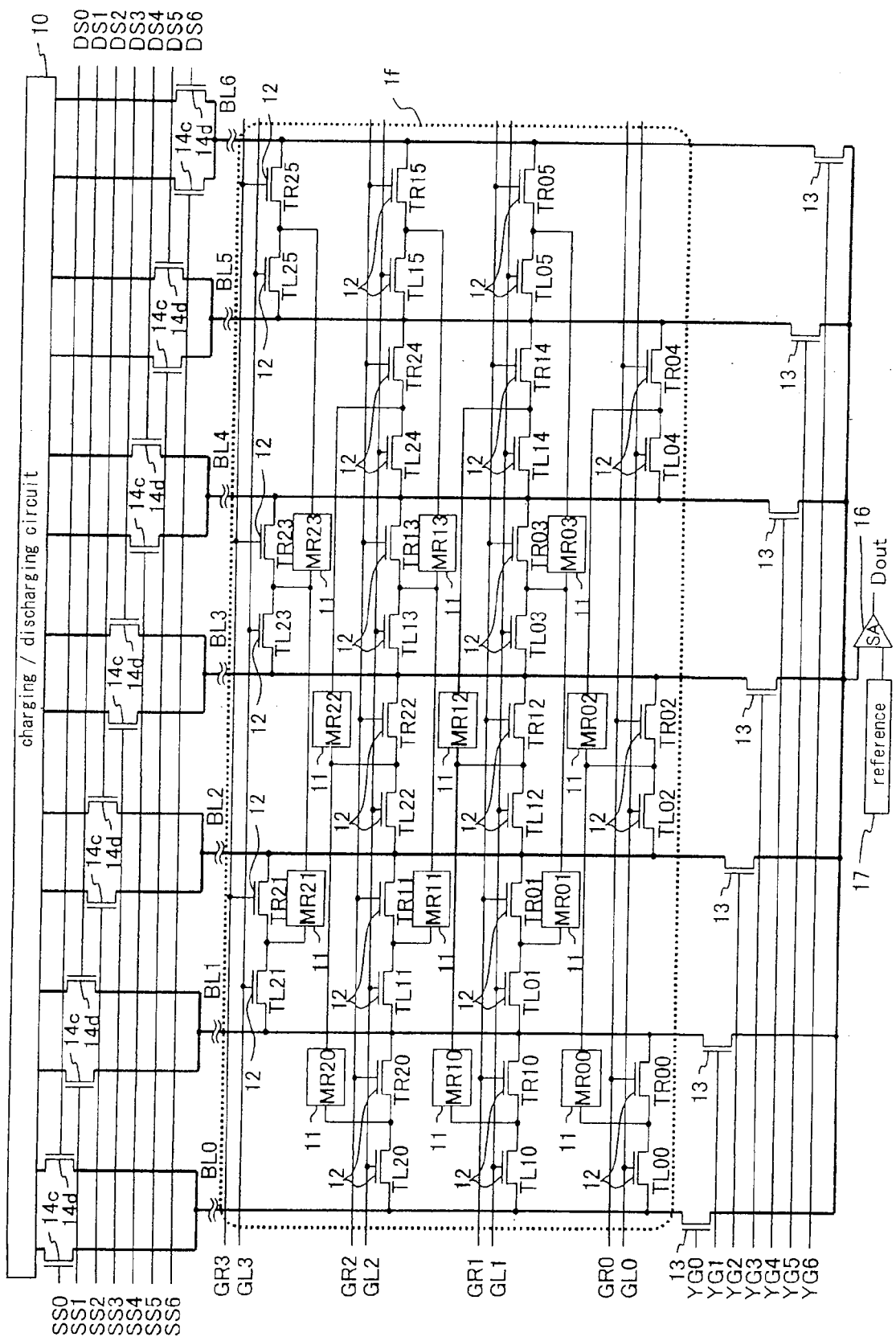
FIG. 22 shows a schematic circuit configuration of a memory cell array according to a preferred embodiment 6 of the present invention.

FIG. 22 shows a schematic plan structure of a memory cell array according to a preferred embodiment 6 of the present invention. As shown in FIG. 22, a semiconductor memory device according to the present preferred embodiment has a memory cell array 1f with memory cells. Two selecting transistors TL [n, 2m] and TR [n, 2m] (n≧0, m≧0) are connected to a first terminal of a memory cell MR [n, 2m]. Two selecting transistors TL [n, 2m+2] and TR [n, 2m+2] (n≧0, m≧0) are connected to a second terminal of the memory cell MR [n, 2m]. The selecting transistors TL [n, 2m] are connected to first bit lines BL [2m], and the selecting transistors TR [n, 2m] are connected to second bit lines BL [2m+1]. The selecting transistors TL [n, 2m+2] are connected to third bit lines BL [2m+2]. The selecting transistors TR [n, 2m+2] are connected to fourth bit lines BL [2m+3]. The selecting transistors TL [n, 2m], TR [n, 2m], TL [n, 2m+2], TR [n, 2m+2] are controlled by the selecting transistor control lines GL [n] and GR [n]. Two selecting transistors TL [n, 2m+1] and TR [n, 2m+1] (n≧0, m≧0) are connected to a first terminal of a memory cell MR [n, 2m+1]. Two selecting transistors TL [n, 2m+3] and TR [n, 2m+3] (n≧0, m≧0) are connected to a second terminal of the memory cell MR [n, 2m+1]. The selecting transistors TL [n, 2m+1] are connected to first bit lines BL [2m+1]. The selecting transistors TR [n, 2m+1] are connected to second bit lines BL [2m+2]. The selecting transistors TL [n, 2m+3] are connected to third bit lines BL [2m+3]. The selecting transistors TR [n, 2m+3] are connected to fourth bit lines BL [2m+4]. The selecting transistors TL [n, 2m+1], TR [n, 2m+1], TL [n, 2m+3] and TR [n, 2m+3] are controlled by the selecting transistor control lines GL [n+1] and GR [n+1]. For example, the selecting transistor control line GL1 controls the selecting transistors TL01, TL03, TL05, TL10, TL12 and TL14, and the selecting transistor control line GR1 controls the selecting transistors TR01, TR03, TR05, TR10, TR12 and TR14. An end of a sense amplifier 16 is connected to the respective bit lines BL [m] via bit line selecting transistors 13 controlled by bit line selecting lines YG [m]. A reference 17 is connected to another end of the sense amplifier 16. The respective bit lines BL [m] are connected to a charging/discharging circuit 10 via source line selecting transistors 14c controlled by source line selecting lines SS [m] and drain line selecting transistors 14d controlled by drain line selecting lines DS [m]. The charging/discharging circuit 10 has a function of applying a source voltage and a drain voltage to the bit lines BL [m]. When the voltage of the bit line BL [m] is set to the source voltage, the source line selecting transistor 14c is selected. When the voltage of the bit line BL [m] is set to the drain voltage, the drain line selecting transistor 14d is selected.

There is no particular limitation to the present preferred embodiment, however, at least one of Nch non-volatile memory, Pch non-volatile memory or resistance-variable non-volatile memory (RRAM), which are able to control only the selected word line, can be applied to the memory cells shown in FIG. 22. In other words, any memory cell capable of storing and reading "0" and "1" data can be applied to the memory cell array 1f.

Figure 23:
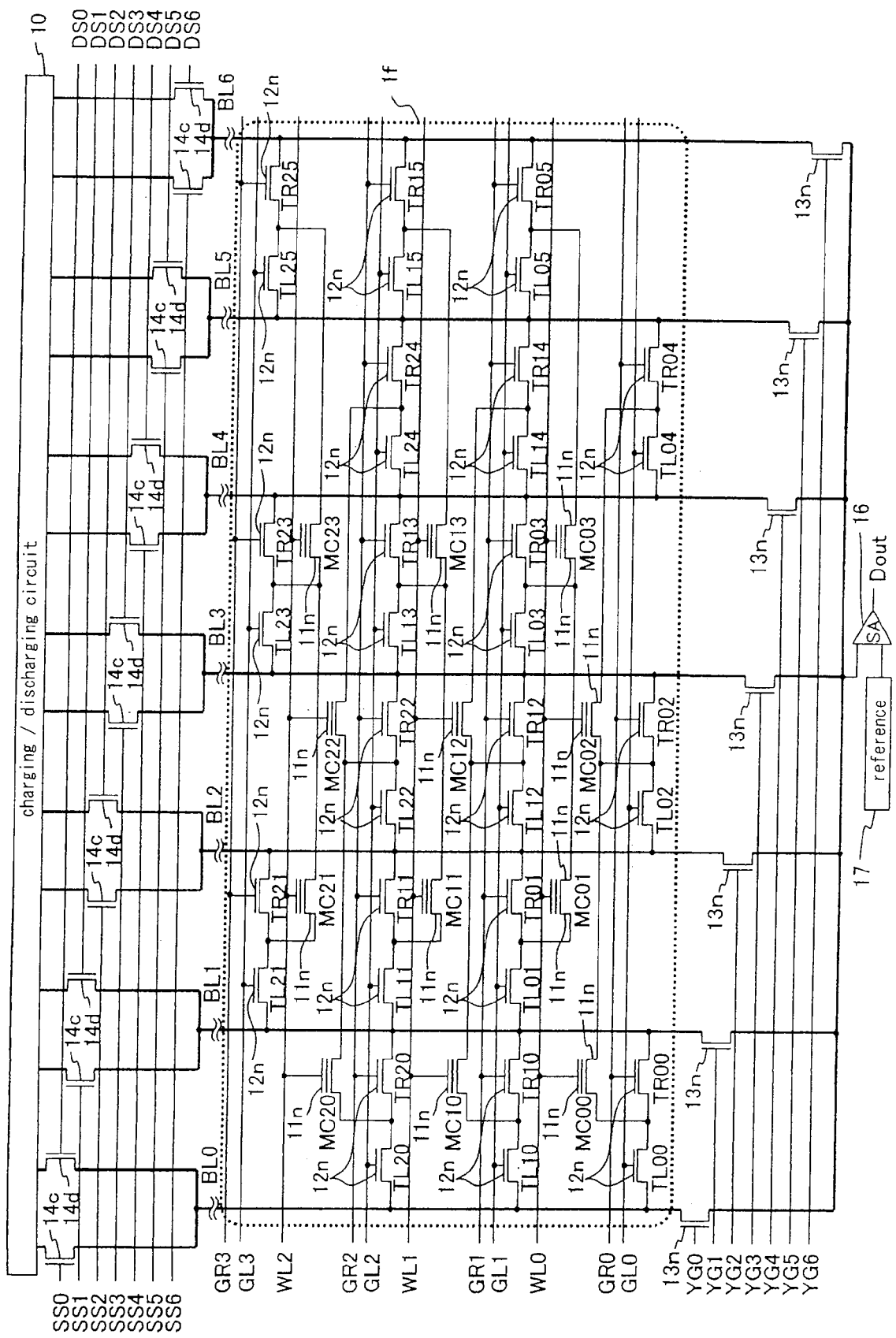
FIG. 23 shows a frame format of the circuit configuration according to the preferred embodiment 6.

In FIG. 23, the constitution shown in FIG. 22 is developed in such a manner that Nch non-volatile memory cells 11n are adopted as the memory cells 11. In the drawing, an Nch transistor constitutes a selecting transistor 12n, a bit line selecting transistor 13n, a source selecting transistor 14c, and a drain line selecting transistor 14d. The memory cell array 1f comprises at least one of Nch memory cell 11n. Memory cells MC00-MC03 are controlled through a single word line WL0 in a lateral direction. Memory cells MC10-MC13 are controlled through a single word line WL1 in a lateral direction. Memory cells MC20-MC23 are controlled through a single word line WL2 in a lateral direction. One ends of the memory cells 11n are respectively connected to any of the bit lines BL0-BL6 via the two selecting transistors TL and TR. Another ends of the memory cells 11n are respectively connected to any of the bit lines BL0-BL6 via the two selecting transistors TL and TR. The bit lines Bl0-BL6 are respectively connected to one end of the common sense amplifier 16 via the bit line selecting transistors 13n respectively controlled by the bit line selecting lines YG0-YG6. Another end of the sense amplifier 16 is connected to the reference 17. A result of comparison of the contents of the memory cells 11n to the reference 17 in the sense amplifier 16 is outputted from a data output terminal Dout which is an output terminal of the sense amplifier 16.

The reference 17 may be any of a current source, a memory cell and a transistor which are respectively capable of outputting an intermediate current between a cell current of the memory cell which retains "1" data and a cell current of the memory cell 11p which retains "0" data. The reference 17 may be a voltage source having an intermediate voltage between the bit-line voltage in the reading operation with respect to the memory cell 11n retaining the "1" data and the bit-line voltage in the reading operation with respect to the memory cell 11p retaining the "0" data. Further, the reference 17 may be configured in such a manner that two selecting transistors are connected to one end of the reference cell or memory cell and the two selecting transistors are alternately switched every time when the data is read from the memory cell so that they can be connected to the different bit lines in the same manner as the configuration of the memory cells described earlier. Like this, the reference 17 is not specially limited, and it is enough that it serves as a comparison reference when the data of the memory cells 11n are judged by the sense amplifier 16.

The bit lines BL0-BL6 are connected to the charging/discharging circuit 10 respectively via the source line selecting transistors 14c and the drain line selecting transistors 14d. The source line selecting transistors 14c are respectively controlled through the source line selecting lines SS0-SS6. The drain line selecting transistors 14d are respectively controlled through the drain line selecting lines DS0-DS3. When the source voltage is applied to the voltages of the bit lines BL0-BL6, the source line selecting transistors 14c are selected. When the drain voltage is applied to the voltages of the bit lines BL0-BL6, the drain line selecting transistors 14d are selected. The charging/discharging circuit 10 has a function of setting the bit-line voltage to a predetermined voltage.

A reading operation with respect to the VGA memory cell 11n, for example, in the case of source sensing, is carried out as described below. The drain line and the source line of the memory cell is determined based on the inputted address, and the drain line selecting line 14d is selected so that the voltage of the drain line is pre-charged to a predetermined voltage (for example, 1V). The source line selecting line 14c is selected so that the voltage of the source line is set to the ground voltage (0V) so as to serve as the bit line for reading the data in the memory cell.

Next, a predetermined voltage (for example, 3V) is applied to the selected word line in accordance with the inputted address, and the bite line selecting transistor 13n and the selecting transistor 12n are selected. At the time, the drain line is connected to the source line via the selected memory cell 11n. Therefore, the cell current in accordance with data stored in the selected memory cell flows in the source line, and the voltage of the source line thereby changes. The cell current or the voltage of the source line is compared to the reference 17 in the sense amplifier 16 so that the data is decided to be "0" or "1".

Figure 24:
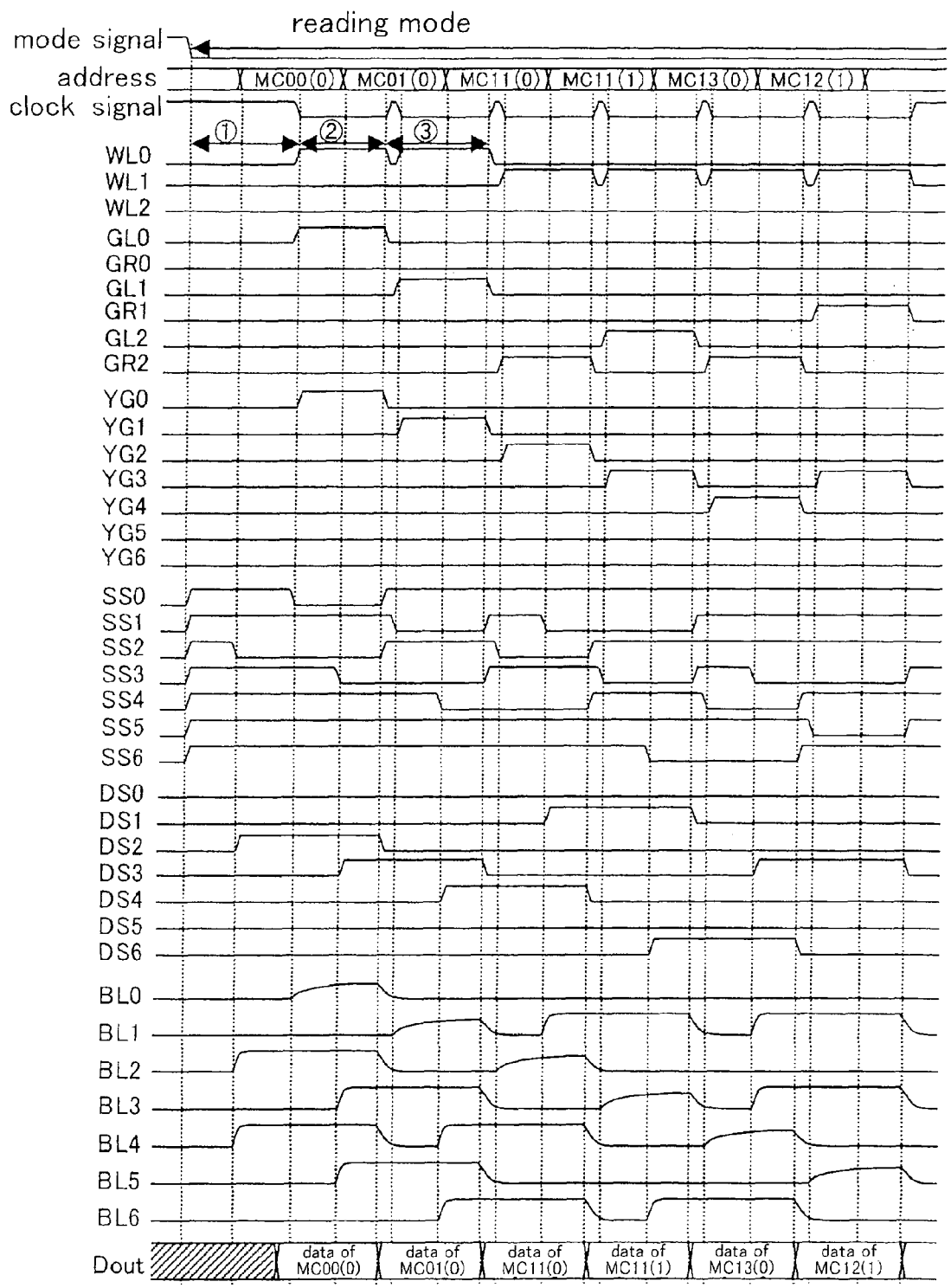
FIG. 24 is a time chart in a reading operation in the circuit shown in FIG. 23.

FIG. 24 shows timings of voltage variations in the respective wirings when the data in the memory cells MC00 (0), MC01 (0), MC11 (0), MC11 (1), MC13 (0) and MC12 (1) is sequentially read as an example of the random reading operation, in the circuit configuration shown in FIG. 23. However, in the reading operation, the memory cell where the first terminal of the memory cell is used as the source line and the second terminal thereof is used as the drain line and the memory cell where the first terminal of the memory cell is used as the drain line and the second terminal thereof is used as the source line are distinguished. For example, the memory cell MC00 is designated as the MC00 (0) in the case where the bit line BL0 or BL1 is used as the source line and the bit line BL2 or BL3 is used as the drain line, in the meanwhile, the memory cell MC00 is designated as the MC00 (1) in the case where the bit line BL0 or BL1 is used as the drain line and the bit line BL2 or BL3 is used as the source line.

A description is given below provided that the address latch control signal AL is regarded as the clock signal and the address determination signal reset signal RAJ is regarded as the mode signal in addition to use the address determination circuit 8' shown in FIG. 6. The description is further given based on the assumption that the address determination signal control signal CAJ shifts to the "H" state and the address determination signal AJ becomes valid by before the address latch is released after the address signals are compared as shown in the signal timings of FIG. 3. In FIG. 24, the variation timing of the address determination signal control signal CAJ is omitted.

When the operation shifts to the reading mode based on the mode signal (address determination signal reset signal RAJ) at first, the output of the address determination circuit 8' is reset so as to shift to the "L" state. Further, the source line selecting lines SS0-SS6 are all selected by before the address that selects the memory cell MC00 (0) is inputted so that the voltages of all of the bit lines BL0-BL6 are set to the ground voltage. The ground voltage is applied to the word lines WL0-WL6.

Next, when the address that selects the memory cell MC00 (0) is inputted, the inputted address is transmitted to the row decoder 2 and the column decoder 3 via the address latch circuit 9, and the word lines and bit lines are decoded in accordance with the inputted address. When the decoding of the bit line is completed, the source line selecting line SS2 becomes nonselective, and the drain line selecting line DS2 is selected. As a result, the voltage of the bit line BL2 is pre-charged to the drain voltage. At the same time, the source line selecting line SS4 becomes nonselective and the drain line selecting line DS4 is selected so that the bit line BL4 is pre-charged to the drain voltage (period T1). During the period T1, the address is not latched in the address latch circuit 9 because the clock signal is in the "H" state.

Next, when the clock signal falls, the address latch becomes valid, and the address that selects the memory cell MC00 (0) is latched in the address latch circuit 9, and a predetermined voltage is applied to the word line WL0 simultaneously. Further, the source line selecting line SS0 becomes nonselective, and the bit line selecting line YG0 is selected. Thereby, the sense amplifier 16 is connected to the bit line BL0. Further, the selecting transistor control line GL0 is selected so that the selecting transistors TL00, TL02 and TL04 are selected. At the time, the bit line BL2 (drain line) is connected to the bit line BL0 (source line) via the memory cell MC00, and the cell current in accordance with the data stored in the memory cell MC00 flows in the bit line BL0, which changes the voltage of the bit line BL0. The cell current or the voltage of the bit line is compared to the reference 17 in the sense amplifier 16 so that the data is decided to be "0" or "1". Then, the read data as the comparison result is outputted from the data output terminal Dout (period T2).

During the period T2, though the word line WL0 is selected so that the memory cells MC01, MC02 and MC03 are selected, the voltages of the bit lines BL1-BL6 are not changed by the memory cells MC01 and MC03 because the selecting transistor control lines GL1 and GR1 are in the nonselective state. Further, the selecting transistors TL00, TL02 and TL04 are selected since the selecting transistor control line GL0 is selected, and the bit line BL4 is connected to the bit line BL2 via the memory cell MC02. However, there is no current flow in the memory cell MC02 because the drain voltage is applied to the bit lines BL2 and BL4, which causes no influence on the reading operation with respect to the memory cell MC00.

During the period T2, the address that selects the memory cell MC01 (0) is inputted while the data in the memory cell MC00 (0) is being read. During the period T2, the clock signal is in the "L" state, and the address retained in the address latch circuit 9 (select address of the memory cell MC00 (0)) is thereby valid. Therefore, the selective state of the word lines and bit lines is not immediately switched over by the select address of the memory cell MC01 (0) inputted from the address signal AD. The select address of the memory cell MC01 (0) is transmitted to the address determination circuit 8' and compared to the select address of the memory cell MC00 (0) retained in the address latch circuit 9. The comparison is carried out based on the judgment whether or not the bit line used in the current reading operation and the bit line used in the next reading operation are both even-numbered or odd-numbered. When the data in the memory cell MC01 (0) is read, the bit line BL1 (odd-numbered bit line) is used in the case where the selecting transistor TL01 is selected. Because the used bit line BL1 is inconsistent with the bit line BL0 (even-numbered bit line) used in the reading operation with respect to the memory cell MC00 (0), the determination result by the address determination circuit 8 shows the inconsistency. When the address determination signal AJ shows the inconsistency, the selecting transistor control line and the bit line selecting line are not switched over, and the selecting transistor control line GL1 and the bit line selecting line YG1 are used in the reading operation with respect to the memory cell MC01 (0). Then, the result of the reading operation is read from the bit line BL1. The non-latched address and address determination signal AJ are transmitted to the decoding circuit of the source line selecting lines SS0-SS6 and the drain line selecting lines DS0-DS6 in the column decoder 3, and the source line selecting lines SS3 and SS5 become nonselective, thereafter the drain line selecting lines DS3 and DS5 are selected. As a result, the bit lines BL3 and BL5 are pre-charged to the drain voltage. At the time, the source line selecting line SS0, which is in the nonselective state in order to read the data from the memory cell MC00 (0), remains nonselective, and the drain lines DS2 and DS4 are continuously selected.

When the reading operation with respect to the memory cell MC00 (0) is completed and the clock signal rises, the address latch is released, the word lines and bit lines are decoded in the row decoder 2 and the column decoder 3 in accordance with the address that selects the memory cell MC01 (0) and the address determination signal AJ. The word line WL0 becomes nonselective, and the selecting transistor control line GL0 becomes nonselective. As a result, the selecting transistors TL00, TL02 and TL04 are turned off, and the source line selecting lines SS0, SS2 and SS4 are selected. The voltages of the bit lines BL0, BL2 and BL4 are then reset to the ground voltage.

At the time, the selective state of the drain line selecting lines DS3 and DS5 and the nonselective state of the source line selecting lines SS3 and SS5 are maintained. After the address decoding with respect to the memory cell MC01 (0) is completed in the row decoder 2 and the column decoder 3, the data in the memory cell MC01 (0) is read without waiting for completing the reset of the voltages of the bit lines BL0, BL2 and BL4 (period T3).

Because the clock signal falls during the period T3, the select address of the memory cell MC01 (0) is latched in the address latch circuit 9, a predetermined voltage is applied to the word line WL1, the source line selecting line SS1 becomes nonselective, and the bit line selecting line YG1 is selected. As a result, the sense amplifier 16 is connected to the bit line BL1. Further, the selecting transistor control line GL1 is selected so that the selecting transistors TL10, TL03 and TL05 are selected. At the time, the bit line BL3 (drain line) is connected to the bit line BL1 (source line) via the memory cell MC01. Therefore, the cell current in accordance with data stored in the memory cell MC01 flows in the bit line BL1, and the voltage of the bit line BL1 thereby changes. The cell current or the voltage of the bit line is compared to the reference 17 in the sense amplifier 16 so that the data is decided to be "0" or "1". The read data as the comparison result is outputted from the data output terminal Dout.

At the time, the memory cells MC00, MC01, MC02 and MC03 are also selected since the word line WL1 is selected. However, the voltages of the bit lines BL0-BL5 are not changed through the memory cells MC00 and MC03 because the selecting transistor control lines GL0 and GR0 are in the nonselective state. Further, the selecting transistors TL10, TL12, TL14, TL01, TL03 and TL05 are selected since the selecting transistor control line GL1 is selected, and the bit line BL5 is connected to the bit line BL3 via the memory cell MC03. However, there is no current flow in the memory cell MC03 because the drain voltage is applied to both the bit lines BL3 and BL5, and the reading operation with respect to the memory cell MC01 is not thereby affected. Further, the reset of the voltages of the bit lines BL0, BL2 and BL4 is completed while the data in the memory cell MC01 (0) is being read, and the voltages of the bit lines BL0, BL2 and BL4 are set to the ground voltage. Further, the address that selects the memory cell MC11 (0) is inputted while the data in the memory cell MC01 (0) is being read. In a manner similar to the reading operation with respect to the memory cell MC00 (0), the select address of the memory cell MC11 (0) is compared to the select address of the memory cell MC01 (0) retained in the address latch circuit 9. When the data in the memory cell MC11 (0) is read, the bit line BL1 (odd-numbered bit line) is used in the case where the selecting transistor TL11 is selected. Because the used bit line BL1 is consistent with the bit line BL1 (odd-numbered bit line) used in the reading operation with respect to the memory cell MC01 (0), the determination result by the address determination circuit 8 shows the consistency. When the address determination signal AJ shows the consistency, the selecting transistor control lines and the bit line selecting lines are switched over, and the selecting transistor control line GR2 and the bit line selecting line YG2 are used in the reading operation with respect to the memory cell MC11 (0). Then, the data is read from the bit line BL2. The non-latched address and address determination signal AJ are transmitted to the decoding circuit of the source line selecting lines SS0-SS6 and the drain line selecting lines DS0-DS6 in the column decoder 3, and the source line selecting lines SS4 and SS6 become nonselective, thereafter the drain line selecting lines DS4 and DS6 are selected. As a result, the bit lines BL4 and BL6 are pre-charged to the drain voltage. At the time, the source line selecting line SS1, which is in the nonselective state in order to read the data from the memory cell MC01 (0), remains nonselective, and the drain lines DS3 and DS5 are continuously selected.

Next, when the reading operation with respect to the memory cell MC01 (0) is completed and the clock signal rises, the address latch is released, the word lines and the bit lines are decoded in the row decoder 2 and the column decoder 3 in accordance with the address that selects the memory cell MC11 (0) and the address determination signal AJ. The word line WL0 becomes nonselective, and the selecting transistor control line GL1 becomes nonselective. As a result, the selecting transistors TL10, TL12, TL14, TL01, TL03 and TL05 are turned off, and the source line selecting lines SS1, SS3 and SS5 are selected. The voltages of the bit lines BL1, BL3 and BL5 are then reset to the ground voltage.

At the time, the selective state of the drain line selecting lines DS4 and DS6 and the nonselective state of the source line selecting lines SS4 and SS6 are maintained. After the address decoding with respect to the memory cell MC11 (0) is completed in the row decoder 2 and the column decoder 3, the data in the memory cell MC11 (0) is read without waiting for completing the reset of the voltages of the bit lines BL1, BL3 and BL5. In the reading operation with respect to the memory cell MC11 (0), the clock signal falls, the address that selects the memory cell MC11 (0) is latched in the address latch circuit 9, and a predetermined voltage is applied to the word line WL1. Further, the source line selecting line SS2 becomes nonselective, and the bit line selecting line YG2 is selected. As a result, the sense amplifier 16 is connected to the bit line BL2. Further, the selecting transistor control line GR2 is selected so that the selecting transistors TR20, TR22, TR24, TR11, TR13 and TR15 are selected. At the time, the bit line BL4 (drain line) is connected to the bit line BL2 (source line) via the memory cell MC11. Therefore, the cell current in accordance with data stored in the memory cell MC11 flows in the bit line BL2, and the voltage of the bit line BL2 thereby changes. The cell current or the voltage of the bit line is compared to the reference 17 in the sense amplifier 16 so that the data is decided to be "0" or "1". The read data as the determination result is outputted from the data output terminal Dout.

At the time, the memory cells MC10, MC11, MC12 and MC13 are selected since the word line WL1 is selected. However, the voltages of the bit lines BL0-BL5 are not changed through the memory cells MC10 and MC12 because the selecting transistor control lines GL1 and GR1 are in the nonselective state. Further, the selecting transistors TR20, TR22, TR24, TR11, TR13 and TR15 are selected since the selecting transistor control line GR2 is selected, and the bit line BL6 is connected to the bit line BL4 via the memory cell MC13. However, there is no current flow in the memory cell MC13 because the drain voltage is applied to the bit lines BL4 and BL6, and the reading operation with respect to the memory cell MC11 is not thereby affected. Further, the reset of the voltages of the bit lines BL1, BL3 and BL5 is completed while the data in the memory cell MC11 (0) is being read, and the voltages of the bit lines BL1, BL3 and BL5 are set to the ground voltage. Further, the address that selects the memory cell MC11 (1) is inputted while the data in the memory cell MC11 (0) is being read. The select address of the memory cell MC11 (1) is compared to the select address of the memory cell MC11 (0) retained in the address latch circuit 9. When the data in the memory cell MC11 (1) is read, the bit line BL4 (even-numbered bit line) is used in the case where the selecting transistor TR13 is selected. Because the used bit line BL4 is consistent with the bit line BL2 (even-numbered bit line) used in the reading operation with respect to the memory cell MC11 (0), the determination result by the address determination circuit 8' shows the consistency. When the address determination signal AJ shows the consistency, the selecting transistor control line and the bit line selecting line are switched over, and the selecting transistor control line GL2 and the bit line selecting line YG3 are used in the reading operation with respect to the memory cell MC11 (1). Then, the result of the reading operation is read via the bit line BL3. The non-latched address and address determination signal AJ are transmitted to the decoding circuit of the source line selecting lines SS0-SS6 and the drain line selecting lines DS0-DS6 in the column decoder 3, and the source line selecting line SS1 becomes nonselective, then the drain line selecting lines DS1 is selected. As a result, the voltage of the bit line BL1 is pre-charged to the drain voltage. At the time, the source line selecting line SS2, which is in the nonselective state in order to read the data from the memory cell MC11 (0), remains nonselective, and the drain lines DS4 and DS6 are continuously selected.

Next, when the reading operation with respect to the memory cell MC11 (0) is completed and the clock signal rises, the address latch is released, and the word lines and bit lines are decoded in the row decoder 2 and the column decoder 3 in accordance with the address that selects the memory cell MC11 (1) and the address determination signal AJ. The word line WL1 becomes nonselective, and the selecting transistor control line GR2 becomes nonselective. As a result, the selecting transistors TR20, TR22, TR24, TR11, TR13 and TR15 are turned off, and the source line selecting lines SS2, SS4 and SS6 are selected. The voltages of the bit lines BL2, BL4 and BL6 are then reset to the ground voltage.

At the time, the selective state of the drain line selecting line DS1 and the nonselective state of the source line selecting line SS1 is maintained. After the address decoding with respect to the memory cell MC11 (1) is completed in the row decoder 2 and the column decoder 3, the data in the memory cell MC11 (1) is read without waiting for completing the reset of the voltages of the bit lines BL2, BL4 and BL6. The reading operation with respect to the memory cell MC11 (1) is carried out based on a generation of the following state. Namely, the clock signal falls, the select address of the memory cell MC11 (1) is latched in the address latch circuit 9, a predetermined voltage is applied to the word line WL1, the source line selecting line SS3 becomes nonselective, and the bit line selecting line YG3 is selected. As a result, the sense amplifier 16 is connected to the bit line BL3. Further, the selecting transistor control line GL2 is selected so that the selecting transistors TL20, TL22, TL24, TL11, TL13 and TL15 are selected. The data in the memory cell MC11 is read after the aforementioned state is achieved.

At the time, the bit line BL1 (drain line) is connected to the bit line BL3 (source line) via the memory cell MC11. Therefore, the cell current in accordance with data stored in the memory cell MC11 flows in the bit line BL3, and the voltage of the bit line BL3 thereby changes. The cell current or the voltage of the bit line is compared to the reference 17 in the sense amplifier 16 so that the data is decided to be "0" or "1". The read data as the determination result is outputted from the data output terminal Dout.

Furthermore, the memory cells MC10, MC11, MC12 and MC13 are selected since the word line WL1 is selected. However, the voltages of the bit lines BL0-BL5 are not changed through the memory cells MC10 and MC12 because the selecting transistor control lines GL1 and GR1 are in the nonselective state. Further, the reset of the voltages of the bit lines BL2, BL4 and BL6 is completed while the data in the memory cell MC11 (1) is being read, and the voltages of the bit lines BL2, BL4 and BL6 are set to the ground voltage. Further, the address that selects the memory cell MC13 (0) is inputted while the data in the memory cell MC11 (1) is being read. The select address of the memory cell MC13 (0) is compared to the select address of the memory cell MC11 (1) retained in the address latch circuit 9. When the data in the memory cell MC13 (0) is read, the bit line BL3 (odd-numbered bit line) is used in the case where the selecting transistor TL13 is selected. Because the used bit line BL3 is consistent with the bit line BL3 (odd-numbered bit line) used in the reading operation with respect to the memory cell MC11 (1), the determination result by the address determination circuit 8' shows the consistency. When the address determination signal AJ shows the consistency, the selecting transistor control line and the bit line selecting line are switched over, and the selecting transistor control line GR2 and the bit line selecting line YG4 are used in the reading operation with respect to the memory cell MC13 (0). Then, the result of the reading operation is read from the bit line BL4. The non-latched address and address determination signal AJ are transmitted to the decoding circuit of the source line selecting lines SS0-SS6 and the drain line selecting lines DS0-DS6 in the column decoder 3, and thereby the source line selecting line SS6 becomes nonselective so that the drain line selecting line DS6 is selected. As a result, the voltage of the bit line BL6 is pre-charged to the drain voltage. At the time, the source line selecting line SS3, which is in the nonselective state in order to read the data from the memory cell MC11 (1), remains nonselective, and the drain line selecting line DS1 is continuously selected.

Next, when the reading operation with respect to the memory cell MC11 (1) is completed and the clock signal rises, the address latch is released, the word lines and bit lines are decoded in the row decoder 2 and the column decoder 3 in accordance with the address that selects the memory cell MC13 (0) and the address determination signal AJ. The word line WL1 becomes nonselective, and the selecting transistor control line GL2 becomes nonselective. As a result, the selecting transistors TL20, TL22, TL24, TL11, TL13 and TL15 are turned off, and the source line selecting lines SS1, SS3 and SS5 are selected. Then, the voltages of the bit lines BL1, BL3 and BL5 are reset to the ground voltage. At the time, the selective state of the drain line selecting line DS6 and the nonselective state of the source line selecting line SS6 are maintained. After the address decoding with respect to the memory cell MC13 (0) is completed in the row decoder 2 and the column decoder 3, the data in the memory cell MC13 (0) is read without waiting for completing the rest of the voltages of the bit lines BL1, BL3 and BL5.

When the data in the memory cell MC13 (0) is read, the clock signal falls at first, the select address of the memory cell MC13 (0) is latched in the address latch circuit 9, and a predetermined voltage is applied to the word line WL1. Further, the source line selecting line SS4 becomes nonselective, and the bit line selecting line YG4 is selected. As a result, the sense amplifier 16 is connected to the bit line BL4. Further, the selecting transistor control line GR2 is selected so that the selecting transistors TR20, TR22, TR24, TR11, TR13 and TR15 are selected. At the time, the bit line BL6 (drain line) is connected to the bit line BL4 (source line) via the memory cell MC13. Therefore, the cell current in accordance with data stored in the memory cell MC13 flows in the bit line BL4, and the voltage of the bit line BL4 thereby changes. The cell current or the voltage of the bit line is compared to the reference 17 in the sense amplifier 16 so that the data is decided to be "0" or "1". The read data as the determination result is outputted from the data output terminal Dout.

In the meantime, though the memory cells MC10, MC11, MC12 and MC13 are selected based on a selection of the word line WL1, the voltages of the bit lines BL0-BL5 are not changed by the memory cells MC10 and MC12 because the selecting transistor control lines GL1 and GR1 are in the nonselective state. Further, the reset of the voltages of the bit lines BL1, BL3 and BL5 is completed while the data in the memory cell MC13 (0) is being read, and the voltages of the bit lines BL1, BL3 and BL5 are set to the ground voltage. Further, the address that selects the memory cell MC12 (1) is inputted while the data in the memory cell MC13 (0) is being read. The select address of the memory cell MC12 (1) is compared to the select address of the memory cell MC13 (0) retained in the address latch circuit 9. When the data in the memory cell MC12 (1) is read, the bit line BL5 (odd-numbered bit line) is used in the case where the selecting transistor TR14 is selected. Because the used bit line BL5 is inconsistent with the bit line BL4 (even-numbered bit line) used in the reading operation with respect to the memory cell MC13 (0), the determination result by the address determination circuit 8' shows the inconsistency. When the address determination signal AJ shows the inconsistency, the selecting transistor control line and the bit line selecting line are not switched over, and the selecting transistor control line GR1 and the bit line selecting line YG5 are used in the reading operation with respect to the memory cell MC12 (1). Then, the reading result is read from the bit line BL5. The non-latched address and address determination signal AJ are transmitted to the decoding circuit of the source line selecting lines SS0-SS6 and the drain line selecting lines DS0-DS6 in the column decoder 3, and the source line selecting lines SS1 and SS3 become nonselective so that the drain line selecting lines DS1 and DS3 are selected. As a result, the voltages of the bit lines BL1 and BL3 are pre-charged to the drain voltage. At the time, the source line selecting line SS4, which is in the nonselective state in order to read the data from the memory cell MC13 (0), remains nonselective, and the drain line selecting line DS3 is continuously selected.

Next, when the reading operation with respect to the memory cell MC13 (0) is completed and the clock signal rises, the address latch is released, the word lines and bit lines are decoded in the row decoder 2 and the column decoder 3 in accordance with the address that selects the memory cell MC12 (1) and the address determination signal AJ. The word line WL1 becomes nonselective, and the selecting transistor control line GR2 becomes nonselective. As a result, the selecting transistors TR20, TR22, TR24, TR11, TR13 and TR15 are turned off, and the source line selecting lines SS2, SS4 and SS6 are selected. The voltages of the bit lines BL2, BL4 and BL6 are then reset to the ground voltage.

At the time, the selective state of the drain line selecting lines DS1 and DS3 and the nonselective state of the source line selecting lines SS1 and SS3 are maintained. After the address decoding with respect to the memory cell MC12 (1) is completed in the row decoder 2 and the column decoder 3, the data in the memory cell MC12 (1) is read without waiting for completing the reset of the voltages of the bit lines BL2, BL4 and BL6.

When the data in the memory cell MC12 (1) is read, the clock signal falls at first, the select address of the memory cell MC12 (1) is latched in the address latch circuit 9, and a predetermined voltage is applied to the word line WL1. Further, the source line selecting line SS5 becomes nonselective, and the bit line selecting line YG5 is selected. As a result, the sense amplifier 16 is connected to the bit line BL5. Further, the selecting transistor control line GR1 is selected so that the selecting transistors TR10, TR12, TR14, TR01, TR03 and TR05 are selected. At the time, the bit line BL3 (drain line) is connected to the bit line BL5 (source line) via the memory cell MC12. Therefore, the cell current in accordance with data stored in the memory cell MC12 flows in the bit line BL5, and the voltage of the bit line BL5 thereby changes. The cell current or the voltage of the bit line is compared to the reference 17 in the sense amplifier 16 so that the data is decided to be "0" or "1". The read data showing the determination result is outputted from the data output terminal Dout.

Meanwhile, the memory cells MC10, MC11, MC12 and MC13 are also selected based on selection of the word line WL1. However, the voltages of the bit lines BL0-BL6 are not changed through the memory cells MC11 and MC13 because the selecting transistor control lines GL2 and GR2 are in the nonselective state. Further, the selecting transistors TR10, TR12, TR14, TR01, TR03 and TR05 are selected since the selecting transistor control line GR1 is selected, and the bit line BL2 is connected to the bit line BL4 via the memory cell MC10. However, there is no current flow in the memory cell MC10 because the drain voltage is applied to the bit lines BL2 and BL4, and the reading operation with respect to the memory cell MC12 is not thereby affected. Further, the reset of the voltages of the bit lines BL1, BL3 and BL5 is completed while the data in the memory cell MC12 (1) is being read, and the voltages of the bit lines BL1, BL3 and BL5 are set to the ground voltage.

As described above, while the selecting transistor control lines GL and GR, the bit line selecting lines YG are switched over based on the determination signal of the address determination circuit 8' and then switch over the bit lines used in the reading operation in order to carry out the reading operation of the memory cell, the voltage of the bit line of the next memory cell can be pre-charged. Further, the data can be read from the next memory cell while the voltage of the bit line after the reading operation with respect to the memory cell is being reset. As a result, the data can be randomly read at a high speed.

The preferred embodiment 6 shows the case where the Nch transistors constitute the selecting transistor 12, bit line selecting transistor 13, source line selecting transistor 14c and drain line selecting transistor shown in FIG. 22, however, the Pch transistors may constitute these transistors depending on the constitution of the memory cell 11. Furthermore, as described above, the present preferred embodiment is not limited to the Nch non-volatile memory cell, and at least one of Pch non-volatile memory or resistance-variable non-volatile memory (RRAM), which are able to control only the selected word line, can be also applied. More specifically, the present preferred embodiment can be applied to a semiconductor memory device comprising memory cells capable of controlling only the selected word line. Such a semiconductor memory device can also realize the random reading operation at a high speed in a similar operation Though the preferred embodiments of this invention are described in detail, it will be understood that various modifications may be made therein, and it is intended to cover in the appended claims all such modifications as fall within the true spirit and scope of this invention.

What is claimed is:

1. A semiconductor memory device comprising a memory cell array comprising a single or a plurality of basic cells, and selecting lines, bit lines and word lines respectively provided for designating the basic cells, wherein
the basic cell comprises, provided that N and M are respectively integers of at least one:
first and second memory cells for retaining data having at least a binary value;
a first selecting transistor connected between a first terminal of the first memory cell and the Mth bit line;
a second selecting transistor connected between the first terminal of the first memory cell and the M+1th bit line,
a third selecting transistor connected between a first terminal of the second memory cell and the M+1th bit line; and
a fourth selecting transistor connected between the first terminal of the second memory cell and the M+2th bit line, wherein
a gate of the first selecting transistor is connected to the 2·N−1th selecting line,
a gate of the second selecting transistor is connected to the 2·Nth selecting line,
a gate of the third selecting transistor is connected to the 2·N+1th selecting line,
a gate of the fourth selecting transistor is connected to the 2·N+2th selecting line, and
the memory cell array is able to control only the selected word line.

2. A semiconductor memory device comprising a memory cell array comprising a single or a plurality of basic cells, and selecting lines, bit lines and word lines respectively provided for designating the basic cells, wherein
the basic cell comprises, provided that N and M are respectively integers of at least one:
first through fourth memory cells for retaining data having at least a binary value;
a first selecting transistor connected between a first terminal of the first memory cell and the 2·M−1th bit line;
a second selecting transistor connected between the first terminal of the first memory cell and the 2·Mth bit line,
a third selecting transistor connected between a first terminal of the second memory cell and a first terminal of the fourth memory cell, and the 2·Mth bit line;
a fourth selecting transistor connected between the first terminal of the second memory cell and the first terminal of the fourth memory cell, and the 2·M+1th bit line;
a fifth selecting transistor connected between a first terminal of the third memory cell and the 2·M−1th bit line; and
a sixth selecting transistor connected the first terminal of the third memory cell and the 2·Mth bit line, wherein
a gate of the first selecting transistor is connected to the 4·N−3th selecting line,
a gate of the second selecting transistor is connected to the 4·N−2th selecting line,
a gate of the third selecting transistor is connected to the 4·N−1th selecting line,
a gate of the fourth selecting transistor is connected to the 4·Nth selecting line,
a gate of the fifth selecting transistor is connected to the selecting line of 4·N+1th order, and
a gate of the sixth selecting transistor is connected to the 4·N+2th selecting line.

3. The semiconductor memory device as claimed in claim 2, wherein the memory cell array is configured in such a manner that a common line is used as the 4·N−2th selecting line and the 4·N+1th selecting line, a common line is used as the 4·Nth selecting line and the 4·N+3th selecting line, and the memory cell array is able to control only the selected word line.

4. A semiconductor memory device comprising a memory cell array comprising a single or a plurality of basic cells, and selecting lines, bit lines and word lines respectively provided for designating the basic cells, wherein
the basic cell comprises, provided that N and M are respectively integers of at least one:
first and second VGA memory cells for retaining data having at least a binary value;
a first selecting transistor connected between a first terminal of the first VGA memory cell and the 2·M−1th bit line;
a second selecting transistor connected between the first terminal of the first VGA memory cell and the 2·Mth bit line,
a third selecting transistor connected between a second terminal of the first VGA memory cell and the 2·M+1th bit line;
a fourth selecting transistor connected between the second terminal of the first VGA memory cell and the 2·M+2th bit line;
a fifth selecting transistor connected to between a first terminal of the second VGA memory cell and the 2·Mth bit line;
a sixth selecting transistor connected to the first terminal of the second VGA memory cell and the 2·M+1th bit line,
a seventh selecting transistor connected to a second terminal of the second VGA memory cell and the 2·M+2th bit line; and
an eighth selecting transistor connected to the second terminal of the second VGA memory cell and the 2·M+3th bit line; wherein
a gate of the first selecting transistor is connected to the 2·N−1th selecting line,
a gate of the second selecting transistor is connected to the 2·Nth selecting line, a gate of the third selecting transistor is connected to the 2·N−1th selecting line,
a gate of the fourth selecting transistor is connected to the 2·Nth selecting line,
a gate of the fifth selecting transistor is connected to the 2·N+1th selecting line,
a gate of the sixth selecting transistor is connected to the 2·N+2th selecting line,
a gate of the seventh selecting transistor is connected to the 2·N+1th selecting line, and
a gate of the eighth selecting transistor is connected to the 2·N+2th selecting line.

5. The semiconductor memory device as claimed in claim 4, further comprising a reader for pre-charging a group of selecting transistors including the Mth bit line and the M+2th bit line or a group of transistors including the M+1th bit line and the M+3th bit line to a predetermined voltage in accordance with a selecting address, and reading data of the memory cell from one of the Mth bit line and the M+2th bit line or one of the M+1th bit line and the M+3th bit line based on either of the two transistor groups.

* * * * *